US007843697B2

(12) United States Patent
McCoy et al.

(10) Patent No.: US 7,843,697 B2

(45) Date of Patent: Nov. 30, 2010

(54) VERTICAL ADAPTERS AND VERTICAL DEVICE FOR MOUNTING TO A HORIZONTAL SERVICE INTERFACE

(75) Inventors: Richard A. McCoy, Stevensville, MI (US); Douglas D. Leclear, Coloma, MI (US)

(73) Assignee: Whirlpool Corporation, Benton Harbor, MI (US)

( * ) Notice: Subject to any disclaimer, the term of this patent is extended or adjusted under 35 U.S.C. 154(b) by 237 days.

(21) Appl. No.: 12/120,410

(22) Filed: May 14, 2008

(65) Prior Publication Data

US 2008/0222327 A1 Sep. 11, 2008

Related U.S. Application Data

(63) Continuation of application No. 11/619,845, filed on Jan. 4, 2007.

(51) Int. Cl.
*H05K 7/00* (2006.01)

(52) U.S. Cl. ...................................................... 361/728

(58) Field of Classification Search ................. 361/728, 361/685–686, 683

See application file for complete search history.

(56) References Cited

U.S. PATENT DOCUMENTS

| | | | |
|---|---|---|---|
| 2,795,639 | A | 6/1957 | Rawson |
| 3,054,024 | A | 9/1962 | Van Dillen et al. |
| 3,836,221 | A | 9/1974 | Whistler, Jr. |
| 3,858,091 | A | 12/1974 | Wilkinson |
| D273,836 | S | 5/1984 | Ohyama et al. |
| 4,546,267 | A | 10/1985 | Urfiner |
| 4,628,351 | A | 12/1986 | Heo |
| 4,691,195 | A | 9/1987 | Sigelman et al. |
| 4,718,740 | A | 1/1988 | Cox |
| 4,739,242 | A | 4/1988 | McCarty et al. |
| 4,773,032 | A | 9/1988 | Uehara et al. |
| 4,814,759 | A | 3/1989 | Gombrich et al. |
| 4,884,626 | A | 12/1989 | Filipowski |
| 4,969,830 | A | 11/1990 | Daly et al. |

(Continued)

FOREIGN PATENT DOCUMENTS

| | | |
|---|---|---|
| CN | 1683856 | 10/2005 |

(Continued)

OTHER PUBLICATIONS

Article Entitled "Johnson Controls All-New Overhead Rail System Debuts in Ford F-150 Pickup Truck At North American International Auto Show"—www.prnewswire.com (2 pages).

(Continued)

*Primary Examiner*—Jean F Duverne

(74) *Attorney, Agent, or Firm*—Robert A. Bacon; McGarry Bair PC

(57) ABSTRACT

A vertical device for mounting to a host having a horizontal surface with an upwardly oriented host service interface providing a mechanical service and at least one electrical service as well as an adapter for mounting a vertical device to a host of this type. The device or adapter has a main body with a horizontal portion and a vertical portion extending generally downwardly from the horizontal portion. A device service interface extends downwardly from the horizontal portion for engagement with the host service interface. At least one functionality is provided on the vertical portion of the vertical device or the adapter.

34 Claims, 62 Drawing Sheets

U.S. PATENT DOCUMENTS

| | | | |
|---|---|---|---|
| 5,173,686 | A | 12/1992 | Fujihara |
| 5,187,744 | A | 2/1993 | Richter |
| 5,235,822 | A | 8/1993 | Leonovich, Jr. |
| 5,281,018 | A | 1/1994 | Cullinan |
| 5,305,381 | A | 4/1994 | Wang et al. |
| 5,351,417 | A | 10/1994 | Rubin |
| 5,382,939 | A | 1/1995 | Hong |
| 5,408,382 | A | 4/1995 | Schultz et al. |
| 5,457,745 | A | 10/1995 | Wang et al. |
| 5,544,010 | A | 8/1996 | Schultz et al. |
| 5,568,691 | A | 10/1996 | Rubin |
| 5,644,471 | A | 7/1997 | Schultz et al. |
| 5,699,226 | A | 12/1997 | Cavello |
| 5,710,821 | A | 1/1998 | Cheah |
| 5,739,665 | A | 4/1998 | Bares |
| 5,810,168 | A | 9/1998 | Eggering |
| 5,836,563 | A | 11/1998 | Hsin-Yung et al. |
| 5,839,097 | A | 11/1998 | Klausner |
| 5,864,120 | A | 1/1999 | Vroom et al. |
| 5,996,956 | A | 12/1999 | Shawver |
| 5,999,226 | A | 12/1999 | Choi |
| 6,011,852 | A | 1/2000 | Howard |
| 6,023,147 | A | 2/2000 | Cargin, Jr. et al. |
| 6,130,727 | A | 10/2000 | Toyozumi |
| 6,131,812 | A | 10/2000 | Schneider |
| 6,191,942 | B1 | 2/2001 | Lee et al. |
| 6,208,117 | B1 | 3/2001 | Hibi |
| 6,231,371 | B1 | 5/2001 | Helot |
| 6,246,575 | B1 | 6/2001 | Barrus et al. |
| 6,309,230 | B2 | 10/2001 | Helot |
| 6,359,270 | B1 | 3/2002 | Bridson |
| 6,375,344 | B1 | 4/2002 | Hanson et al. |
| 6,378,537 | B1 | 4/2002 | DeHart |
| 6,385,042 | B1 | 5/2002 | Chen |
| 6,393,848 | B2 | 5/2002 | Roh et al. |
| 6,415,036 | B1 | 7/2002 | Ritter et al. |
| 6,430,946 | B2 | 8/2002 | Roh et al. |
| 6,453,687 | B2 | 9/2002 | Sharood et al. |
| 6,480,753 | B1 | 11/2002 | Calder et al. |
| 6,483,695 | B1 | 11/2002 | Hartstein |
| 6,490,154 | B2 | 12/2002 | Thompson |
| 6,519,144 | B1 | 2/2003 | Henrie et al. |
| 6,557,756 | B1 | 5/2003 | Smith |
| 6,559,882 | B1 | 5/2003 | Kerchner |
| 6,608,399 | B2 | 8/2003 | McConnell et al. |
| 6,634,910 | B2 | 10/2003 | Lieb et al. |
| 6,646,866 | B2 | 11/2003 | Kao |
| 6,682,161 | B2 | 1/2004 | Yun |
| D486,467 | S | 2/2004 | Yuen |
| 6,761,578 | B1 | 7/2004 | Stavely et al. |
| 6,765,789 | B2 | 7/2004 | Yang |
| 6,785,567 | B2 | 8/2004 | Kato et al. |
| 6,788,529 | B2 | 9/2004 | Homer et al. |
| 6,792,263 | B1 | 9/2004 | Kite |
| 6,798,654 | B2 | 9/2004 | Chang et al. |
| 6,809,295 | B1 | 10/2004 | Vargas |
| 6,832,618 | B2 | 12/2004 | DeHart |
| 6,843,667 | B2 | 1/2005 | Khoury |
| 6,853,399 | B1 | 2/2005 | Gilman et al. |
| 6,860,764 | B2 | 3/2005 | Khoury |
| 6,877,264 | B2 | 4/2005 | Mautz |
| 6,910,549 | B2 | 6/2005 | Kung |
| 6,927,871 | B1 | 8/2005 | Silverbrook et al. |
| 6,941,399 | B2 | 9/2005 | Loh |
| 6,961,239 | B2 | 11/2005 | Schedivy |
| 6,963,936 | B2 | 11/2005 | Billington et al. |
| 6,966,533 | B1 | 11/2005 | Kalis et al. |
| 6,993,615 | B2 | 1/2006 | Falcon |
| 7,034,902 | B2 | 4/2006 | Tajima |
| 7,074,062 | B2 | 7/2006 | Khoury |
| 7,080,812 | B2 | 7/2006 | Wadsworth et al. |
| 7,084,932 | B1 | 8/2006 | Mathias et al. |
| 7,090,141 | B2 | 8/2006 | Roh et al. |
| 7,092,988 | B1 | 8/2006 | Bogatin et al. |
| 7,094,110 | B1 | 8/2006 | Shelton |
| 7,117,286 | B2 | 10/2006 | Falcon |
| 7,126,569 | B2 | 10/2006 | Ootsuka |
| 7,136,940 | B2 | 11/2006 | Roh et al. |
| 7,146,306 | B2 | 12/2006 | Whitney |
| 7,158,092 | B2 | 1/2007 | Shen et al. |
| 7,219,942 | B2 | 5/2007 | Schedivy |
| 7,272,420 | B2 | 9/2007 | Falcon et al. |
| 7,404,298 | B2 | 7/2008 | Kim et al. |
| 7,430,111 | B2 | 9/2008 | Lee et al. |
| 2002/0080273 | A1 | 6/2002 | Harrison et al. |
| 2002/0115353 | A1 | 8/2002 | Zeiler et al. |
| 2002/0115480 | A1 | 8/2002 | Huang |
| 2002/0186329 | A1 | 12/2002 | Tong et al. |
| 2003/0014259 | A1 | 1/2003 | Ferragut, II et al. |
| 2003/0103023 | A1 | 6/2003 | Ootsuka et al. |
| 2003/0207623 | A1 | 11/2003 | Patel |
| 2004/0004807 | A1 | 1/2004 | Kim et al. |
| 2004/0070696 | A1 | 4/2004 | Roh et al. |
| 2004/0093379 | A1 | 5/2004 | Roh et al. |
| 2004/0154318 | A1 | 8/2004 | Roh et al. |
| 2004/0177624 | A1 | 9/2004 | Wo |
| 2004/0186596 | A1 | 9/2004 | Roh et al. |
| 2004/0207362 | A1 | 10/2004 | Kanouda et al. |
| 2004/0216471 | A1 | 11/2004 | Kim et al. |
| 2004/0262185 | A1 | 12/2004 | Mills |
| 2005/0013103 | A1 | 1/2005 | Chandley |
| 2005/0097912 | A1 | 5/2005 | Nam et al. |
| 2005/0127870 | A1 | 6/2005 | Shin |
| 2005/0129263 | A1 | 6/2005 | Tamura et al. |
| 2005/0134472 | A1 | 6/2005 | Jang et al. |
| 2005/0138948 | A1 | 6/2005 | Lee |
| 2005/0138949 | A1 | 6/2005 | Jang et al. |
| 2005/0167139 | A1 | 8/2005 | Bally et al. |
| 2005/0201067 | A1 | 9/2005 | Hu et al. |
| 2005/0210168 | A1 | 9/2005 | Chen et al. |
| 2005/0225292 | A1 | 10/2005 | Damlamian et al. |
| 2005/0286900 | A1 | 12/2005 | Bentley et al. |
| 2006/0007357 | A1 | 1/2006 | Lee |
| 2006/0021360 | A1 | 2/2006 | Kim et al. |
| 2006/0031617 | A1 | 2/2006 | Falcon |
| 2006/0055553 | A1 | 3/2006 | Yeh |
| 2006/0096303 | A1 | 5/2006 | Kavounas |
| 2006/0106965 | A1 | 5/2006 | Falcon |
| 2006/0116177 | A1 | 6/2006 | Kortum et al. |
| 2006/0117810 | A1 | 6/2006 | Kendall et al. |
| 2006/0118694 | A1 | 6/2006 | Lee et al. |
| 2006/0125360 | A1 | 6/2006 | Kim et al. |
| 2006/0130078 | A1 | 6/2006 | Zhang |
| 2006/0144056 | A1 | 7/2006 | Oh |
| 2006/0145576 | A1 | 7/2006 | Lee et al. |
| 2006/0148575 | A1 | 7/2006 | Vitito |
| 2006/0217600 | A1 | 9/2006 | Lee et al. |
| 2006/0224050 | A1 | 10/2006 | Lee et al. |
| 2006/0261220 | A1 | 11/2006 | Lee et al. |
| 2007/0038434 | A1 | 2/2007 | Cvetko |
| 2007/0044497 | A1 | 3/2007 | Roo et al. |
| 2007/0086151 | A1 | 4/2007 | Oh et al. |
| 2007/0118862 | A1 | 5/2007 | Jeong et al. |
| 2007/0126413 | A1 | 6/2007 | Oh |
| 2007/0143376 | A1 | 6/2007 | McIntosh |
| 2007/0230910 | A1 | 10/2007 | Welch et al. |
| 2007/0247037 | A1 | 10/2007 | Schenker |
| 2007/0247800 | A1 | 10/2007 | Smith et al. |
| 2008/0013284 | A1 | 1/2008 | Nagahashi |
| 2008/0019082 | A1 | 1/2008 | Krieger et al. |
| 2008/0101645 | A1 | 5/2008 | Rosen |
| 2008/0165504 | A1 | 7/2008 | McCoy et al. |

2008/0192411 A1 8/2008 McCoy

FOREIGN PATENT DOCUMENTS

| | | |
|---|---|---|
| CN | 1683877 | 10/2005 |
| CN | 1683893 | 10/2005 |
| DE | 3528659 | 2/1987 |
| DE | 19644641 | 4/1998 |
| DE | 19706565 | 8/1998 |
| DE | 19800212 | 7/1999 |
| DE | 19839174 | 3/2000 |
| DE | 10242678 | 4/2004 |
| DE | 102005021937 | 11/2006 |
| EP | 0985884 | 3/2000 |
| EP | 1039441 | 9/2000 |
| EP | 1125537 | 8/2001 |
| EP | 1152202 | 11/2001 |
| EP | 1205719 | 5/2002 |
| EP | 1258991 | 11/2002 |
| EP | 1384965 | 1/2004 |
| EP | 1450105 | 8/2004 |
| EP | 1600886 | 11/2005 |
| GB | 828064 | 2/1960 |
| GB | 2386177 | 9/2003 |
| JP | 7318237 | 12/1995 |
| JP | 2000113315 | 4/2000 |
| JP | 2000274923 | 10/2000 |
| JP | 2001289555 | 10/2001 |
| JP | 2001324258 | 11/2001 |
| JP | 2002011274 | 1/2002 |
| JP | 2002243354 | 8/2002 |
| JP | 2002323858 | 11/2002 |
| JP | 2003065659 | 3/2003 |
| JP | 2003302138 | 10/2003 |
| JP | 2003319573 | 11/2003 |
| JP | 2003323232 | 11/2003 |
| KR | 2004025403 | 9/2002 |
| KR | 20030077254 | 10/2003 |
| KR | 2006074787 | 12/2004 |
| KR | 20050059869 | 6/2005 |
| KR | 20050070958 | 7/2005 |
| KR | 20050075781 | 7/2005 |
| KR | 20050094242 | 9/2005 |
| KR | 2008057639 | 12/2006 |
| KR | 20070004351 | 1/2007 |
| KR | 20080004129 | 1/2008 |
| WO | 9622718 | 8/1996 |
| WO | 9750045 | 12/1997 |
| WO | 9901971 | 1/1999 |
| WO | 2004051164 | 6/2004 |
| WO | 2004083658 | 9/2004 |
| WO | 2004105184 | 12/2004 |
| WO | 2005047786 | 5/2005 |
| WO | 2005057105 | 6/2005 |
| WO | 2006067530 | 6/2006 |
| WO | 2006068456 | 6/2006 |
| WO | 2006086371 | 8/2006 |
| WO | 2007030664 | 3/2007 |

OTHER PUBLICATIONS

Article Entitled "Ford's F-150: The Winner and Still Champion?" by Christopher A. Sawyer—www.autofieldguide.com (4 pages).

"I-Enabled Appliances", Copyright 2001 Whirlpool Corporation, 14 Pages, Authored by Whirlpool Corporation, Published During 2001 by Whirlpool Corporation As a Self Contained Pamphlet. The Year of Publication Is Sufficiently Earlier Than the Effective U.S. Filing Date and Any Foreign Priority Date So That the Particular Month of Publication Is Not in Issue.

Written Answers to Questions About the Substance of the Disclosure of JP200306569 Submitted to a Japanese/English Translator. (No Translation Was Requested or Provided).

Office Action for U.S. Appl. No. 11/619,731 Dated Feb. 6, 2008 (8 Pages).

Office Action for U.S. Appl. No. 11/619,731 Dated Feb. 26, 2008 (8 Pages).

Miller, Robert C., et al., Taking Handheld Devices to the Next Level, 2004, pp. 36-43.

Corrected International Search Report PCT/US2008/050164 dated May 26, 2008.

International Search Report PCT/US2008/050145 dated Sep. 6, 2008.

VERTICAL ADAPTERS AND VERTICAL DEVICE FOR MOUNTING TO A HORIZONTAL SERVICE INTERFACE

CROSS REFERENCE TO RELATED APPLICATIONS

The present application is a continuation of U.S. patent application Ser. No. 11/619,845, filed Jan. 4, 2007, entitled "ALTERNATIVE HOSTS FOR MULTIPLE ADAPTERS AND MULTIPLE CONSUMER ELECTRONIC DEVICES".

BACKGROUND OF THE INVENTION

1. Field of the Invention

The invention relates to a device or an adapter for a device for coupling to a host.

2. Description of the Related Art

Traditionally, appliances, consumer electronic devices, and other useful household machinery are located in a room dedicated to the function supported by the appliance, consumer electronic device, and or household machinery. For example, the kitchen has traditionally been limited to a space for preparing and eating meals and consequently has been mostly occupied by cabinetry and large home appliances such as refrigerators, dishwashers, and ovens. The family room has been designated as a place for leisure activities, and so most entertainment devices, such as televisions and video games are commonly found here. Laundry rooms normally house a washer, dryer, and iron. Devices such as personal computers and printers are often located in another room, such as a dedicated home office or bedroom.

Consumers increasingly own multiple hand-held or portable consumer electronic devices, such as laptops, cell phones, PDAs, and digital music players. These devices are typically used in many different rooms in the house and are often carried from room to room throughout the home. Consumers also tend to perform non-traditional tasks in the traditional rooms of the home. For example, consumers also tend to eat in the living room or media room, instead of the dinning room. Consumers tend to eat, meet and entertain in the kitchen, not just the dinning room and family room. In fact, the kitchen is often the hub of most household activity. Consumers also tend to work in every room of the home with the adoption of laptop computers and wireless networks.

Therefore, there is a trend for consumers to perform non-traditional functions in a household room designed for a traditional function. The invention recognizes this trend and attempts to support the trend.

SUMMARY OF THE INVENTION

In one exemplary embodiment, the disclosure provides a vertical device for mounting to a host having a horizontal surface with an upwardly oriented host service interface providing a mechanical service and at least one electrical service. The vertical device has a main body with a horizontal portion and a vertical portion extending generally downwardly from the horizontal portion. A device service interface extends downwardly from the horizontal portion for engagement with the host service interface. At least one functionality is provided on the vertical portion of the vertical device.

In another exemplary embodiment, the disclosure provides an adapter for mounting a vertical device to a host having a horizontal surface with an upwardly oriented host service interface providing a mechanical service and at least one electrical service. The adapter has a main body with a horizontal portion and a vertical portion extending generally downwardly from the horizontal portion. A device service interface extends downwardly from the horizontal portion for engagement with the host service interface. The vertical device may removably coupled to the vertical portion of the adapter.

In yet another exemplary embodiment, the disclosure provides a portable electrical device for mounting to a host having a horizontal surface with an upwardly oriented host service interface providing mechanical, power and data service. The portable electrical device has a main body with a horizontal portion and a vertical portion extending generally downwardly from the horizontal portion. A device service interface extends downwardly from the horizontal portion for engagement with the host service interface to provide mechanical service as well as data or power service.

DESCRIPTION OF THE EMBODIMENTS OF THE INVENTION

Figure 1:
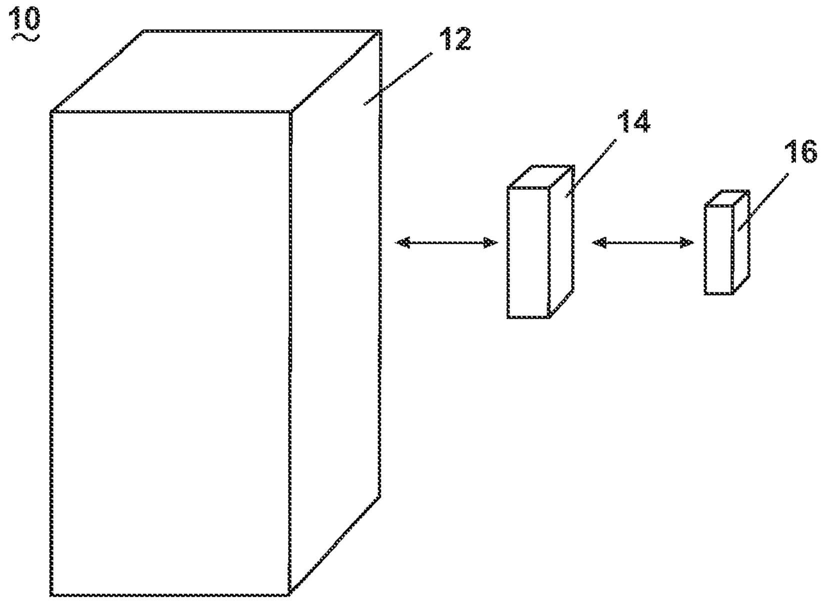
FIG. 1 is a schematic illustration of a modular system comprising a host, an adapter, and a consumer electronic device.

Referring to FIG. 1, a schematic illustration of a modular system 10 according to the invention is shown and comprises at least one host 12, at least one adapter 14, and at least one consumer electronic device 16. The host 12 and the consumer electronic device 16 cannot be directly coupled with each other, and thus are indirectly coupled via the adapter 14. The term "coupled" as used herein includes any type of connection that permits a transfer of a service, as hereinafter defined, between any combination of the host 12, adapter 14, and consumer electronic device 16. The term "coupled" includes both a fixed and removable coupling, unless expressly stated otherwise.

The host 12 performs a primary function and can provide or receive at least one service to or from the adapter 14 or the consumer electronic device 16. The host 12 can be an appliance and the primary function can be performing a series of steps to conduct a useful cycle of operation. The host 12 can also comprise a structural feature of a building, such as a wall. Preferably, the appliance is a conventional household appliance, such as a refrigerator performing a cooling cycle or an ice making cycle. Other examples of appliances the host 12 can comprise include, but are not limited to a freezer, a microwave oven, a dishwashing machine, a stove, a range, an air conditioner, a dehumidifier, a water heater, a furnace, a clothes washing machine, a clothes dryer, a clothes refreshing machine, and a non-aqueous washing apparatus, or any combination thereof.

The consumer electronic device 16 is a device that also performs a primary function. In most cases, the primary function of the consumer electronic device is different from the primary function performed by the host 12. Examples of the consumer electronic device 16 include, but are not limited to a television, a video camera, a video recorder, a personal computer, a notebook computer, a computer monitor, a video display, a keyboard, a printer, copying equipment, a calculator, a facsimile machine, a scanner, a digital storage device, a wireless transceiver, an internet router, a power supply, a data recorder, an answering machine, a telephone, a cordless telephone, a cellular telephone, a video game system, a personal digital assistant, a DVD player, VHS player, a VCR, a cassette deck, an 8 mm video player, a CD player, a Blackberry, a portable digital video player, an MP3 player, a radio, other music players, an audio speaker, a digital picture frame, a weather station, and a scale or balance.

The adapter 14 supplies at least one service to either the host 12 or the consumer electronic device 16. The supply of the service can be uni-directional in that the adapter 14 supplies a service provided by one of the host 12 and the consumer electronic device 16 to the other of the host 12 and the consumer electronic device 16. The supply of the service can also be bi-directional in that the adapter 14 can supply a service from the host 12 to the consumer electronic device 16 and from the consumer electronic device 16 to the host 12. The adapter 14 itself can provide a service that is supplied to the host 12, the consumer electronic device 16 or both, either uni-directionally or multi-directionally. The service supplied by the adapter 14 can be of the same type or a different type than that supplied by either the host 12 or the consumer electronic device 16.

An adapter can comprise one or more adapter members. Exemplary types of adapter members can include, but are not limited to, extenders and device holders. In general, an extender extends the service provided by the host 12, the adapter 14, or the consumer electronic device 16. An extender can be coupled between the host 12 and another adapter 14, between the host 12 and a consumer electronic device 16, between two other adapters 14, or between another adapter 14 and a consumer electronic device 16 to extend the service. Extenders are useful to allow an adapter 14 to be coupled to one surface of the host 12, while the consumer electronic device 16 is coupled to a different surface of the host 12 or to simply increase the distance between the host 12 and the consumer electronic device 16. Device holders physically support a consumer electronic device 16.

Exemplary services that the adapter 14 can supply include mechanical communication, power communication, and data communication. Mechanical communication is the physical coupling of two objects, such as between any combination of the host 12, the adapter 14, and the consumer electronic device 16. The mechanical communication includes direct and indirect physical mounting, unless expressly stated otherwise. Physical coupling includes a fixed or removable mounting, unless expressly stated otherwise. Power communication is the coupling of two objects to supply power to at least one of the objects. Data communication is the coupling of two objects to transmit data to at least one of the objects or exchange data between the objects. The mechanical, power, and data communication includes both uni-directional and multi-directional communication, unless stated otherwise, between any combination of the host, adapter, and consumer electronic device. The power and data communication includes wired and wireless communication, unless stated otherwise.

Illustrative applications of these services include the physical mounting of the consumer electronic device 16 to either the host 12 or adapter 14 to place them in mechanical communication with each other. Power communication can include supplying power to the consumer electronic device 16 from either the host 12 or adapter 14 during operation as well as charging a consumer electronic device 16 for later use. Wireless power communication can comprise any types of wireless power communication, including, without limitation for illustration purposes, microwave transmission, laser transmission, and magnetic fields. Data communication can include exchanging data between the host 12 or the adapter 14 and the consumer electronic device 16. Wireless data communication can comprise any type of wireless data communication, including, without limitation for illustration purposes, wireless network (a/k/a Wi-Fi), radio transmission, light transmission, and acoustical transmission.

Each service can comprise multiple categories of the service, where one category of a service is different in some way from another category of the same service. As an example, two possible categories of mechanical communication are hanging a consumer electronic device 16 as opposed to docking the consumer electronic device 16. Exemplary categories of power communication include the type of power, e.g. AC or DC, supplied to the consumer electronic device 16 and variations in the characteristics of the power, such as the voltage or current. Exemplary categories of data communication include encrypted and unencrypted data. Data communication also includes communication for different protocols, including physical layer protocols and software layer protocols. Examples for physical layer protocols are a wired Ethernet and a wireless (Wi-Fi) network, both of which support the same data packet structure. The adapter 14 could effect communication between these two physical layers. Examples of software layer protocol are Zigbee and Bluetooth. The adapter 14 can be used to transform either of the Zigbee and Bluetooth data packets into the other of the Zigbee and Bluetooth data packets to effect communication between devices using a different protocol.

The adapter 14 can be configured to transform the service that it supplies. For example, the adapter 14 could be configured to transform the power supplied by changing the voltage or the amount of available power. An anticipated transformation would be to change the voltage of the power provided to the adapter 14 to another voltage that that adapter 14 supplies. Another anticipated transformation is the changing of AC power to DC. The data communication could be transformed such that the adapter 14 changes unencrypted data to encrypted data or a standard communication protocol to a proprietary protocol. Other anticipated transformations include the changing from wired power to wireless power, from wired data to wireless data, or from standard power or standard data to power with imbedded data.

The service supplied by the adapter 14 can be provided at least in part by the host 12. For example, the mechanical communication for the consumer electronic device 16 can be provided in part by a horizontal or vertical surface of the host 12, the power supplied by the adapter 14 can be provided through a power connection between the host 12 and an external power source, such as a mains electricity supply, and the data transferred by the adapter 14 can by provided by the host 12, such as from the host controller, or through a data connection between the host 12 and an external source, such as a computer network, a telecommunication network, or another appliance.

Alternately, the service supplied by the adapter 14 can be provided at least in part by the use environment. The use environment, as used herein, is the area surrounding the host 12. For example, in the case where the host 12 is an appliance, the use environment can be a nearby wall of a building or similar structural feature. The use environment can include sources of power and data, such as a mains electricity supply or a computer network.

The term “provide,” and any variation thereof, as used herein denotes the source of the service relative to the modular system 10, and is not limited to the “provider” being the origin of the service. In other words, providing is used to denote the source of the service relative to the host 12, the adapter 14, and the consumer electronic device 16, regardless of whether the service originates with the object that provides the service. The object that provides the service can simply be passing on the service. For example, for a host 12 comprising an appliance that provides the service of power communication, the appliance can simply pass on electricity it receives from a household outlet. However, the same appliance can provide another service that originates with the appliance, such as mechanical communication where an adapter 14 and a consumer electronic device 16 are physically coupled to the appliance. Moreover, the object that the service is provided to is not necessarily the end receiver of the service. The service can simply be transmitted through the object that is provided with the service. An object, such as the adapter 14, can be provided with the service, such as from the host 12, and can transmit or supply the service, such as to the consumer electronic device 16.

The host 12 and the consumer electronic device 16 each comprise at least one service interface, respectively referred to herein as a host service interface and a device service interface. The service interfaces can be integrally formed with the host 12 or consumer electronic device 16, or can be an add-on device. The service interfaces can be removable or non-removable from the host 12 or consumer electronic device 16. At least one service can be provided to the adapter 14 through the host service interface, the device service interface, or both, and the adapter 14 can in turn supply that service through the other of the host service interface and the device service interface. As an example, for a uni-directional service where the service is provided to from the host 12 to the consumer electronic device 16 via the adapter 14, the service can be supplied to the adapter 14 through the host service interface, and to the consumer electronic device 16 through the device service interface.

While the device service interface and host service interface can be the same, it is anticipated that the device service interface is different from the host service interface. The term “different”, when used to describe the host and device service interfaces, means that the host service interface and device service interface cannot be directly coupled, or if directly coupled, one or both of the interfaces lose some functionality. Different can also mean that the two service interfaces are incompatible An anticipated type of difference is that the host service interface and the device service interface will have different physical connectors for one or more of the services, thereby needing the adapter 14 to couple the physical connectors to establish the appropriate communication for the service.

The adapter 14 can comprise at least one component that enables a service to be supplied between the host 12 and the consumer electronic device 16. An adapter component can provide, supply, or receive at least one service. A single adapter component can enable the supply of only one service to the consumer electronic device 16 or it can enable the supply of multiple services to the consumer electronic device 16. The adapter 14 can be provided with multiple adapter components that each enable the supply of a different service to the consumer electronic device 16. One or more adapter components can form an adapter service interface, similar to a host or device service interface, and can couple with a host service interface, a device service interface, or another adapter service interface to provide, transmit, or supply at least one service.

An adapter component can couple with the host 12, the consumer electronic device 16, or neither. An adapter component can comprise a connector component, such as a connector component that forms a part of an adapter service interface, that enables the supply of the service through a physical coupling with the host 12, consumer electronic device 16, or another adapter 14, e.g. a plug fitting into a socket to enable power delivery, or through a non-physical coupling with the host 12, consumer electronic device 16, or another adapter 14, e.g. establishing a wireless connection to enable data transfer. An adapter component can comprise a transformative component such as an electrical transformer to change the voltage of the power or an inverter to change the type of power. An adapter component can comprise an adapter service interface that couples with a host service interface or a device service interface.

The adapter 14 can further comprise functionality unrelated to supplying the service between the host 12 and consumer electronic device 16. The adapter functionality can operate independently of the host 12 and the consumer electronic device 16, or it can enhance one or more of the functions of the host 12 and the consumer electronic device 16. The functionality can be dependent upon whether the adapter 14 is coupled with the host 12, and also on whether the consumer electronic device 16 is coupled with the adapter. The functionality can permit the adapter 14 and/or the consumer electronic device 16 to be used independently of the host 12. In this case, the adapter 14 often provides and supplies at least one service to the consumer electronic device 16. The functionality can be effected by one or more components of the adapter.

Examples of adapter functionality include, but are not limited to a speaker, a user interface, a display projection, a media manager, a whiteboard, physical storage, application software hosting, communications routing, power storage, microphone, data storage, and consumer electronic device. An adapter 14 with speaker functionality comprises at least one audio speaker that intensifies and makes speech or music audible. An adapter 14 with user interface functionality comprises a display and/or an input area that allows to user to interface with the host 12, adapter 14, consumer electronic device 16, or an external source. An adapter 14 with calendar projection functionality allows a calendar or schedule to be projected visually or audibly. An adapter with media manager functionality allows a user to manage all types of media (e.g. music, video, pictures, etc.). An adapter 14 with whiteboard functionality comprises a conventional whiteboard for temporarily writing messages, and can be available to the user only when a consumer electronic device 16 is not coupled to the adapter 14, or can be available at all times to the user. An adapter 14 with physical storage functionality comprises a storage compartment for storing items, and may be particularity useful for storing companion items for the consumer electronic devices, such as a remote control for a consumer electronic device comprising a television or DVDs for a consumer electronic device comprising a DVD player. An adapter 14 with power storage functionality comprises a source of stored power, such as a rechargeable battery. An adapter with data storage functionality comprises means for storing data, such as a hard drive. An adapter with consumer electronic device functionality incorporates the entire functionality of one or more consumer electronic device as a function of the adapter.

An adapter 14 can comprise more than one type of functionality. For example, whiteboard functionality can be combined with physical storage functionality for storing items commonly associated with whiteboards, such as dry-erase markers and erasers.

Figure 2:
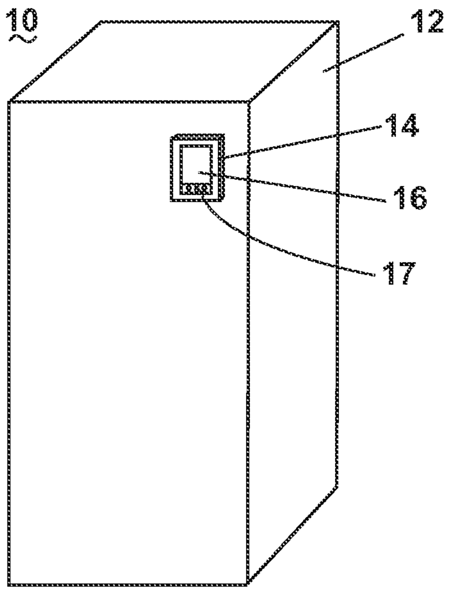
FIG. 2 is a schematic illustration of a first configuration of the modular system from FIG. 1, showing the consumer electronic device coupled with the host via the adapter.

Referring now to the schematic illustration of one configuration of the modular system 10 shown in FIG. 2, the consumer electronic device 16 is coupled with the host 12 via the adapter 14. The consumer electronic device 16 is physically coupled with the adapter 14, which is in turn physically coupled with the host 12. In this way, the adapter 14 is in mechanical communication with the host 12, and the consumer electronic device 16 is in mechanical communication with the adapter 14, which places the consumer electronic device 16 in mechanical communication with the host 12. Thus, the mechanical communication is direct between the adapter 14 and both the host 12 and consumer electronic device 16 and indirect between the consumer electronic device 16 and the host 12.

The consumer electronic device 16 can be provided with a user interface 17 to enable the user to interact with the consumer electronic device 16 or receive a functional output from the consumer electronic device. The user interface 17 can comprise a video display, a touch screen, control knobs or buttons, a data display, a keypad, a printer or facsimile page output, a microphone, a speaker, a video or still camera, and the like.

Figure 3:
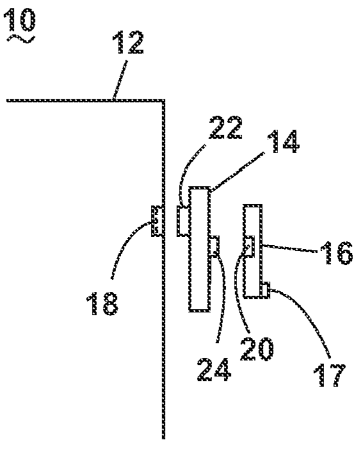
FIG. 3 is a schematic side illustration of the modular system from FIG. 1, showing the adapter and consumer electronic device exploded from the host.

Referring to FIG. 3, a schematic exploded side view of the modular system 10 is shown, where the host 12 comprises a host service interface 18 that couples with a first component 22 of the adapter 14, and the consumer electronic device 16 comprises a device service interface 20 that couples with a second component 24 of the adapter 14. At least one service is provided to the adapter 14 through the coupling with the host service interface 18 or the device service interface 20. At least one service is supplied to the consumer electronic device 16 through the device service interface 20 or to the host 12 through the host service interface 18, or, in the case of a multi-directional service, both.

It is anticipated that a common implementation will include a single host 12, a single adapter 14, and a single consumer electronic device 16. However, it is within the scope of the invention for one or all of the host 12, adapter 14, and consumer electronic device 16 to be in a plural arrangement. An illustrative example includes multiple hosts 12 concurrently coupled to one consumer electronic device 16 by one or more adapters 14. Another illustrative example includes multiple consumer electronic devices 16 coupled to a single host 12 by one or more adapters 14.

For a modular system comprising multiple hosts 12, each host 12 can be provided with a common, standardized host interface 18. For example, competing home appliance manufactures may have different host interfaces 18, but each manufacturer may carry the same standardized host interface 18 throughout its own line of home appliances. For a modular system with multiple adapters 14 and a single host 12, the host 12 can interchangeably couple with any one of the adapters 14. The multiple adapters 14 preferably have a standardized component that is received by the host interface 18 so that the host 12 can interchangeably receive the adapters. Manufacturers of consumer electronic devices may also choose to carry a standardized device interface 20 throughout its own line of consumer electronic devices 16. Therefore, different adapters 14 can be provided for coupling the standardized interface for a consumer electronic device 16 of one manufacturer to the standardized interface of an appliance for another manufacturer and enabling the communication of a service therebetween. This eliminates the need for all manufacturers to use the same standardized interface and increases the utility of the appliances and the consumer electronic devices 16.

Figure 4:
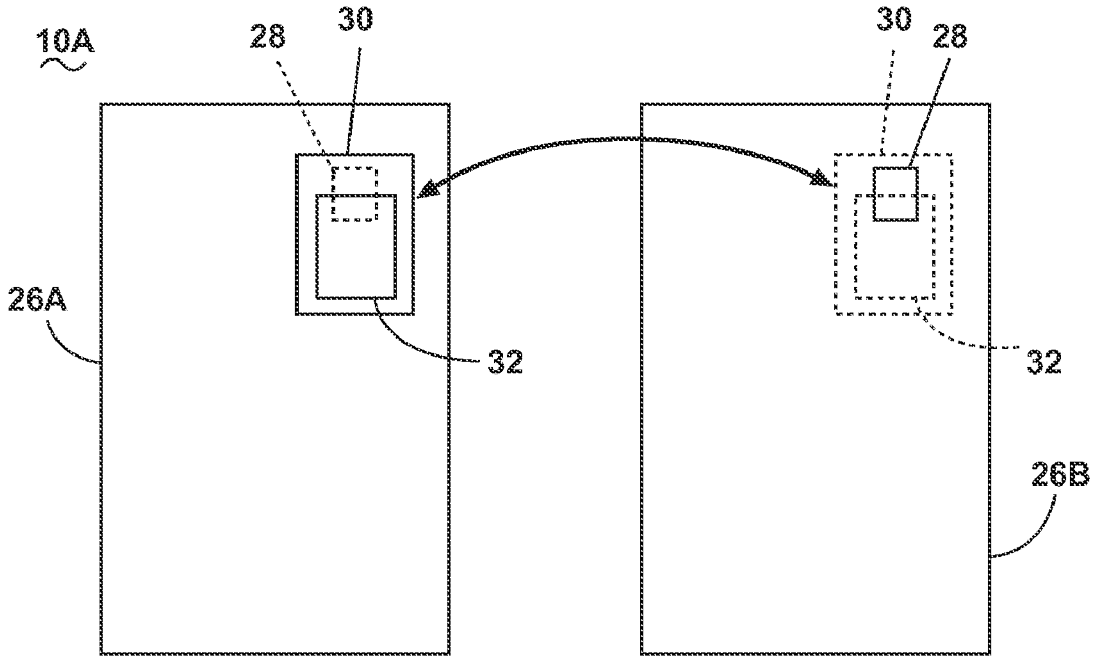
FIG. 4 is a schematic illustration of a second configuration of the modular system, where the modular system comprises two hosts, an adapter, and a consumer electronic device.

Other possible configurations of the modular system will now be described. Referring to FIG. 4, a schematic illustration of a second configuration of a modular system 10A is shown comprising a pair of hosts 26A, 26B, each having a common, standardized host service interface 28, an adapter 30, and a consumer electronic device 32. The hosts 26A, 26B can be appliances that complete a different cycle of operation, such as a refrigerator and a dishwasher. The adapter 30 and consumer electronic device 32 can be alternately coupled to the host interface 28 of either host 26A, 26B.

Figure 5:
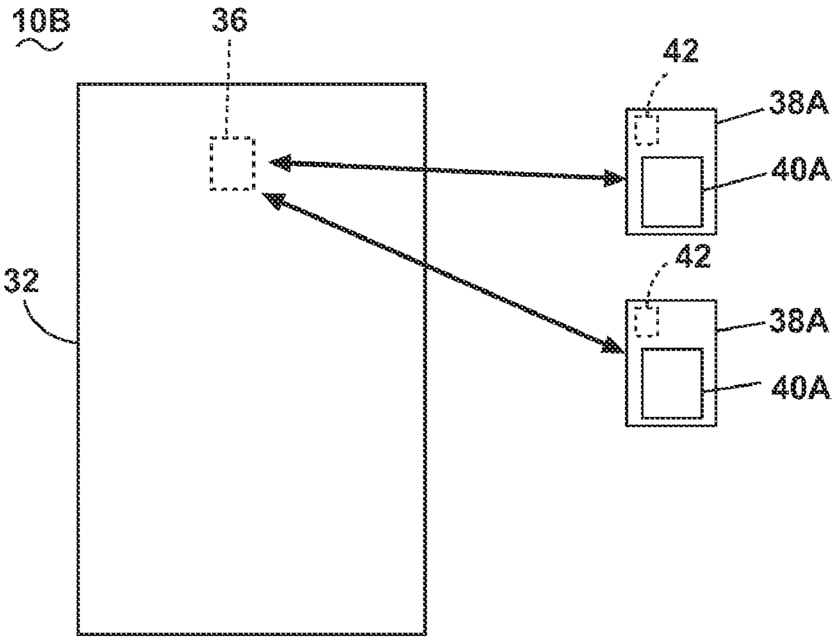
FIG. 5 is a schematic illustration of a third configuration of the modular system, where the modular system comprises a host, two adapters, and two consumer electronic devices, and the adapters are alternately coupled with the host.

Referring to FIG. 5, a schematic illustration of a third configuration of a modular system 10B is shown comprising a host 34 having a host service interface 36, a pair of adapters 38A, 38B, and a pair of consumer electronic devices 40A, 40B, where the host 34 can interchangeably couple with either of the adapters 38A, 38B. The adapters 38A, 38B preferably have a standardized component 42 that is received by the host service interface 36 so that the host 34 can interchangeably receive the adapters 38A, 38B. The adapters 38A and 38B can be the same or different.

Figure 6:
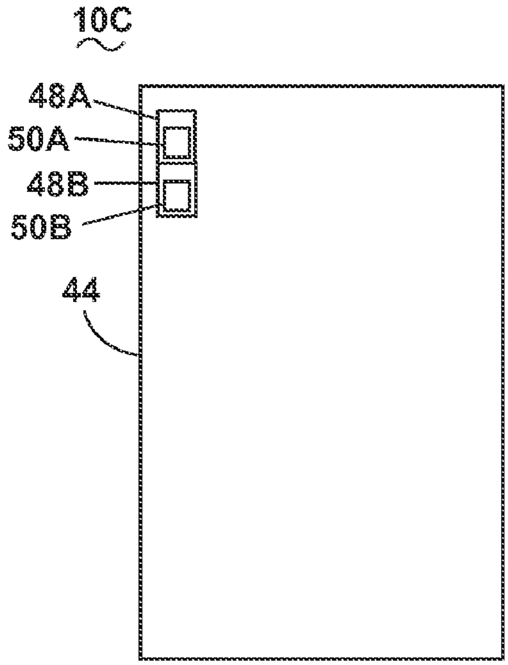
FIG. 6 is a schematic illustration of a fourth configuration of the modular system, where the modular system comprises a host, two adapters, and two consumer electronic devices, and the adapters are simultaneously coupled with the host.
Figure 7:
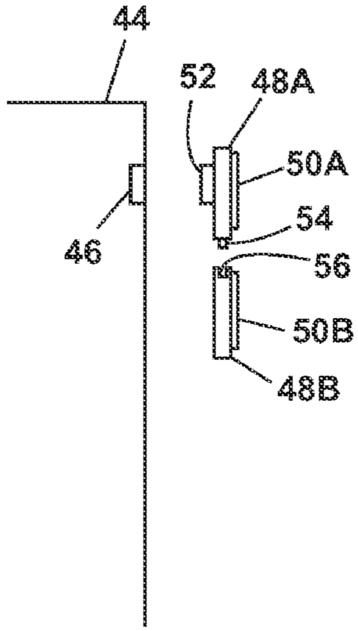
FIG. 7 is a schematic side illustration of the modular system from FIG. 6, showing the adapters and consumer electronic devices exploded from the host.

Referring to FIGS. 6 and 7, a schematic illustration of a fourth configuration of a modular system 10C is shown comprising a host 44 having a host service interface 46, a pair of adapters 48A, 48B, and a pair of consumer electronic devices 50A, 50B, where the host 44 couples with both adapters 48A, 48B simultaneously. The first adapter 48A comprises a first component 52 and a second component 54 and the second adapter 48B comprises a third component 56. The first component 52 couples with the host service interface 46 to couple the respective first consumer electronic device 50A with the host 44. The second and third components 54, 56 are coupled together to "gang" or operably connect the first and second adapters 48A, 48B to each other sequentially, thereby coupling the second consumer electronic device 50B with the host 44.

Figure 8:
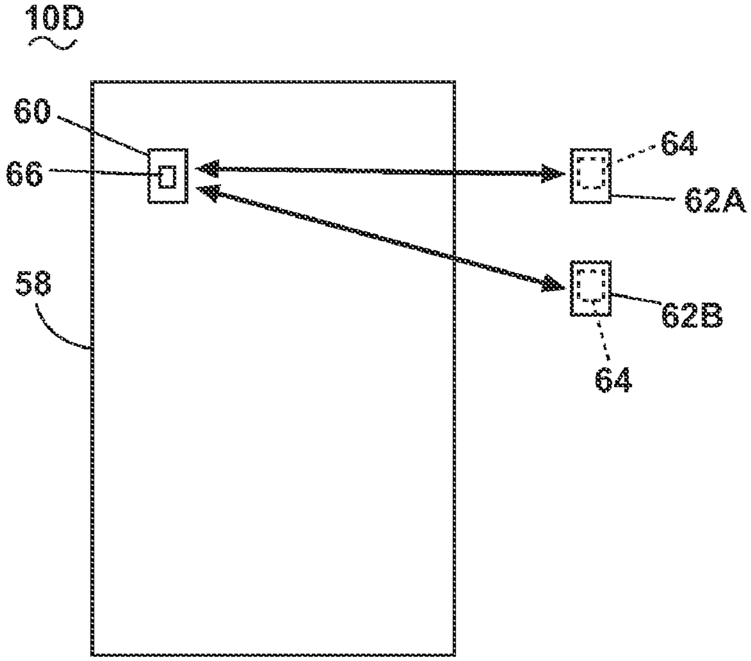
FIG. 8 is a schematic illustration of a fifth configuration of the modular system, where the modular system comprises a host, an adapter, and two consumer electronic devices.

Referring to FIG. 8, a schematic illustration of a fifth configuration of a modular system 10D is shown comprising a host 58, an adapter 60, and a pair of consumer electronic devices 62A, 62B, where the adapter 60 can interchangeably couple with either of the consumer electronic devices 62A, 62B. Each consumer electronic device 62A, 62B comprises a common, standardized device service interface 64. The adapter 60 has a standardized component 66 that interchangeably receives the device service interface 64 of either consumer electronic device 62A, 62B. The consumer electronic devices 62A, 62B can each perform a different primary function.

Figure 8A:
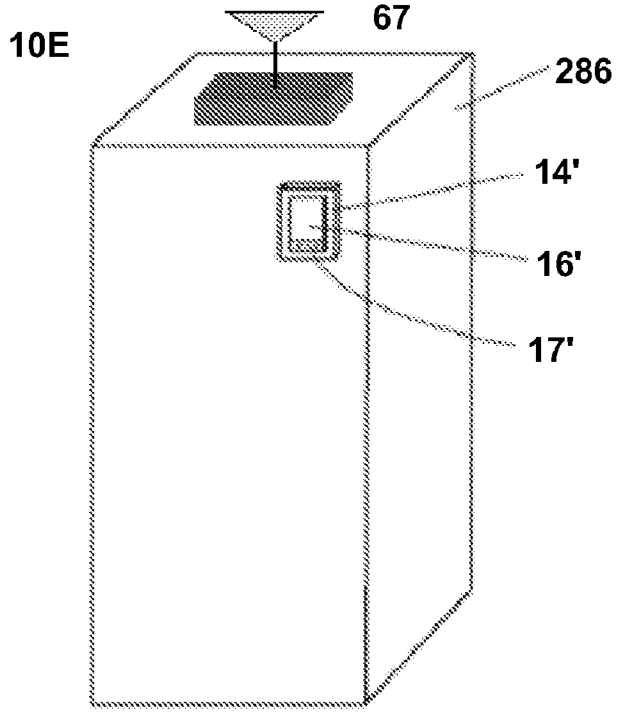
FIG. 8A is a schematic illustration of a sixth configuration of the modular system, where the modular system comprises a host with two adapters and a consumer electronic device.

Referring to FIG. 8A, a schematic illustration of a sixth configuration of a modular system 10E is shown, where modular system 10E is similar to modular system 10, and elements similar to those of modular system 10 are identified by the same reference numerals bearing a prime (') symbol. The adapter 14' supplies the service of mechanical communication between the host 12' and the consumer electronic device 16' and can be thought of as a mechanical communication adapter. The consumer electronic device 16' is physically coupled with the mechanical communication adapter 14', which is in turn physically coupled with the host 12'. In this way the mechanical communication adapter 14' is in mechanical communication with the host 12' and the consumer electronic device 16' is in mechanical communication with the mechanical communication adapter 14', which places the consumer electronic device 16' in mechanical communication with the host 12'. In addition to the mechanical communication adapter 14', modular system 10E comprises a wireless communications adapter 67. The wireless communications adapter 67 supplies power and/or data communication between the host 12' and the mechanical communication adapter 14' or the consumer electronic device 16' through a wireless power and/or data connection. The wireless communications adapter 67 can be physically mounted to the host 12', or can be a separate module. Thus, the consumer electronic device 16' is mechanically coupled with the host 12' via the mechanical communication adapter 14' and is wirelessly coupled with the host 12' via the wireless communications adapter 67.

Figure 8B:
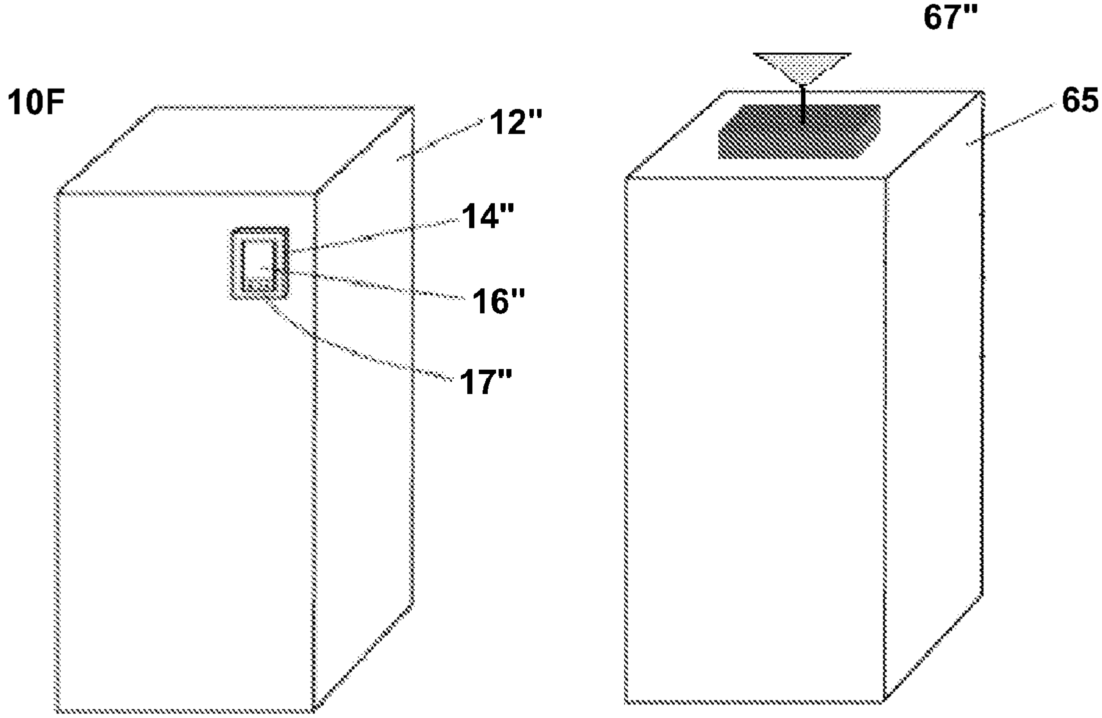
FIG. 8B is a is a schematic illustration of a seventh configuration of the modular system where the modular system comprises two hosts, two adapters, and a consumer electronic device.

Referring to FIG. 8B, a schematic illustration of a seventh configuration of a modular system 10F is shown, where modular system 10F is similar to modular system 10E, and elements similar to those of modular system 10 are identified by the same reference numerals bearing a double prime (") symbol. Modular system 10F further includes a second host 65 having the wireless communications adapter 67" mounted thereto. The wireless communications adapter 67" supplies power and/or data communication between the host 65 and the host 12", the mechanical communication adapter 14" or the consumer electronic device 16" through a wireless power and/or data connection. The wireless communications adapter 67" can further receive power and/or data from either host 12", 65 and supply it to the consumer electronic device 16" or mechanical communication adapter 14". In this way, the consumer electronic device 16" is mechanically coupled with the host 12" via the mechanical communication adapter 14" and is wirelessly coupled with the host 65 via the wireless communications adapter 67".

Specific embodiments of modular systems containing these features, as well as some additional features will now be described. Other examples of modular systems are described in the following related applications filed contemporaneously herewith: U.S. patent application Ser. No. 11/619,900, now U.S. Pat. No. 7,625,246, issued Dec. 1, 2009, entitled "System for Supplying Service from an Appliance to Multiple Consumer Electronic Devices"; U.S. patent application Ser. No. 11/619,754 , entitled "System for Connecting Mechanically Dissimilar Consumer Electronic Devices to an Adapter or a Host"; U.S. patent application Ser. No. 11/619,836, now U.S. Pat. No. 7,651,368, issued Jan. 26, 2010, entitled "Appliance with an Adapter to Simultaneously Couple Multiple Consumer Electronic Devices"; U.S. patent application Ser. No. 11/619,907, entitled "Appliance with an Electrically Adaptive Adapter to Alternatively Couple Multiple Consumer Electronic Devices"; U.S. patent application Ser. No. 11/619,922, entitled "A Removable Adapter Providing a Wireless Service to Removable Consumer Electronic Device"; U.S. patent application Ser. No. 11/619,894, entitled "Host with Multiple Adapters for Coupling Consumer Electronic Devices"; U.S. patent application Ser. No. 11/619,806, entitled "Transformative Adapter for Coupling a Host and a Consumer Electronic Device Having Dissimilar Standardized Interfaces"; U.S. patent application Ser. No. 11/619,817, entitled "Host with Multiple Sequential Adapters for Multiple Consumer Electronic Devices"; U.S. patent application Ser. No. 11/619,850, entitled "Appliance Door with a Service Interface"; U.S. patent application Ser. No. 11/619,912, entitled "Door with a Service Interface on an Edge"; U.S. patent application Ser. No. 11/619,873, entitled "A Dispenser with a Service Interface for a Consumer Electronic Device"; U.S. patent application Ser. No. 11/619,904, now U.S. Pat. No. 7,798,865, issued Sep. 21, 2010, entitled "Service Supply Module and Adapter for a Consumer Electronic Device"; U.S. patent application Ser. No. 11/619,767, entitled "Adapter for Docking a Consumer Electronic Device in Discrete Orientations"; U.S. patent application Ser. No. 11/619,772, entitled "Host and Adapter for Selectively Positioning a Consumer Electronic Display in Visible and Concealed Orientations"; U.S. patent application Ser. No. 11/619,775, abandoned Sep. 13, 2010, entitled "Host and Adapter for Selectively Positioning a Consumer Electronic Device in Accessible and Inaccessible Orientations"; U.S. patent application Ser. No. 11/619,718, now U.S. Pat. No. 7,765,332, issued Jul. 27, 2010, entitled "Functional Adapter for a Consumer Electronic Device"; U.S. patent application Ser. No. 11/619,731, now U.S. Pat. No. 7,618,295, issued Nov. 17, 2009, entitled "Adapter and Consumer Electronic Device Functional Unit"; U.S. patent application Ser. No. 11/650,222, now U.S. Pat. No. 7,686,127, issued Mar. 30, 2010, entitled "Acoustic Chamber as Part of Adapter or Appliance"; and U.S. patent application Ser. No. 11/649,932, entitled "Electrical Accessory Charging Compartment for a Cabinet and Retrofit Components Therefor", all of which are incorporated herein by reference in their entirety.

Figure 9:
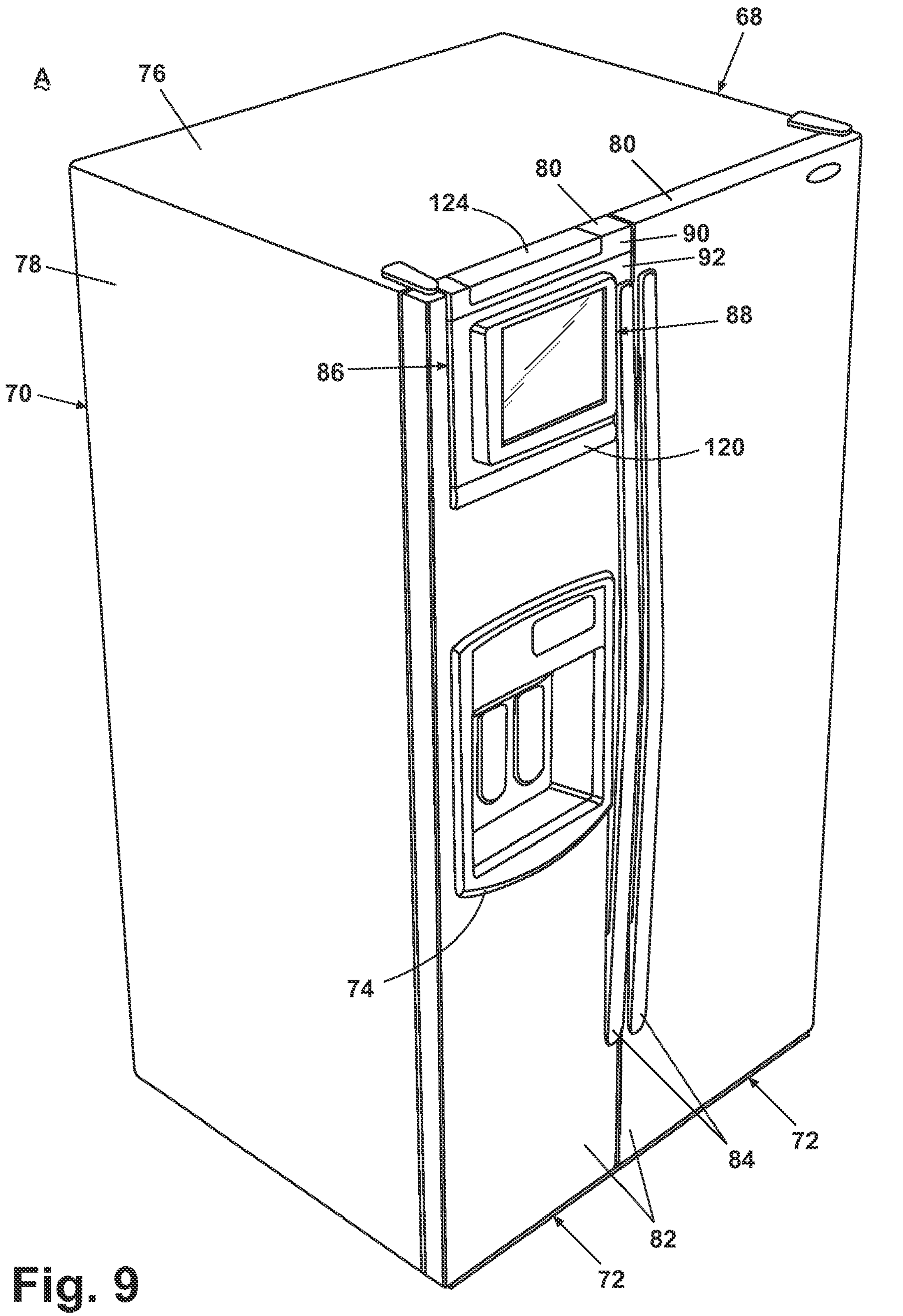
FIG. 9 is a perspective view of a first specific embodiment of a modular system, showing a refrigerator with an adapter and video display.

Referring to FIG. 9, a first embodiment of a modular system A is shown. In this figure, and most of the following figures, the host is shown as an appliance comprising a refrigerator 68; however, it is understood that the invention is not limited to appliances. The refrigerator 68 comprises a cabinet 70 having an open front face (not shown), a pair doors 72 moveably mounted to the cabinet 70 to selectively close the open front face, and a dispenser 74 mounted within one of the doors 72 for selectively dispensing water and/or ice. The cabinet 70 has a top horizontal surface 76 and two side vertical surfaces 78. Each refrigerator door 72 has a top horizontal surface 80, a front vertical surface 82, and a handle 84 mounted to the front vertical surface 82.

Figure 10:
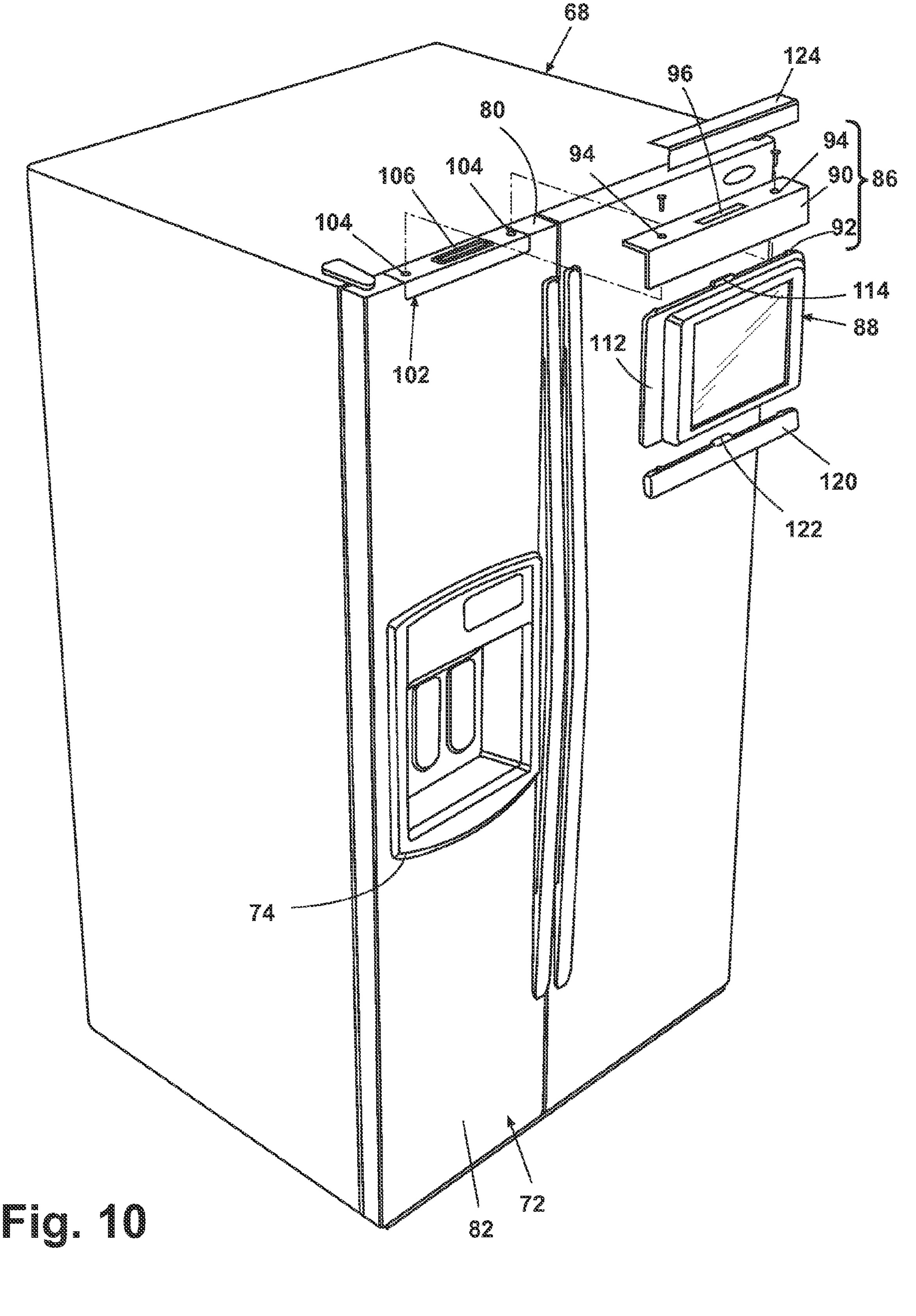
FIG. 10 is an exploded view of the modular system from FIG. 9.
Figure 11:
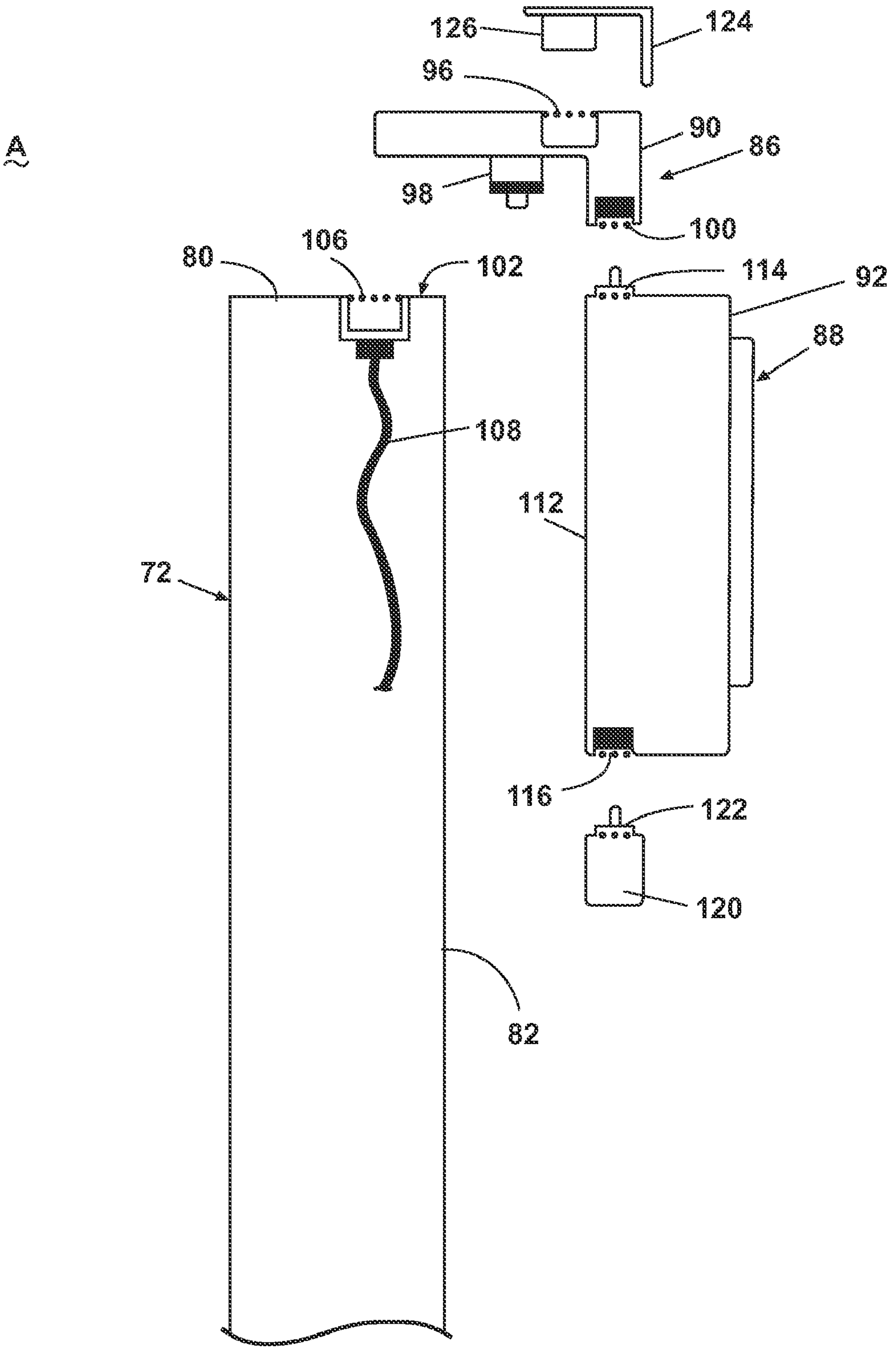
FIG. 11 is a schematic illustration of the connections between the modular system shown in FIG. 9.

Referring additionally to FIGS. 10 and 11, the modular system A further comprises an adapter 86, and a consumer electronic device illustrated as a video display 88. The adapter 86 comprises an extender 90 and a device holder 92 supporting the video display 88. The extender 90 comprises a L-shaped bracket having pair of spaced screw hole openings 94 on either side of a female cap connector 96, a downwardly facing power/data plug 98, and a downwardly facing power/data socket 100.

A host service interface 102 is integrally formed in the top surface 80 of one of the refrigerator doors 72 and comprises a pair of spaced screw holes 104 on either side of a power/data socket 106. Electrical power and data is provided by the refrigerator 68 to the host service interface 102 through an electrical/data connection with the refrigerator, indicated by the wire 108 terminating in the power/data socket 106. The extender 90 is coupled to the host service interface 102 by plugging the power/data plug 98 into the power/data socket 106. This automatically aligns the screw hole openings 94 with the screw holes 104 and the extender 90 is mechanically secured to the refrigerator 68 by driving the screws 110 into the screw holes 104.

The device holder 92 comprises a support housing 112 for the consumer electronic device 88 and comprises a power/data plug 114 on the upper surface of the housing 112 and a power/data socket 116 on the lower surface of the housing 112. The device holder 92 is coupled to the extender 90 by plugging the power/data plug 114 into the power/data socket 100. In addition to provided power and data communication, this connection also provides a mechanical communication between the device holder 92 and the extender 90. The video display 88 is affixed to the support housing 112. The video display 88 can receive electrical power as well as a television or Internet connection through the connections between the power/data plug 98 and the power/data socket 106, and between the power/data plug 114 and the power/data socket 100.

The device holder 92 can further be provided with a detachable end cap 120 having a dummy connector 122 that can be attached to the bottom of the device holder 92 by inserting the dummy connector 122 into the power/data socket 116 to provide an aesthetically pleasing and finished appearance, as well as to protect the device holder 92 from damage. The dummy connector 122 is not wired for power or data connection, but is necessary to physically couple the end cap 120 to the device holder 92. The detachable cap 120 can be removed to attach another adapter or consumer electronic device via the power/data socket 116.

Figure 12:
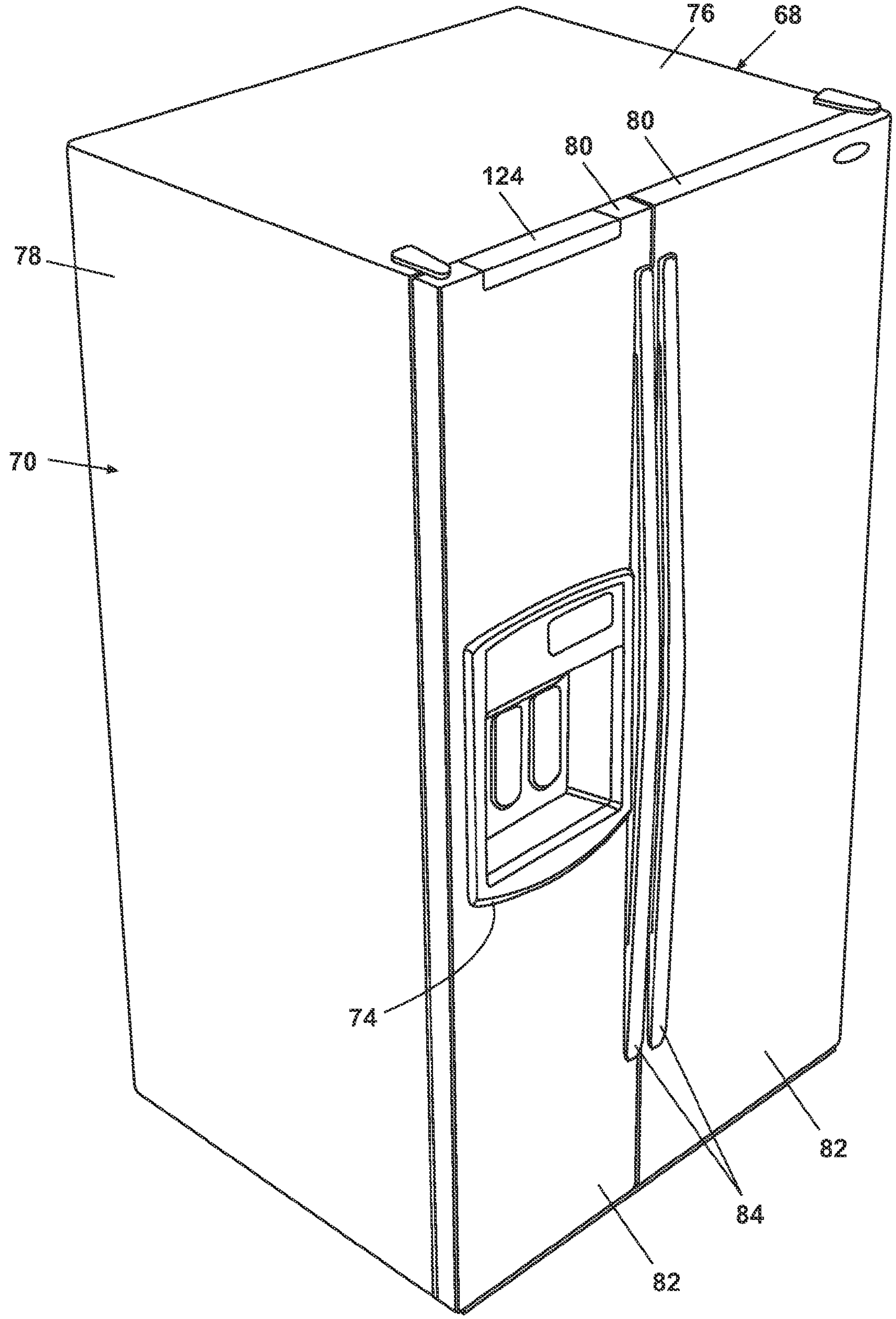
FIG. 12 is a perspective view of the modular system from FIG. 9, with the adapter and video display removed.

Referring additionally to FIG. 12, the consumer electronic device 88 and the adapter 86 can be removed from the refrigerator 68. When the consumer electronic device 88 and the adapter 86 are removed, a host cap 124 can be placed over the host service interface 102 to conceal it and prevent it from damage. To prevent the host cap 124 from being misplaced or lost when the adapter 86 and consumer electronic device 88 are mounted on the refrigerator 68, it can be attachable to the adapter 86, such as to the extender 90 as shown in FIGS. 9 and 11, by plugging a male cap connector 126 provided on the host cap 124 into the female cap connector 96 of the extender 90.

The end cap 120 and host cap 124 can have an aesthetic function as well, by being made to conform to the color and contour of the refrigerator 68 or by being made to contrast with the refrigerator 68. The end cap 120 and host cap 124 can further incorporate a logo or other trademark information, and may present information relating to the availability of adapters. Other elements of modular system A, such as the adapter 86 and video display 88 can also incorporation an aesthetic function.

In the first embodiment, the adapter 86 supplies the services of mechanical, power, and data communication. Mechanical communication is accomplished by fixing the video display 88 to the device holder 92 and mounting the device holder 92 to the refrigerator 68. Power and data communication are accomplished by establishing an electrical connection through a series of plug and socket connectors on the host service interface 102, extender 90, and device holder 92.

Figure 13A:
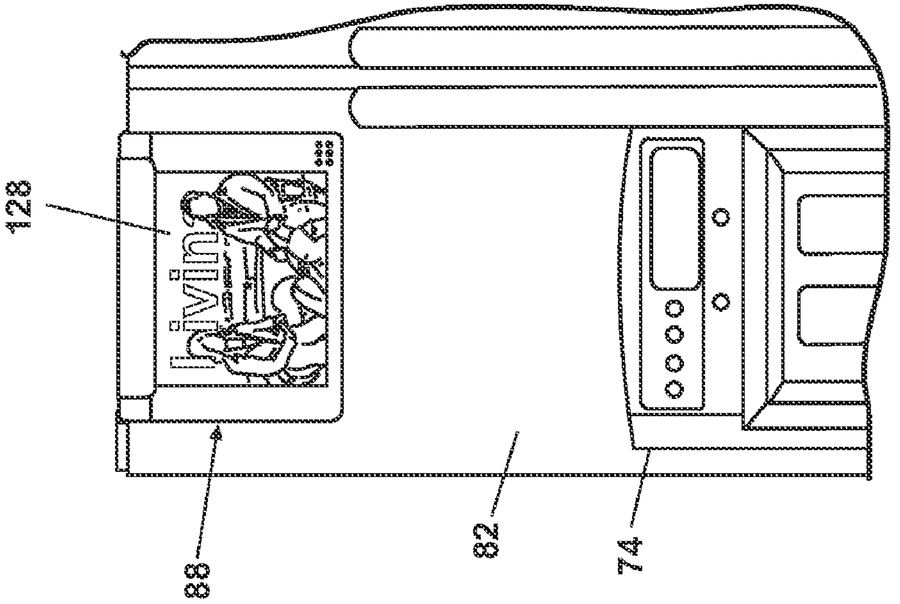
FIG. 13A is a partial front view of the modular system from FIG. 9, where the video display comprises a television.
Figure 13B:
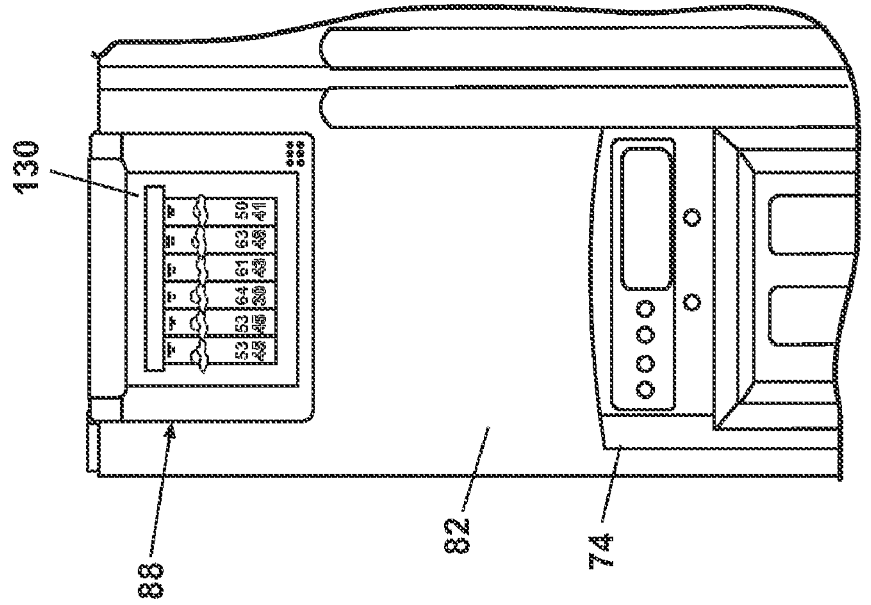
FIG. 13B is a partial front view of the modular from FIG. 9, where the video display comprises a weather station.

Referring to FIGS. 13A and 13B, alternate embodiments of the video display 88 are shown. In FIG. 13A, the video display 88 comprises a television 128 and can be connected to an antenna or cable to receive a television signal, or can be configured for wireless television or cable programming reception. In FIG. 13B, the video display screen comprises a weather station 130 and has an Internet connection for receiving weather information. While described as being alternate embodiments of the video display 88 for the modular system A, it is understood that the modular system A could alternately comprise both the television 128 and the weather station 130 and each video display 88 can be provided with a standardized component that can couple with the device holder 92.

Figure 14:
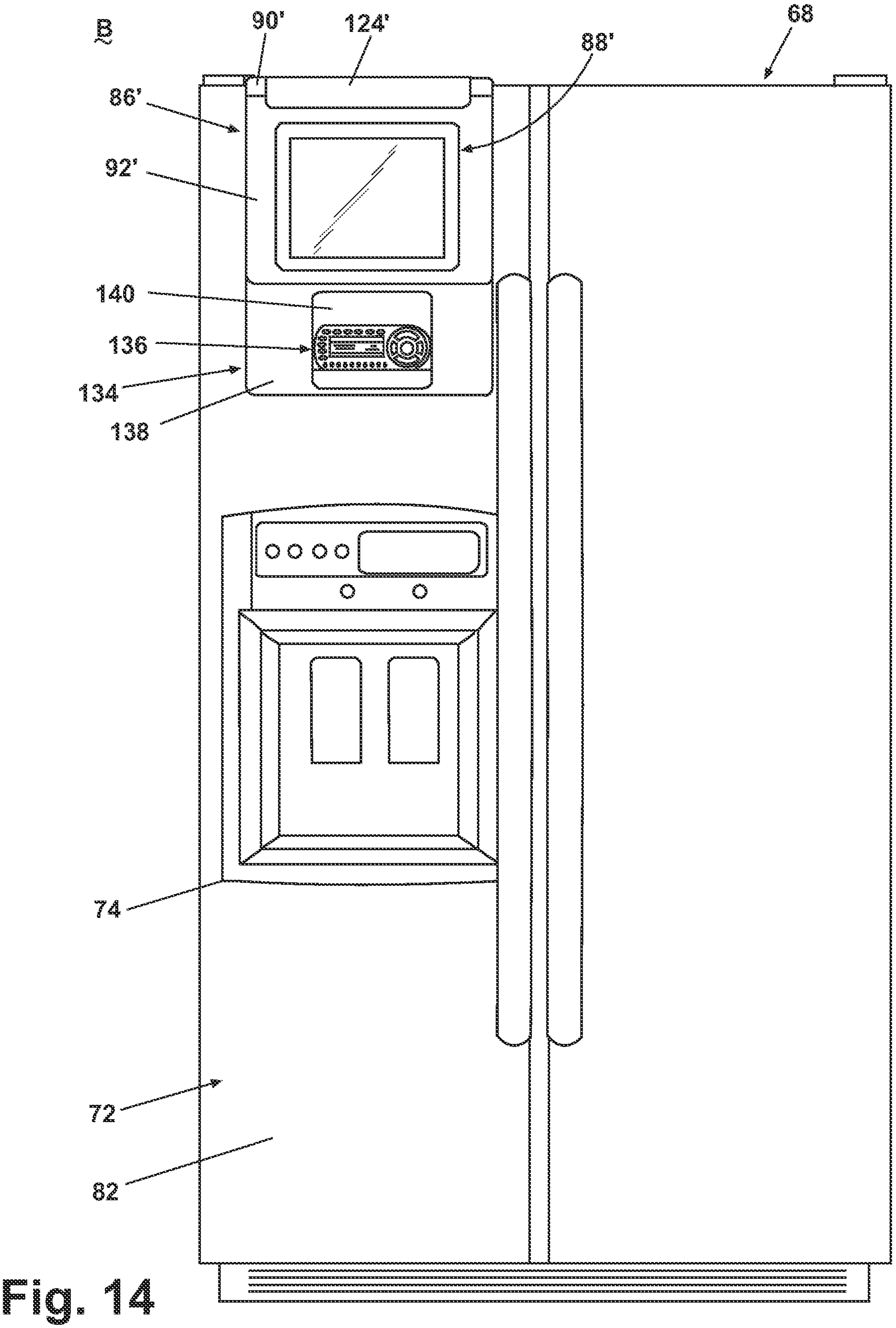
FIG. 14 is a perspective view of a second specific embodiment of a modular system, showing a refrigerator with two adapters, a video display, and a satellite radio.
Figure 15:
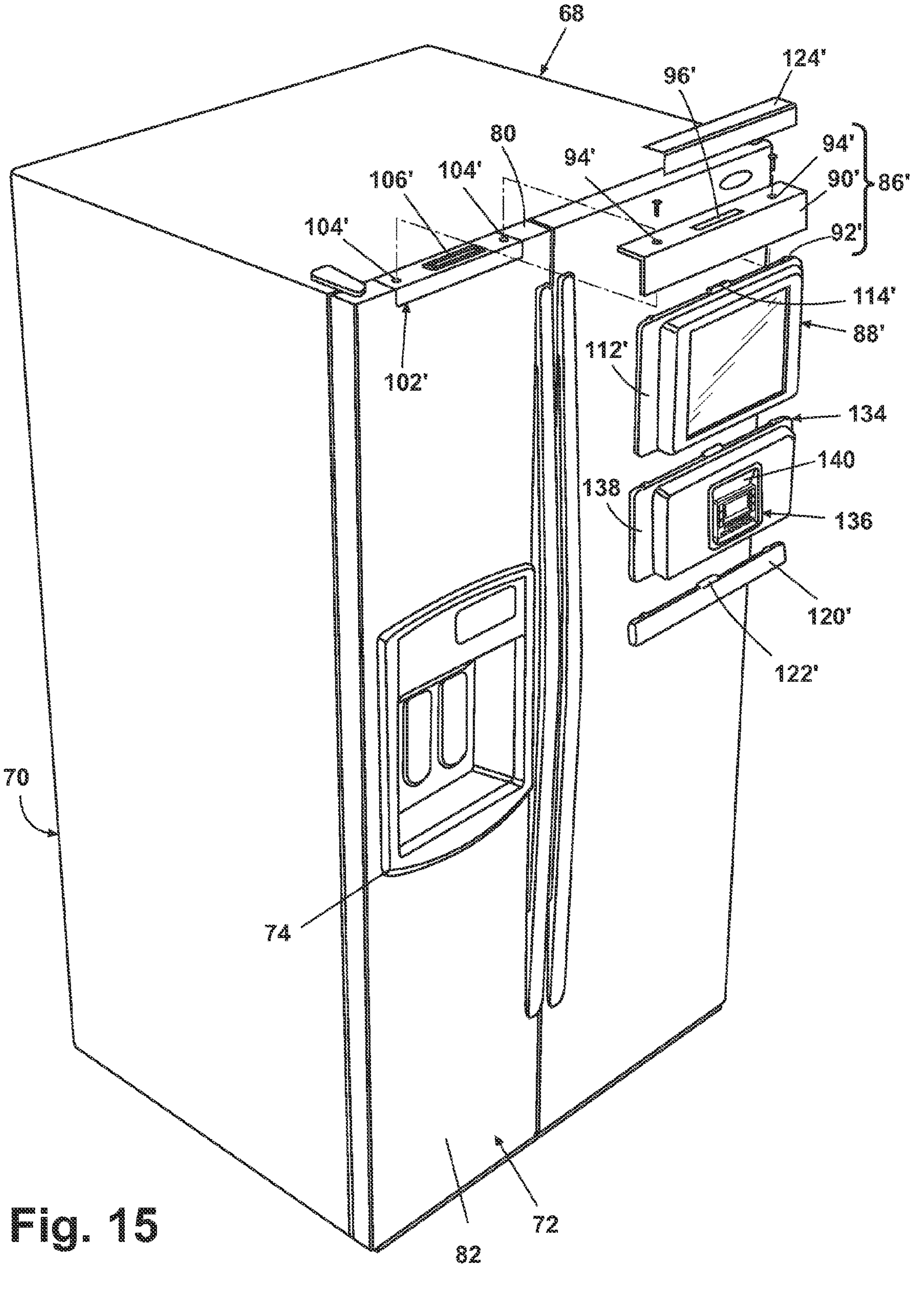
FIG. 15 is an exploded view of the modular system from FIG. 14.
Figure 16:
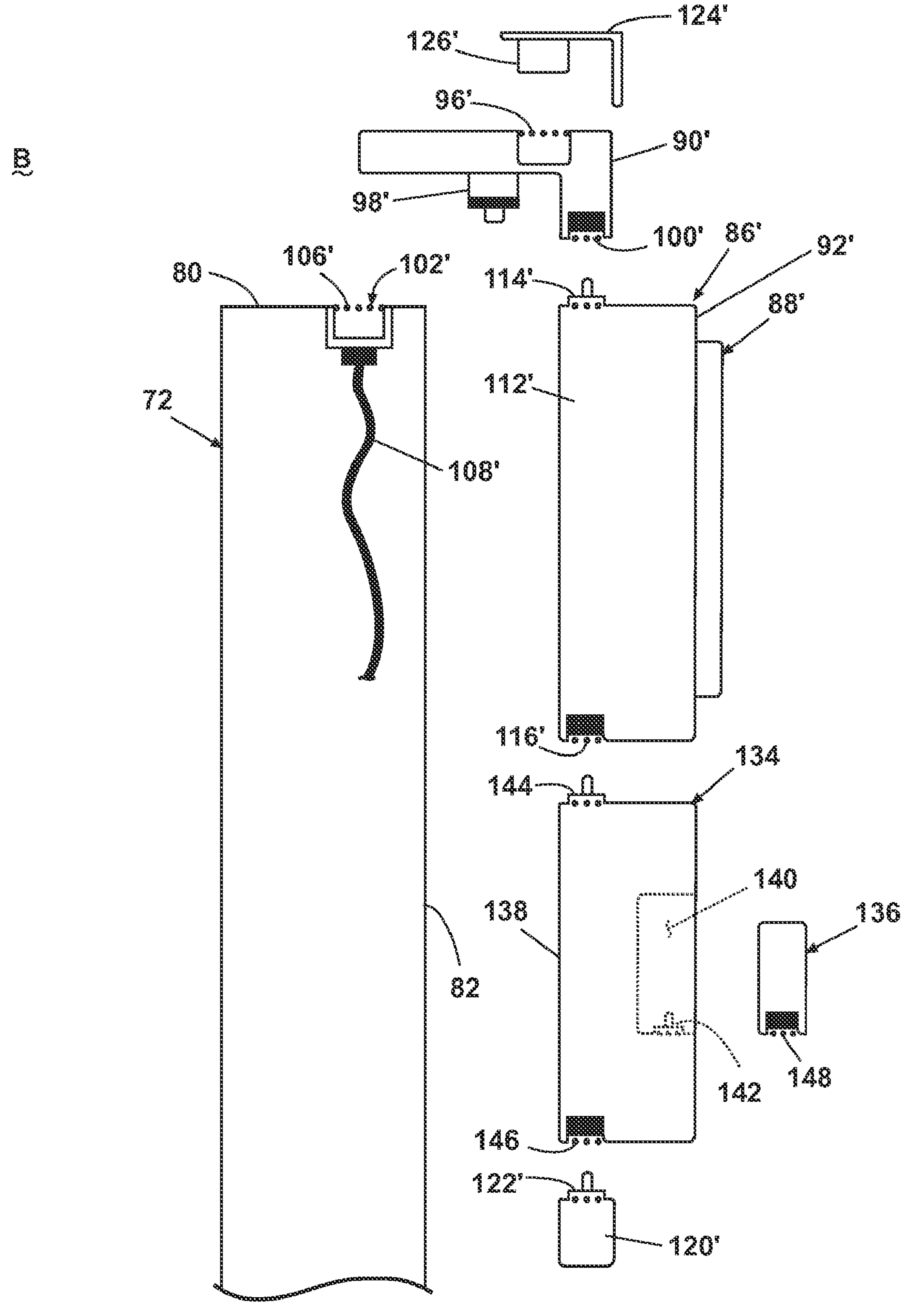
FIG. 16 is a schematic illustration of the connections between the modular system shown in FIG. 14.

Referring to FIGS. 14-16, a second embodiment is shown, where a modular system B is similar to modular system A, and elements similar to those of modular system A are identified by the same reference numerals bearing a prime (') symbol. Modular system B can be thought of as an expansion of modular system A, where an additional adapter 134 and a consumer electronic device, illustrated as a satellite radio 136, are added on to modular system A to create modular system B.

Modular system A is expanded to modular system B by removing the end cap 120' and attaching the adapter 134, which comprises a single device holder 138 supporting the consumer satellite radio 136. The device holder 138 comprises an open cavity 140 having a connector 142, for removably docking the satellite radio 136. A power plug 144 is formed on an upper surface of the device holder 138 and a power socket 146 is formed on a lower surface. The device holder 138 is coupled to the device holder 92' by plugging the power plug 144 into the power/data socket 116'. The end cap 120' can be coupled to the device holder 138 by plugging the dummy connector 122' into the power socket 146. While not specifically shown, it is understood that additional adapters and consumer electronic devices can be added onto the modular system B by removing the end cap 120 and connecting other device holders in a ganged arrangement.

The satellite radio 136 is provided with a device service interface 148 that is compatible with the connector 142. The device service interface 148 is physically coupled with the connector 142 to establish a connection between the device holder 138 and the satellite radio 136. Thus, the adapter 134 supplies the services of mechanical and power communication. Mechanical communication is accomplished by removably mounting the satellite radio 136 within the cavity 140. Power communication is accomplished by establishing an electrical connection through the plug and socket connectors on the host service interface 102', extender 90', the device holder 92' and the device holder 138.

Figure 17:
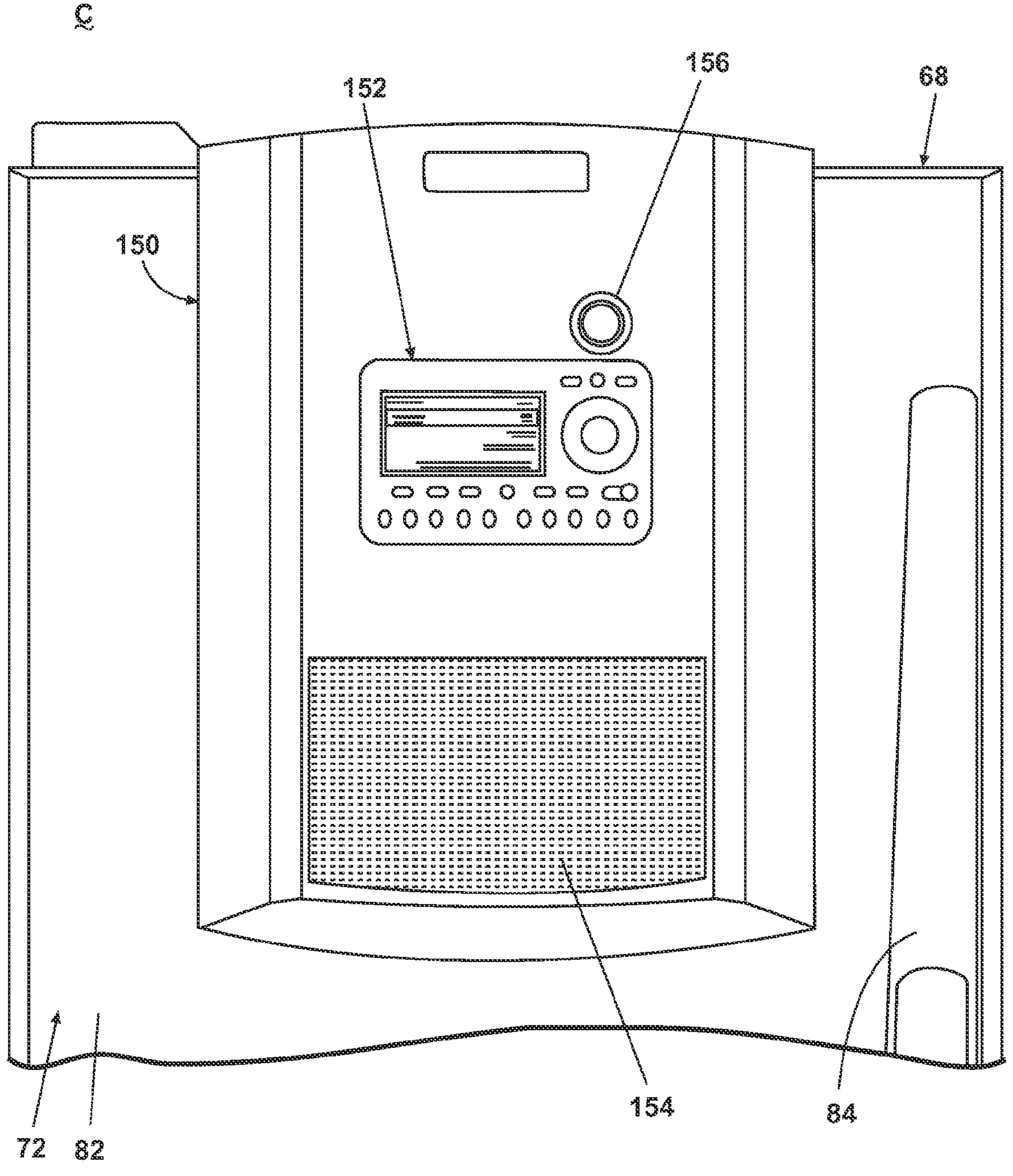
FIG. 17 is a partial front view of a third specific embodiment of a modular system, showing a refrigerator with an adapter having functionality and a satellite radio.

Referring to FIG. 17, a third embodiment is shown, where a modular system C comprises the refrigerator 68, an adapter 150, and a consumer electronic device illustrated as a satellite radio 152. The adapter 150 is mounted to the front vertical surface 82 of one of the refrigerator doors 72. The service of mechanical communication is provided to the satellite radio 152 by removably mounting it to the adapter 150. While not shown, the service of power communication is also provided through an internal service interface connection between the satellite radio 152 and the adapter 150.

The adapter 150 further has speaker and user interface functionality. A speaker 154 is mounted to the adapter 150 and receives audio signals from the satellite radio 152 and transforms it into audible sound. A user interface comprising a rotary encoder or potentiometer knob 156 is also mounted to the adapter 150 and can adjust the volume of the sound projecting from the speaker 154. The adapter 150 can further comprise an internal acoustic chamber (not shown) that can be tuned to provide better speaker performance than is achieved without such a chamber. In this way, the adapter 150 provides additional functionality. In this embodiment, the additional functionality is different from the services provided by the refrigerator 68.

Figure 18A:
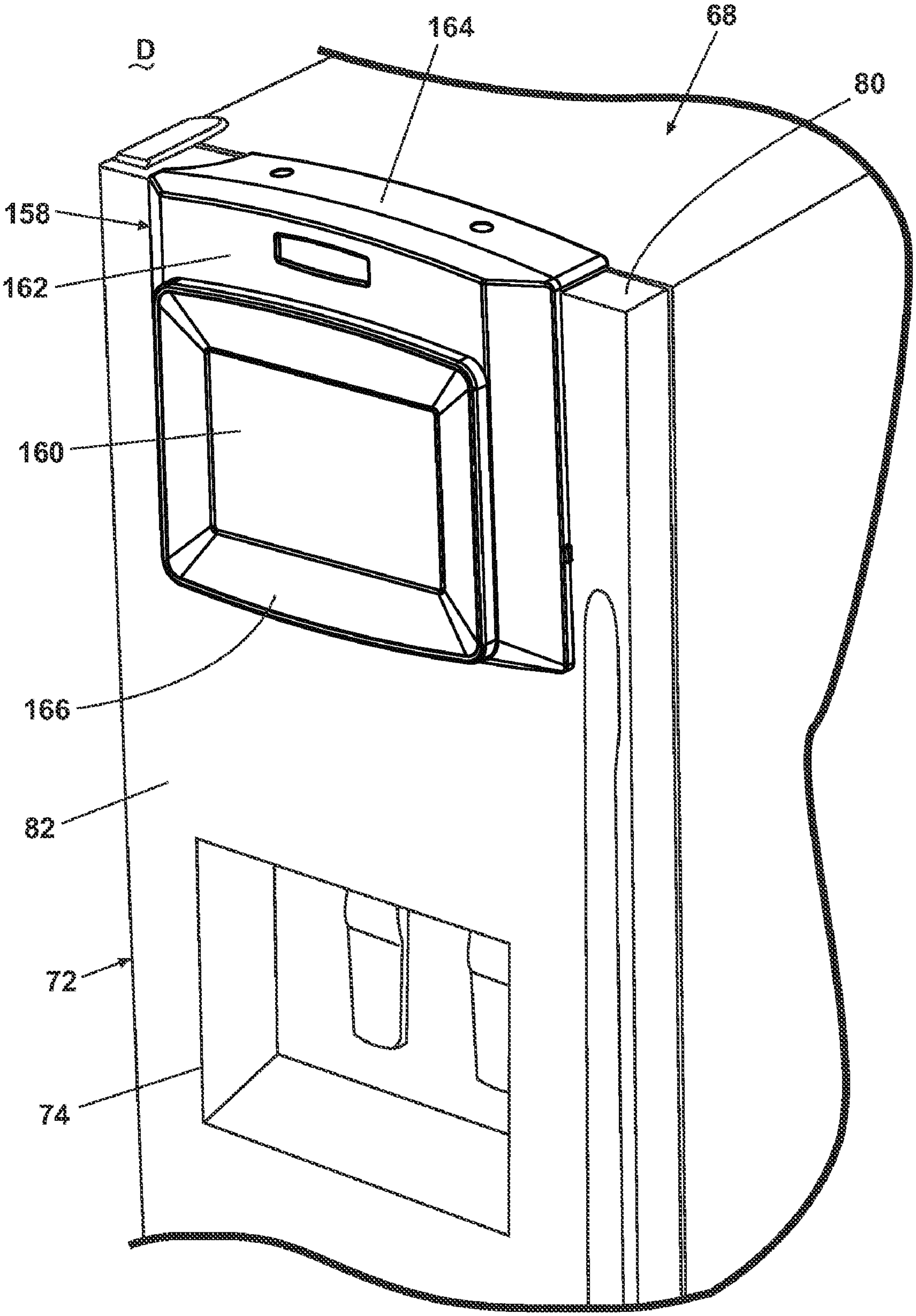
FIG. 18A is a partial perspective view of a fourth specific embodiment of a modular system, showing a refrigerator with a removable adapter and digital image display.
Figure 18B:
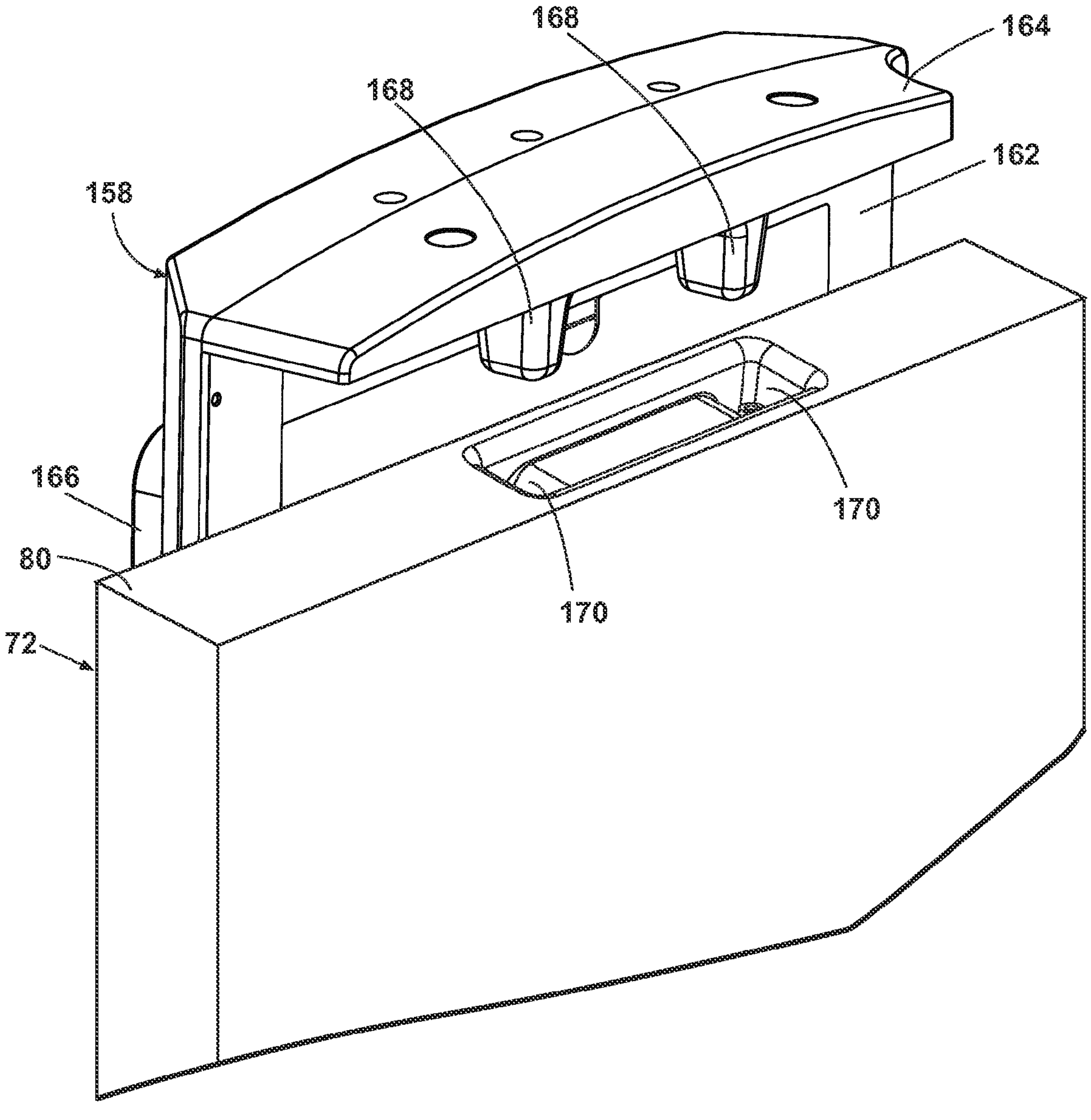
FIG. 18B is a rear perspective view of the modular system of FIG. 18A.
Figure 19:
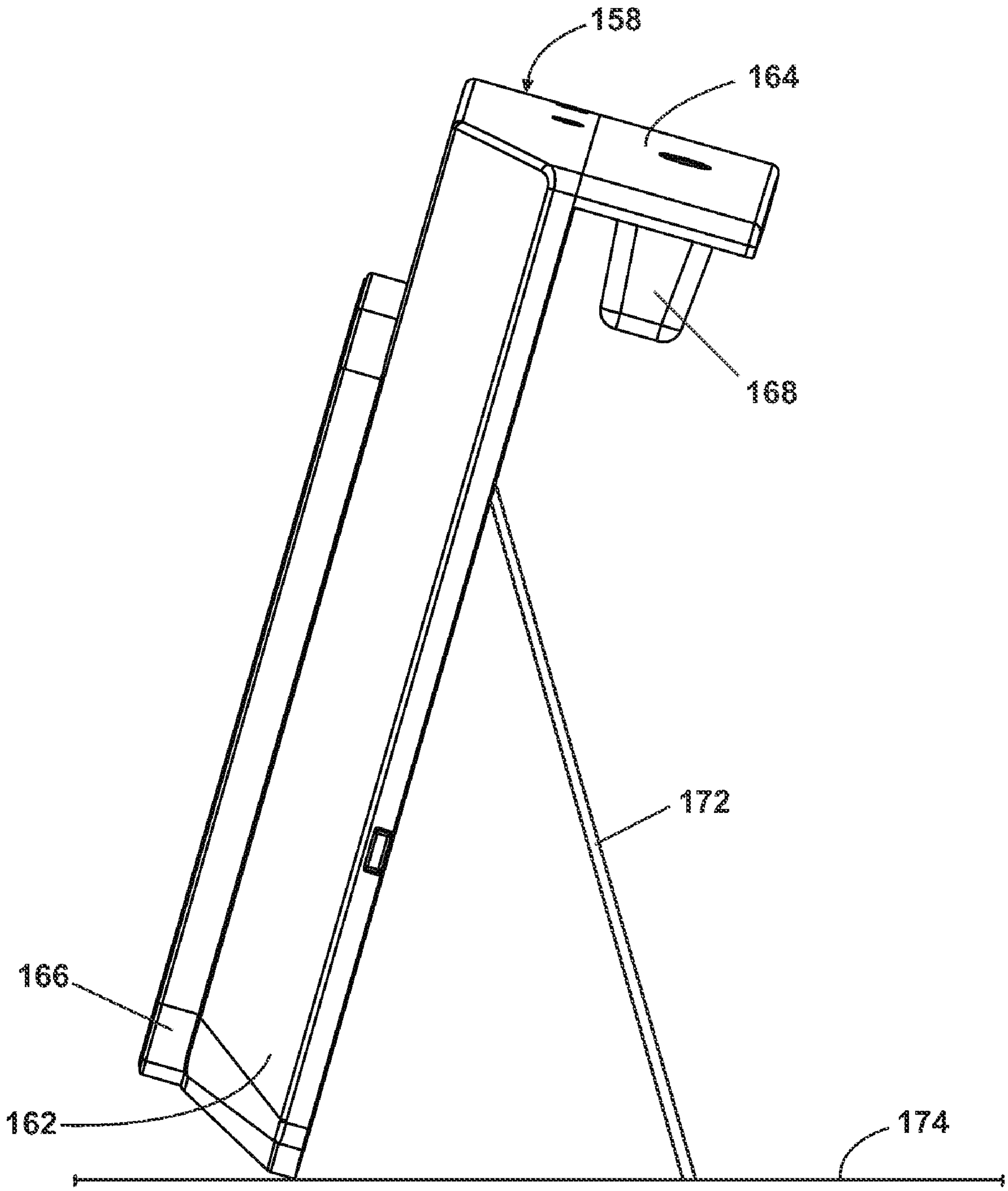
FIG. 19 is a side view of the adapter and the digital image display of FIG. 18A removed from the refrigerator and supported by a stand on a generally horizontal surface.

Referring to FIGS. 18A-19, a fourth embodiment is shown, where a modular system D comprises the refrigerator 68, an adapter 158, and a consumer electronic device in the form of a digital image display 160. The digital image display 160 is coupled to the refrigerator door 72 by the adapter 158. A similar adapter and digital image display are more fully described in U.S. patent application Ser. No. 11/619,731, now U.S. Pat. No. 7,618,295, referenced above.

The adapter 158 comprises a main body 162 depending from an upper flange 164. The main body 162 includes a frame 166 that circumscribes the digital image display 160, which sits behind the frame 166. The digital image display 160, which can display still and/or moving images, and the frame 166 together have an appearance similar to that of a conventional picture frame. The upper flange 164 rests on the top surface 80 of the door 72 and, as shown in FIG. 18B, comprises an adapter service interface that includes a pair of downwardly extending anchors 168 that are received within corresponding anchor receivers 170 forming a host service interface in the top surface 80. Together, the upper flange 164 and the anchors 168 form a mechanical coupling or hanger to hang the adapter 158 and the digital image display 160 from the door 72. Each of the anchors 168 includes an electrical connector configured to couple with a corresponding connector (also not shown) located within each of the anchor receivers 170. The connectors mate when the adapter 158 is mounted to the door 72 to establish power and data communication, as discussed in previous embodiments herein. The anchors 168 further provide a guiding function that allows proper alignment of the electrical connectors of the adapter service interface with the complementary connectors of the host service interface as the adapter 158 is mounted to the door 72.

In operation, a user mounts the adapter 158 and the digital image display 160 to the refrigerator 68 by inserting the anchors 168 into the anchor receivers 170, whereby power and data communication is established between the electrical connectors of the adapter and host service interfaces. In this configuration, the adapter 158 and the digital image display 160 hang from the refrigerator door 72, as shown in FIG. 18A.

To remove the digital image display 160 from the refrigerator 68, the user removes the anchors 168 from the anchor receivers 170, whereby the service interfaces are decoupled This process discontinues the supply of the mechanical, power, and data communication between the refrigerator 68 and the digital image display 160.

The adapter 158 further comprises the functionality of supplying a service when the adapter 158 and the digital image display 160 are not coupled with the refrigerator 68. The adapter 158 can include a stand 172, as shown in FIG. 19, to facilitate utilizing the adapter 158 and the digital image display 160 when removed from the refrigerator 68. The stand 172 on can be utilized to support the adapter 158 and the digital image display 160 on a generally horizontal surface 174 in a manner similar to supporting a conventional picture frame on a generally horizontal surface. The adapter 158 can alternately include a hook or hanger (not shown) in place of or in addition to the stand 172 to hang the adapter 158 and, optionally, the digital image display 160 on a vertical surface. For example, the anchors 168 can be modified for this purpose.

The stand 172 provides and supplies mechanical communication when the adapter 158 and the digital image display 160 are removed from the refrigerator 68. The adapter 158 can further comprise an internal power source and a data communication device (not shown) to supply and provide power communication and data communication, respectively, to the digital image display 160 when the adapter 158 and the digital image display 160 are removed from the refrigerator 68. Alternately, the digital image display 160 can alternately comprise an internal power source and a data communication device for such a purpose.

Figure 21:
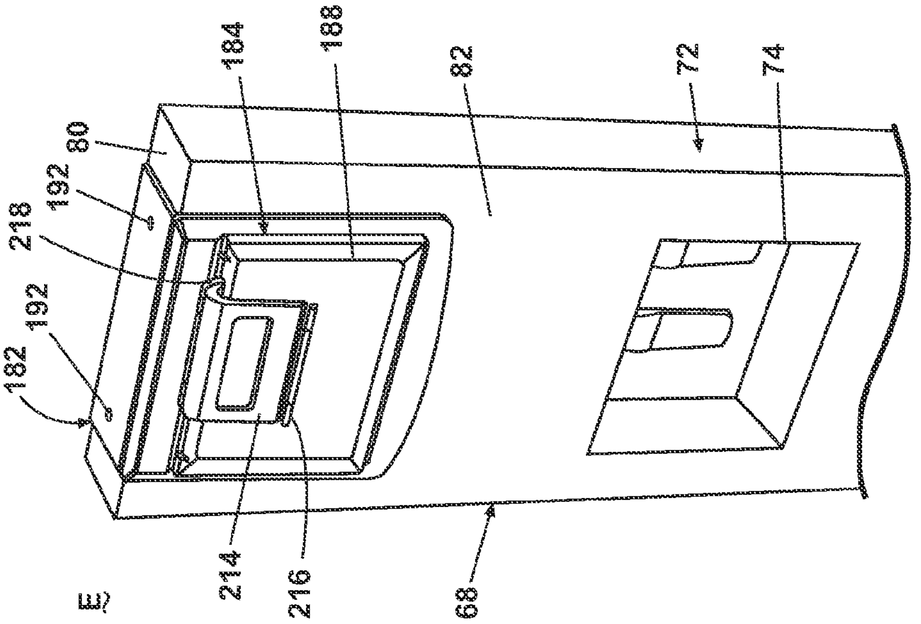
FIG. 21 is a partial perspective view of the modular system from FIG. 20, with the DVD module in a closed position.
Figure 20:
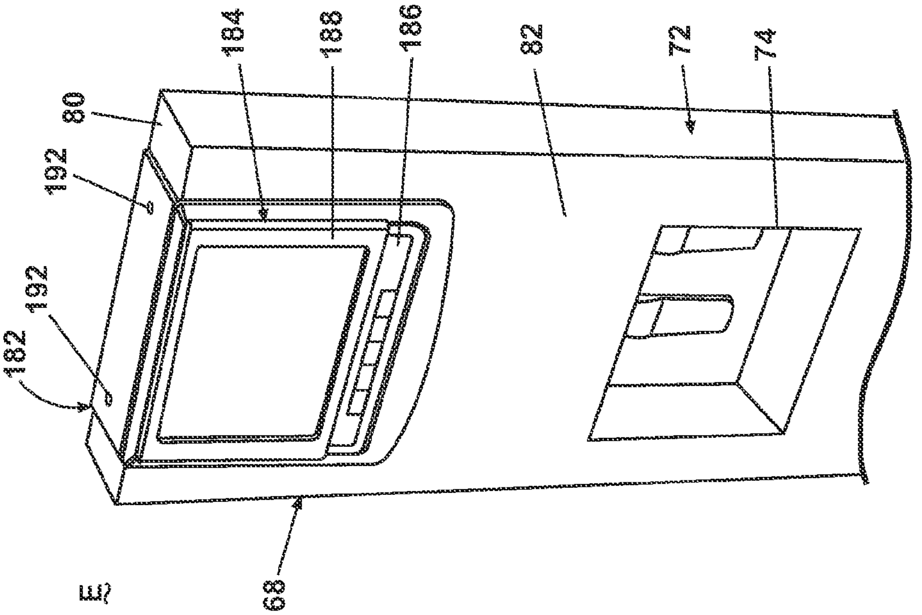
FIG. 20 is a partial perspective view of a fifth specific embodiment of a modular system, showing a refrigerator with a DVD module comprising an adapter, a video display, and a DVD player, with the DVD module in an open position.

Referring to FIGS. 20-23, a fifth embodiment is shown, where a modular system E comprises the refrigerator 68, an adapter 182, and a consumer electronic device 184, illustrated as a DVD player 186 with a video display 188. In FIGS. 20 and 21, only the relevant portion of one door 72 of the refrigerator 68 is illustrated. The adapter 182 is fixedly mounted to the refrigerator 68 and the consumer electronic device 184 is removably mounted to the adapter 182. While not shown, when the consumer electronic device 184 is mounted to the adapter 182, an electrical connection between the two is established, such that when the adapter 182 is mounted to the refrigerator 68, the adapter 182 supplies power provided by the refrigerator to the consumer electronic device 184.

Figure 23:
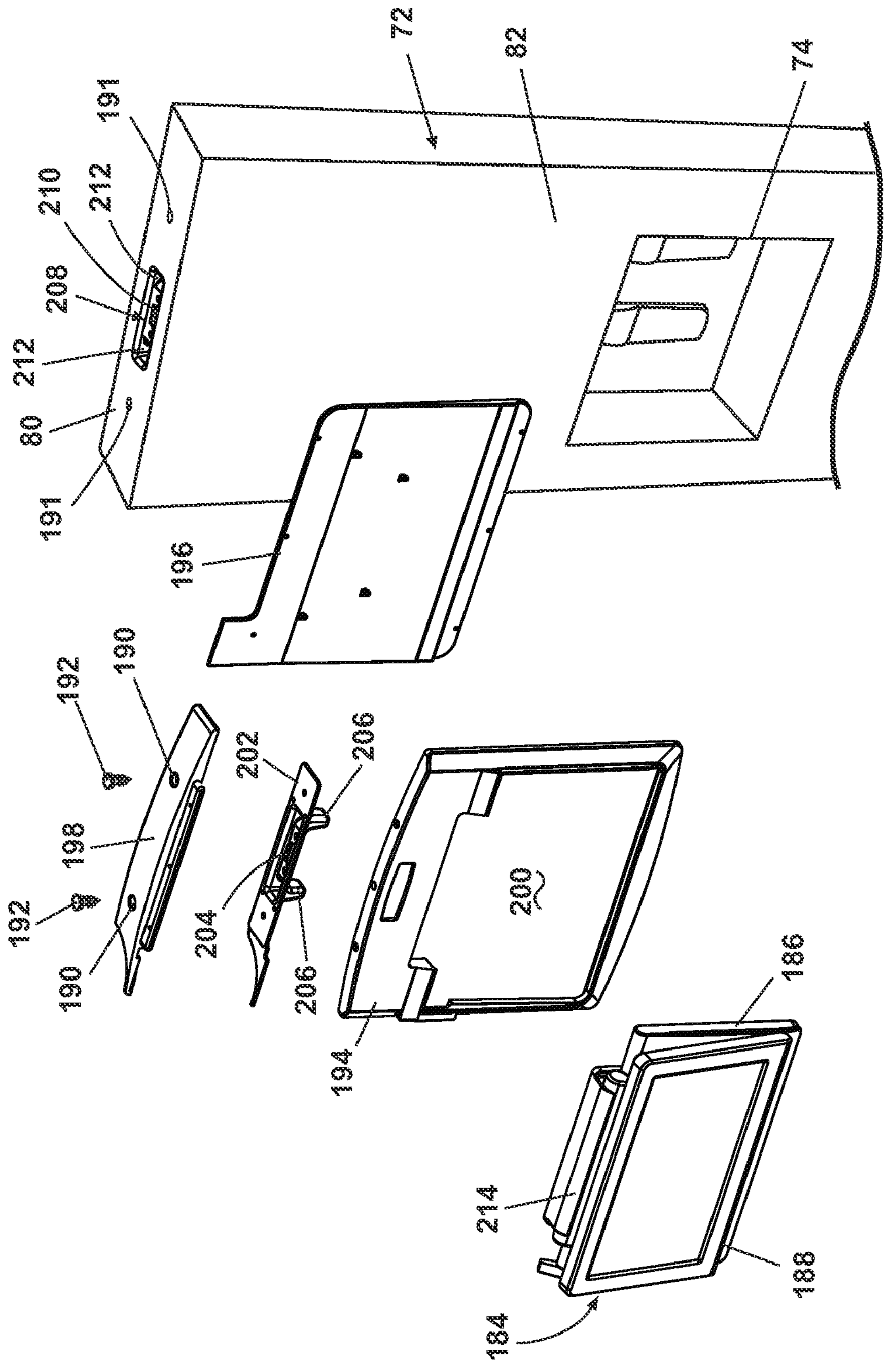
FIG. 23 is an exploded perspective view of the DVD module from FIG. 20.

Referring to FIGS. 20, 21 and 23, the adapter 182 comprises a frame 194 with a back panel 196, and a mounting bracket 198. The frame 194 comprises a central opening 200 for receiving the consumer electronic device 184. The mounting bracket 198 comprises a pair of screw hole openings 190 and a pair of associated screws 192 that are aligned with corresponding screw holes 191 formed in the top surface 80 of one of the refrigerator doors 72 and receives a pair of mounting screws 192 to physically mount the adapter 182 to the refrigerator 68. An adapter service interface 202 comprising a power plug 204 and a pair of mechanical anchors 206 depends from the mounting bracket 198.

The refrigerator comprises a host service interface 208 integrally formed in the top surface 80 of the refrigerator door 72. The host service interface 208 comprises a power socket 210 for receiving the power plug 204 and two anchor receivers 212 for receiving the mechanical anchors 206. To secure the mounting bracket 198 to the refrigerator, the mounting screws 192 are driven through the screw hole openings 190 and into corresponding screw holes 191 formed in the top surface 80 of one of the refrigerator doors 72.

The video display 188 is mounted to the DVD player 186 by a moveable bracket 214. The bracket 214 is joined to the video display 188 by a first rotating joint 216 and to the DVD player 186 by a second rotating joint 218. The video display 188 is movable between an open position, shown in FIG. 20, where the video display 188 faces away from the refrigerator 68 and is visible to the user and a closed position, shown in FIG. 21, where the video display faces towards the refrigerator 68 and is not visible to the user.

Figure 22:
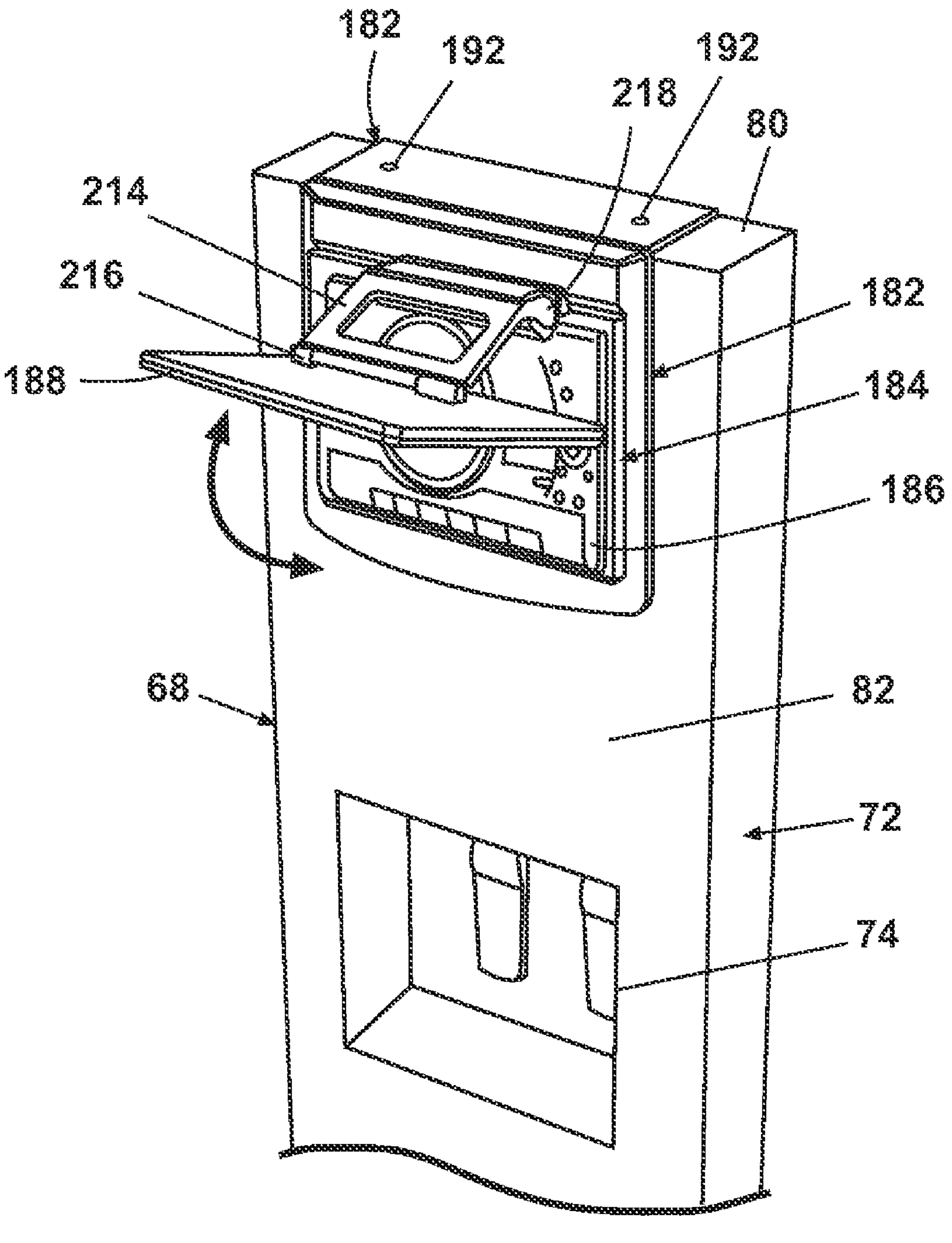
FIG. 22 is a partial perspective view of the modular system from FIG. 20, showing the movement of the DVD module between the open and closed positions.

FIG. 22 shows the video display 188 moving from the open position (FIG. 20) to the closed position (FIG. 21). Starting in the open position, where the video display 188 is in a vertical orientation with the video display 188 facing away from the refrigerator 68, the video display 188 is pivoted downwardly about the second joint 218 to move the video display 188 away from the DVD player 186, rotated about the first joint 216 so that the video display 188 faces downwards, and pivoted upwardly about the second joint 218 to move the video display 188 against the DVD player 186.

Figure 24:
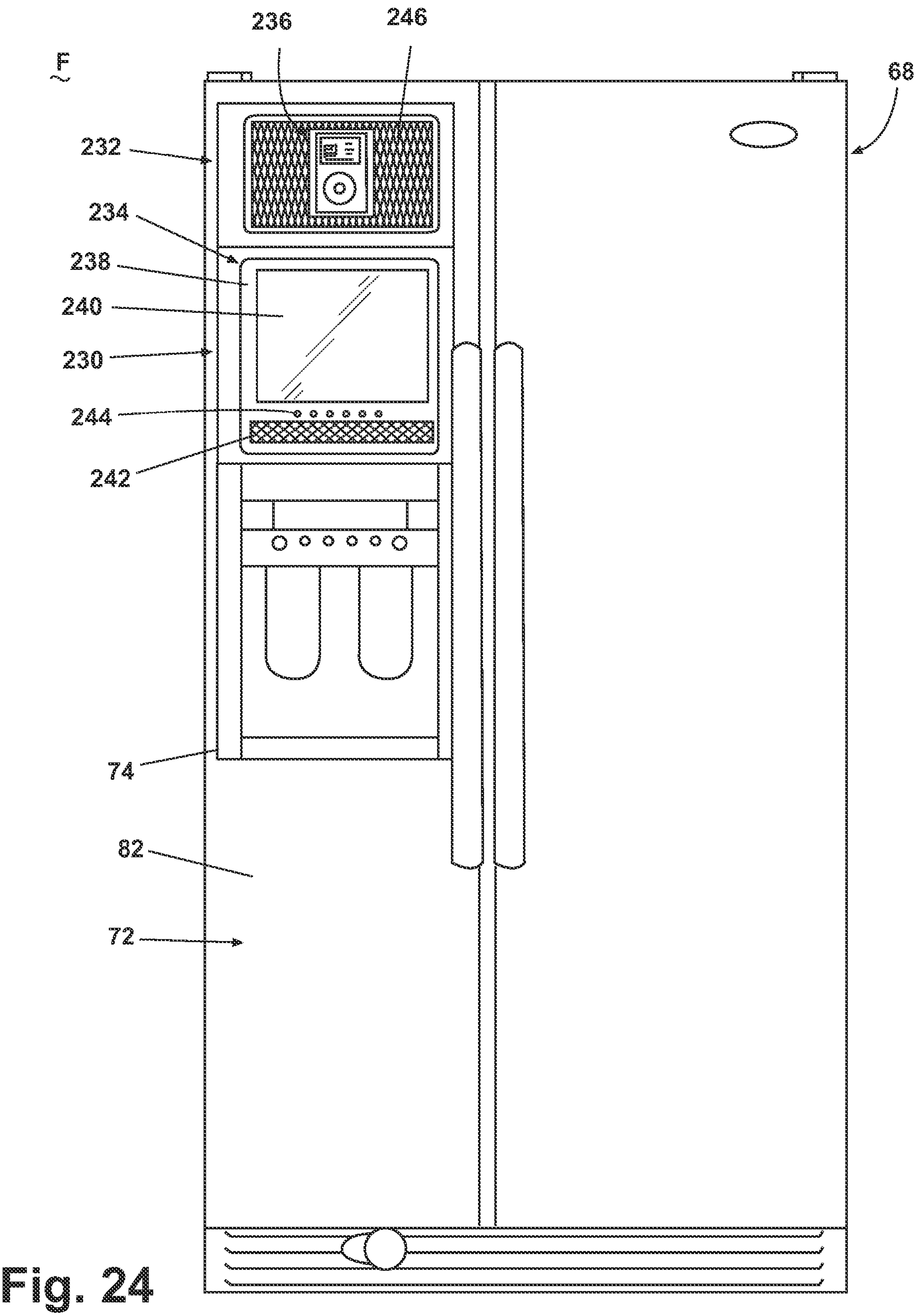
FIG. 24 is a front view of a sixth specific embodiment of a modular system, showing a refrigerator with two adapters, a television, and a digital music player.
Figure 25:
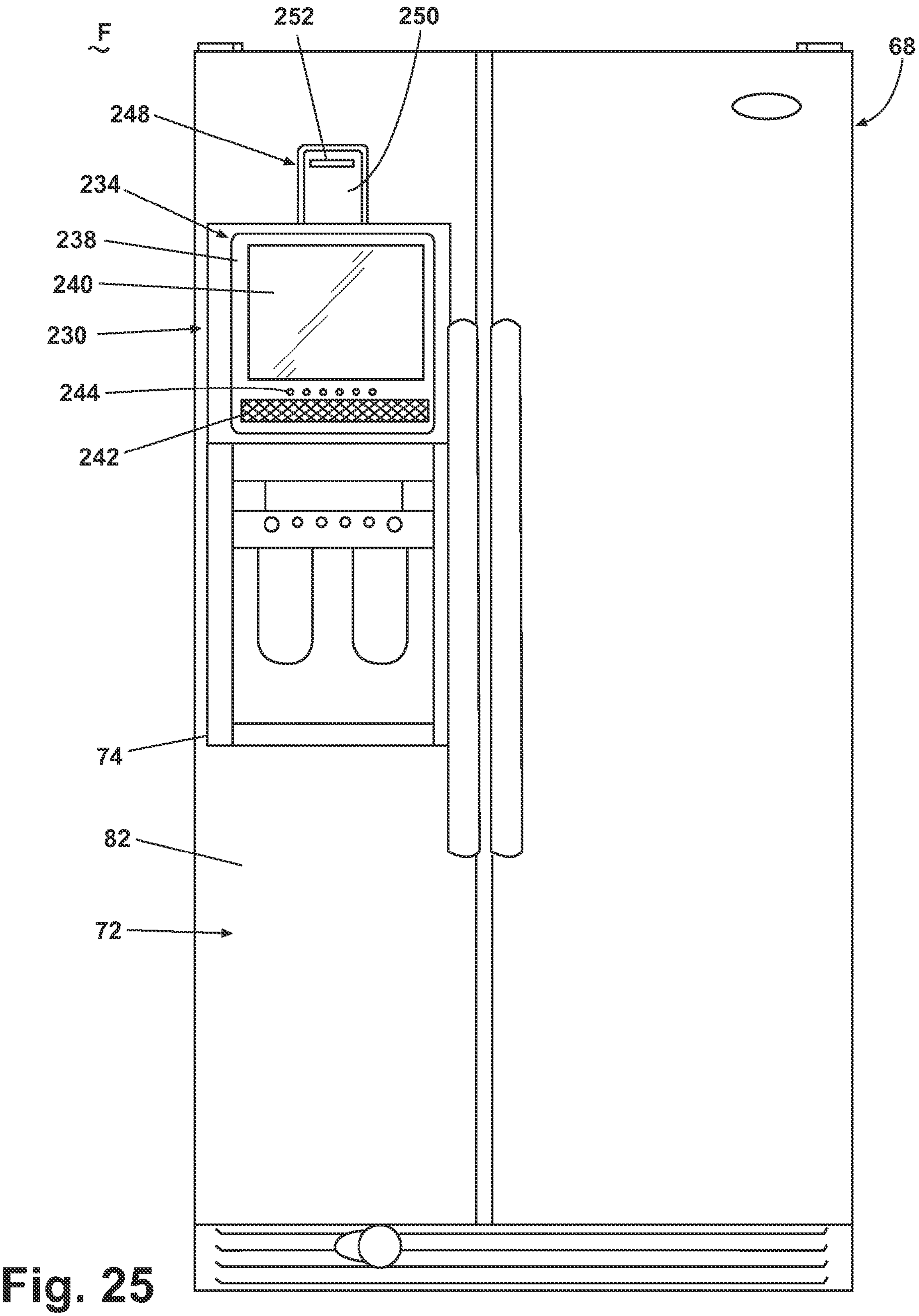
FIG. 25 is a front view of the modular system from FIG. 24, with one adapter and the digital music player removed from the refrigerator.

Referring to FIGS. 24-27, a sixth embodiment is shown, where a modular system F comprises the refrigerator 68, a first adapter 230, a second adapter 232, and two consumer electronic devices illustrated as a television 234 and a portable digital music player 236, such as an iPOD. Referring to FIGS. 24 and 25, the television 234 is affixed to the adapter 230 and comprises housing 238, a display screen 240 for viewing a television program, a speaker 242 for projecting sound from the television program, and a user interface 244 for operating the television. The digital music player 236 is removably docked within the second adapter 232, which provides the added functionality of a speaker 246 that can receive audio signals from the digital music player 236 and convert them to audible sound. In this way, the second adapter 232 provides an added functionality beyond the services and functionality provided by either the refrigerator 68 and the portable music player 236.

When mounted to the refrigerator 68, the first adapter 230 rests on top of the dispenser 74, and the second adapter 232 rests on the first adapter 230, thus providing some mechanical communication. As illustrated by FIG. 25, the modular system F can be modified by removing one of the adapters; here, the second adapter 232 for the digital music player 236 is removed.

Figure 26:
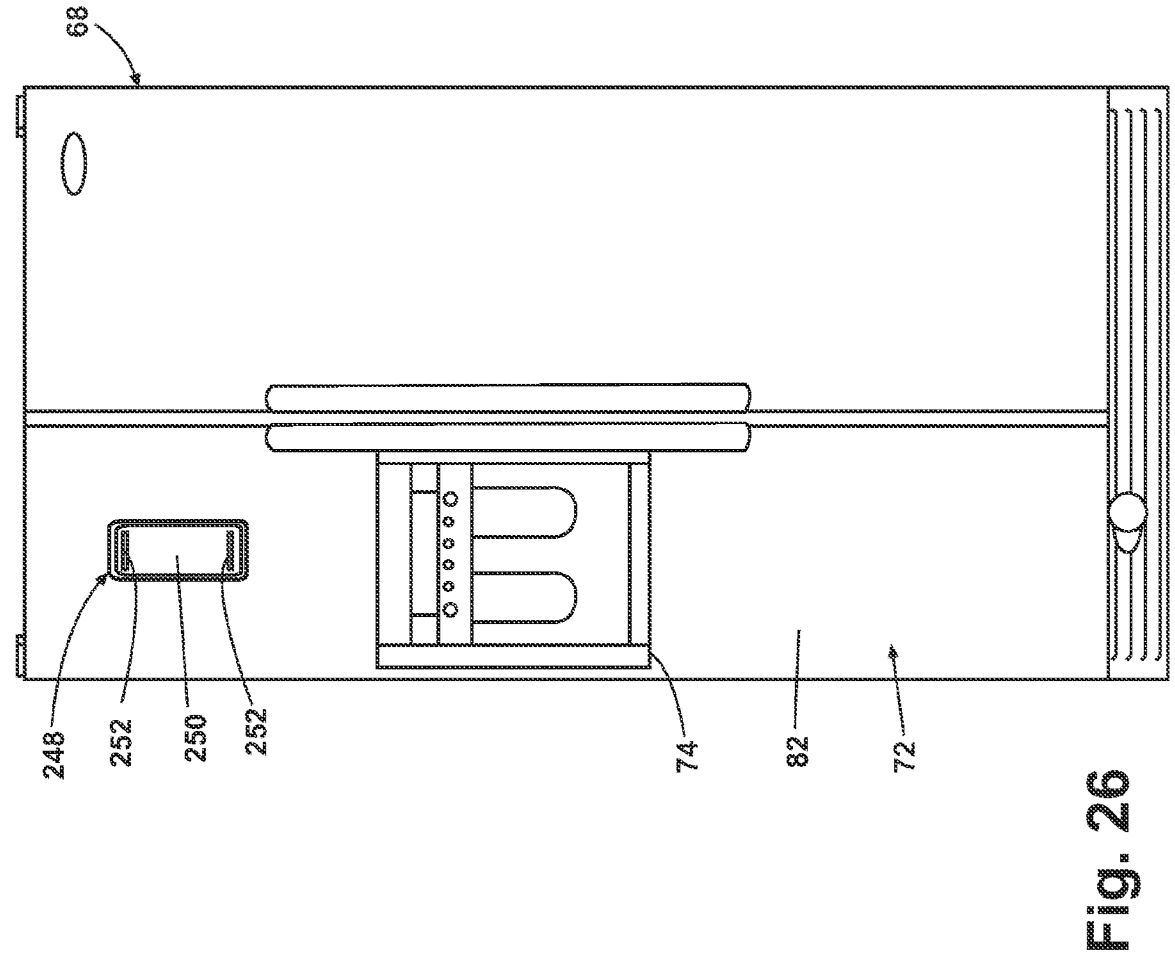
FIG. 26 is a front view of the modular system from FIG. 24, with both adapters, the television, and the digital music player removed from the refrigerator to illustrate a host service interface on the refrigerator.
Figure 27:
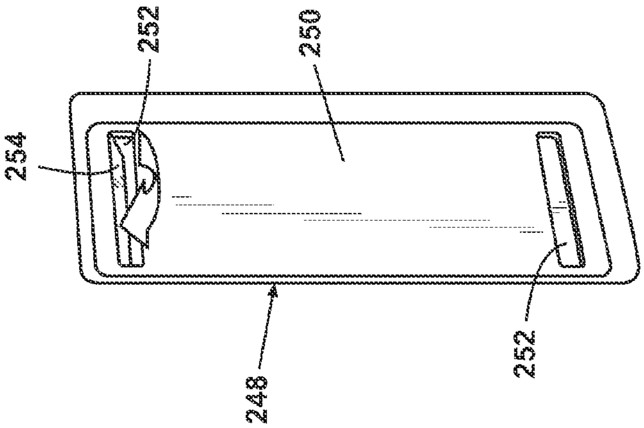
FIG. 27 is a close-up view of the host service interface shown in FIG. 26.

Referring to FIGS. 26 and 27, the refrigerator 68 is shown with the adapters 230, 232, television, 234 and digital music player 236 removed. The refrigerator 68 comprises a host service interface 248 integrally formed on the front vertical surface 82 of one of the refrigerator doors 72, and is spaced from the dispenser 74. The host service interface 248 comprises a shallow recess 250 and a pair of generally horizontal slots 252 spaced vertically with respect to one another formed in the recess 250. Each slot 252 can optionally comprise a hinged door 254, as shown on the upper slot 252 in FIG. 27, similar to the door covering a video tape slot on a VCR, to protect the slot 252 when an adapter is not attached. The slots 252 are standardized and can receive one or more standardized components on the device holders 230, 232, such as mechanical connectors (not shown). Thus the refrigerator 68 can provide the service of mechanical communication, which is supplied to the television 234 and the digital music player 236 by their respective device holders 230, 232. While not shown, the slots 252 could also be provided with power and data connectors for providing power and data communication.

Figure 28A:
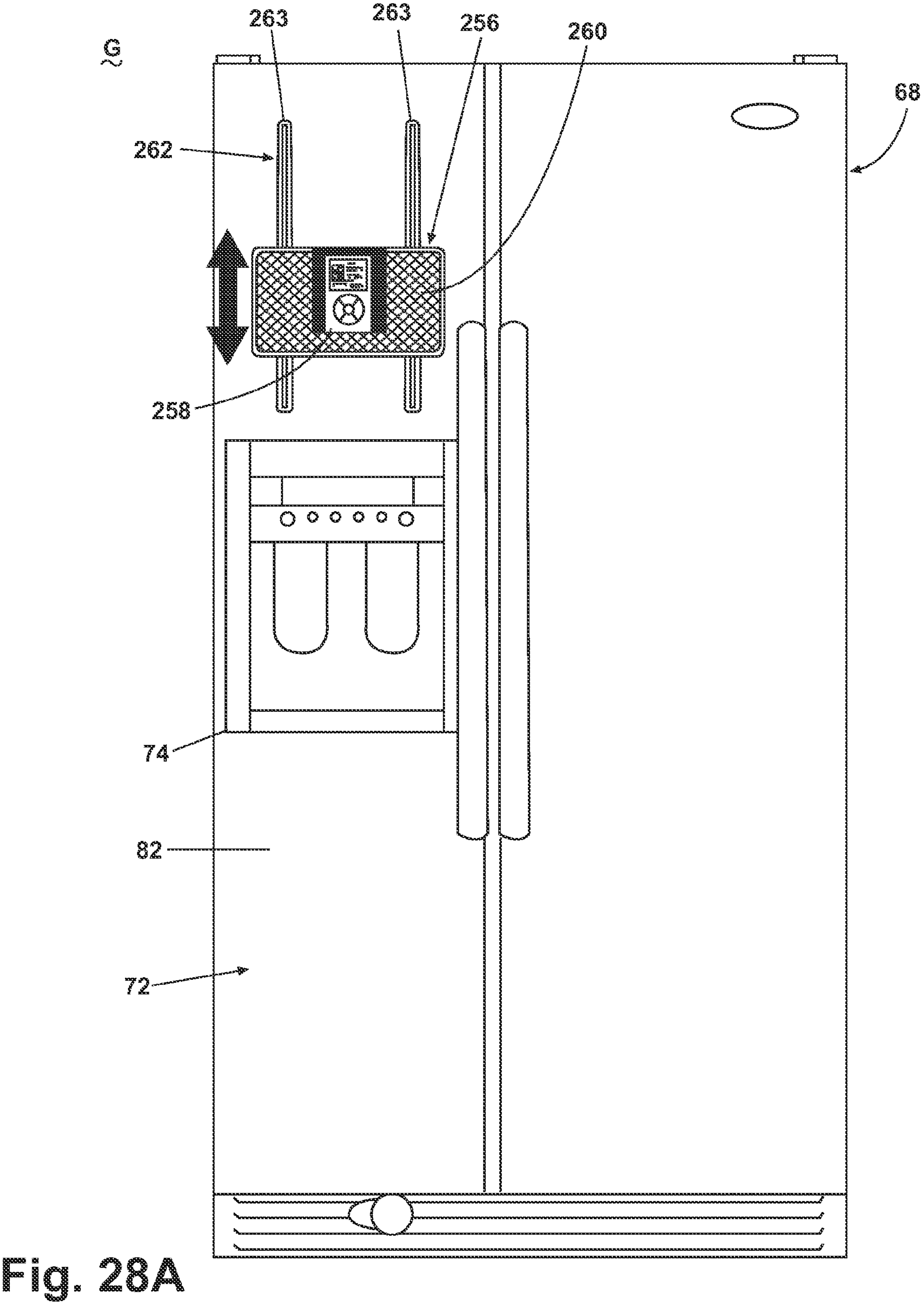
FIG. 28A is a front view of a seventh specific embodiment of a modular system, showing a refrigerator with a host service interface, an adapter and a digital music player.
Figure 28B:
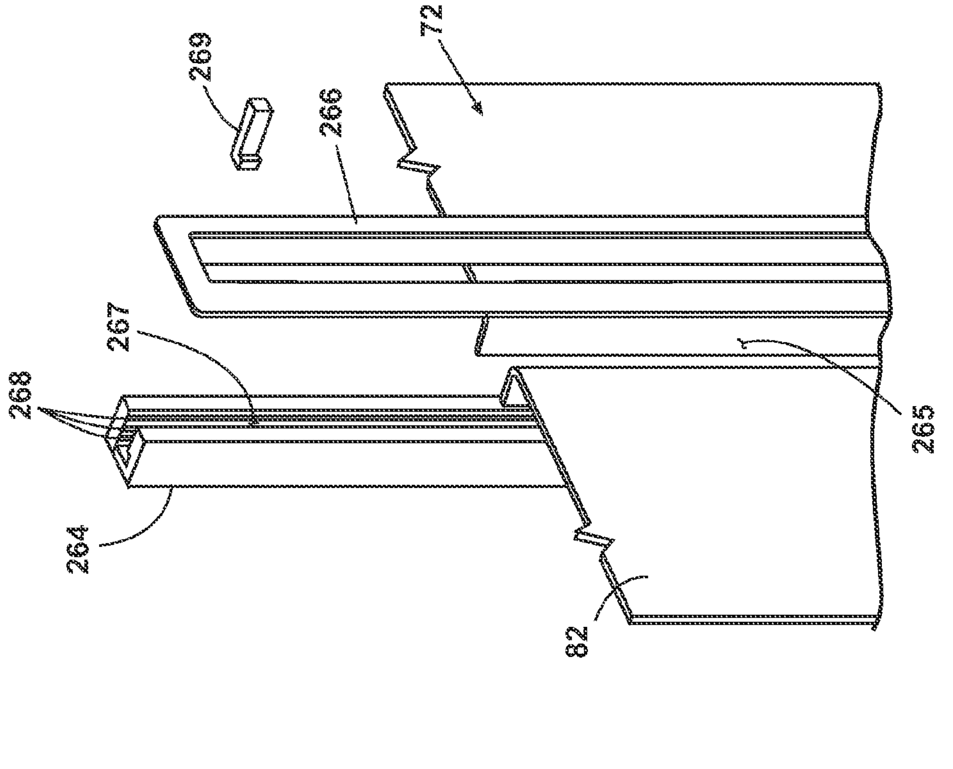
FIG. 28B is an exploded view of the host service interface from FIG. 28A.

Referring to FIGS. 28A and 28B, a seventh embodiment is shown, where a modular system G comprises the refrigerator 68, an adapter illustrated as a device holder 256 and a consumer electronic device illustrated as a portable digital music player 258, such as an iPOD. The digital music player 258 is removably docked within the device holder 256, which has the added functionality of a speaker 260 that can receive audio signals from the digital music player 258 and converts them to audible sound.

The refrigerator 68 comprises a host service interface 262 integrally formed on the front surface 82 of the refrigerator door 72.

The host service interface 262 comprises a pair of vertically-disposed spaced slot assemblies 263. Referring to FIG. 28B, each slot assembly 263 comprises a rail 264 attached to the interior of the door 72. The rail 264 is accessible through a slot 265 in an outer panel of the refrigerator door 72 covered by a trim piece 266 providing an aesthetically pleasing finish to the slot assembly 263. The rail 264 comprises a somewhat C-shaped channel member having an open channelway 267. The channelway 267 can be provided with contract strips 268 extending the length of the rail 264 for providing power and data services to the consumer electronic devices. Three contact strips 268 are illustrated. However, a greater or lesser number can be provided depending upon the services required by the consumer electronic device.

The channelways 267 can receive at least one corresponding connector 269 provided on the rear surface of the device holder 256, although for convenience, the device holder 256 is not shown in FIG. 28B. The connector 269 can be configured with electrical contacts (not shown) so that power and/or data communication is established through contact strips 268 upon alignment of the connector 268 with the channelway 267. The connectors 269 can further be moved along the channelways 267 to adjust the device holder 256, and thus the digital music player 258, to any desired vertically height, as indicated by the arrow on FIG. 28A. Thus, the refrigerator 68 provides the service of mechanical communication, which is supplied to the digital music player 258 by the device holder 256.

Figure 29:
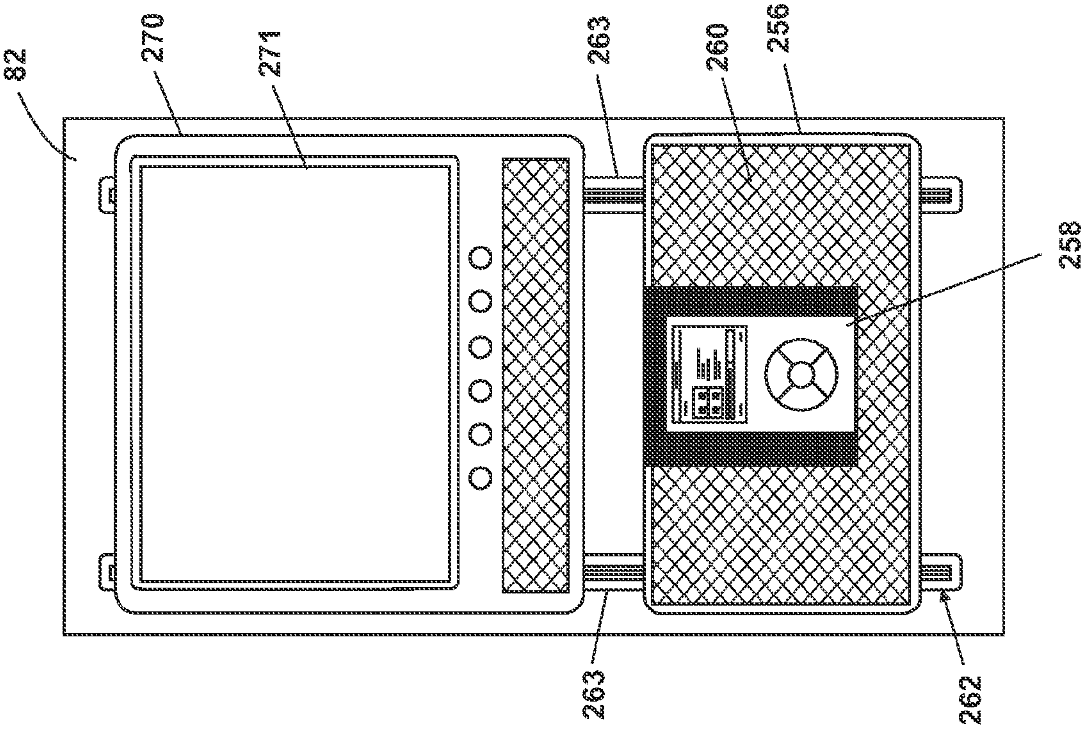
FIG. 29 is a close-up front view of the modular system from FIG. 28A, showing the addition of a second adapter and a television to the modular system.

Depending on the position of the device holder 256, a second adapter and consumer electronic device can be fixed to the host service interface 264, above or below the device holder 256. Referring to FIG. 29, a second device holder 270 and consumer electronic device 271 is shown added to the modular system H. As shown, the second device holder 270 is mounted to the host service interface 262 above the first device holder 256. Alternately, the second device holder 268 can be mounted below the first device holder 256.

Figure 30:
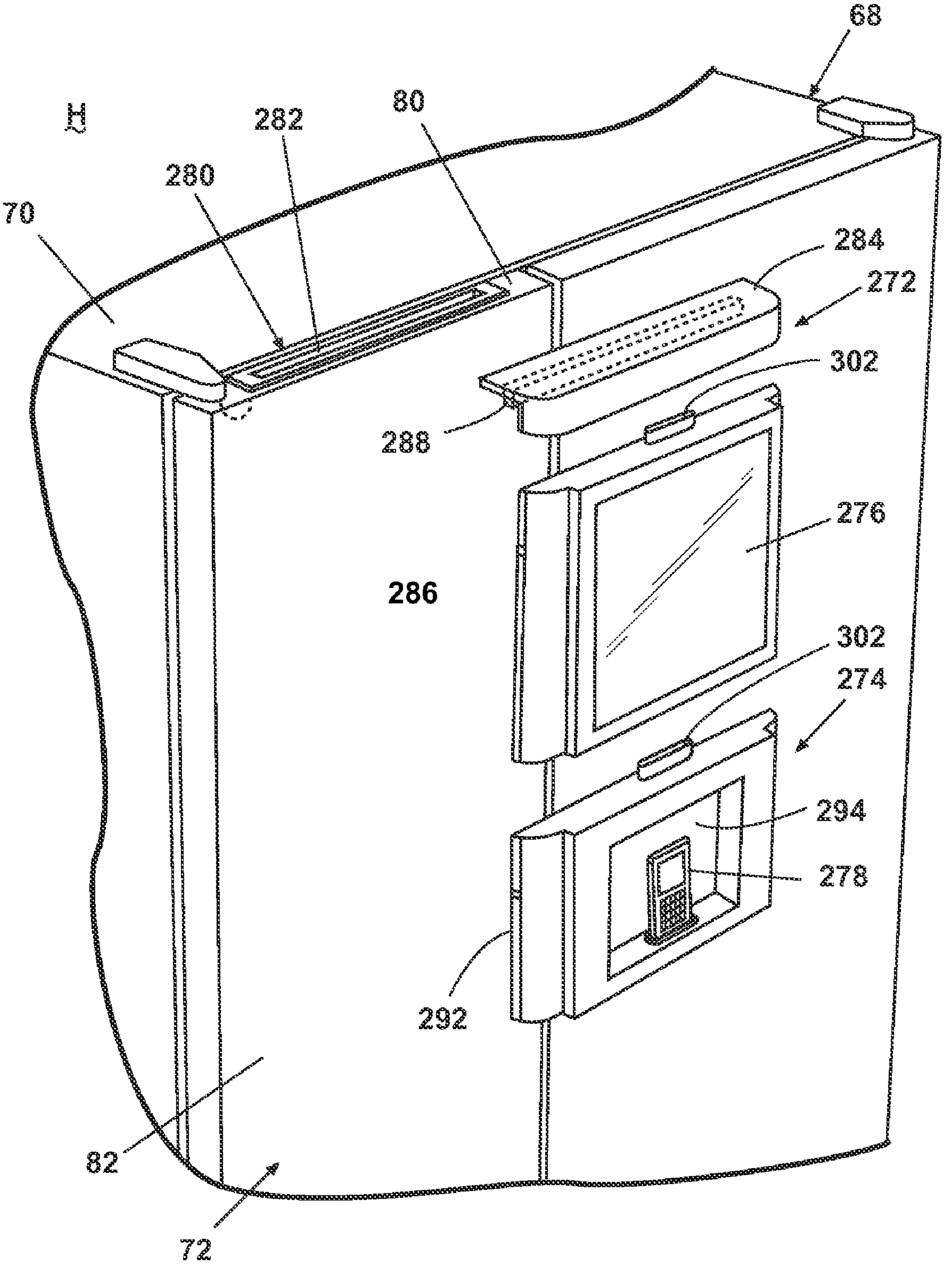
FIG. 30 is an exploded perspective view of an eighth specific embodiment of a modular system, showing a refrigerator, two adapters, a video display, and a personal digital assistant.
Figure 31:
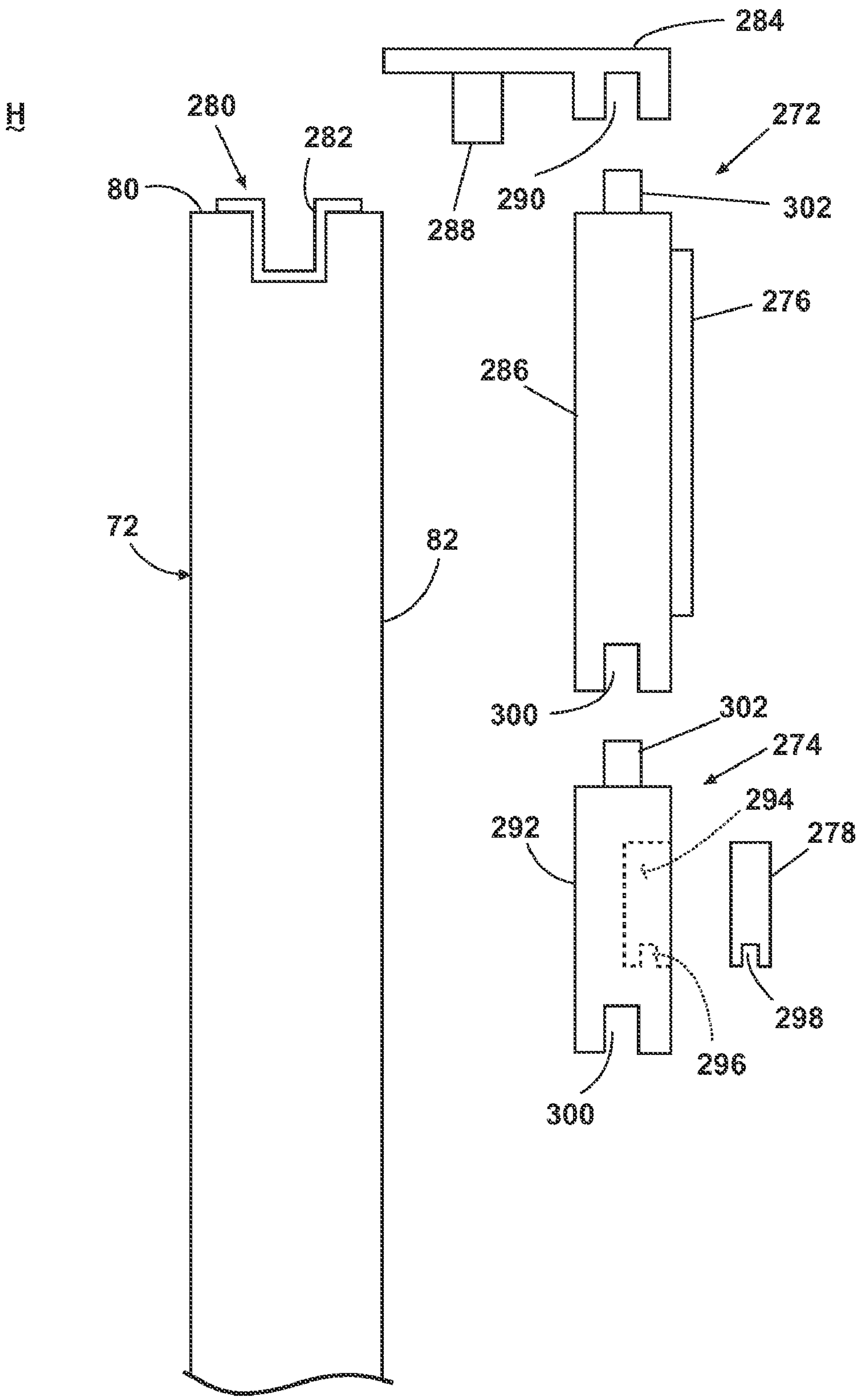
FIG. 31 is a schematic illustration of the connections between the modular system shown in FIG. 30.

FIGS. 30 and 31, show an eighth embodiment illustrating "ganged" or "stacked" adapters that are sequentially connected to each other to supply at least one service to all of the adapters from one of the host and the consumer electronic device. More specifically, FIGS. 30 and 31 disclose a modular system H that comprises the refrigerator 68, a first adapter 272, a second adapter 274, a first consumer electronic device illustrated as a video display 276, and a second consumer electronic device illustrated as a personal digital assistant (referred to hereinafter as "PDA") 278, such as a Blackberry or a Palm. The refrigerator 68 comprises a host service interface 280 formed in the top surface 80 of one of the refrigerator doors 72. The host service interface 280 comprises an elongated socket 282 providing mechanical, power, and data communication, which is supplied to the video display 276 and the PDA 278 by the adapters 272 and 274.

The first adapter 272 comprises an extender 284 and a first device holder 286 for supporting the video display 276. The extender 284 comprises a plug 288 that is received within the socket 282 to mount the extender 284 to top surface 76 of the refrigerator door 72. The extender 284 further comprises a female connector 290 that is positioned adjacent the front vertical surface 82 of the refrigerator door 72 when the extender 284 is mounted to the refrigerator 68.

The second adapter 274 comprises a second device holder 292 having an open cavity 294 with an adapter service interface 296 for removably docking the PDA 278. The PDA 278 is provided with a device service interface 298 that is compatible with the adapter service interface 296. The device service interface 298 is physically coupled with the adapter service interface 296 to establish a connection between the second device holder 292 and the PDA 278.

The first device holder 282 and second device holder 284 each comprise a female adapter connector 300 and a male adapter connector 302. The connectors 300, 302 are standardized so that either device holder 286, 292 can be coupled with the extender 284 by plugging either male adapter connector 302 into the female adapter connector 290 of the extender 280. As illustrated, the male adapter connector 302 of the first device holder 286 is plugged into the female connector 290 to couple the first device holder 286 with the extender 284, and the male adapter connector 302 of the second device holder 292 is plugged into the female adapter connector 300 of the first device holder 286 to couple the second device holder 292 with the first device holder 286. Modular system H can be easily expanded to include other consumer electronic devices by adding additional device holders having the same standardized connectors as the first and second device holders 286, 292.

In the ganged arrangement of embodiment H, the adapters 272, 274 can supply at least one of the services provided by the refrigerator 68 to each other, without the need for each adapter to directly couple to the host service interface 280. This provides for great flexibility in the expansion of modular system H as needed.

Figure 32:
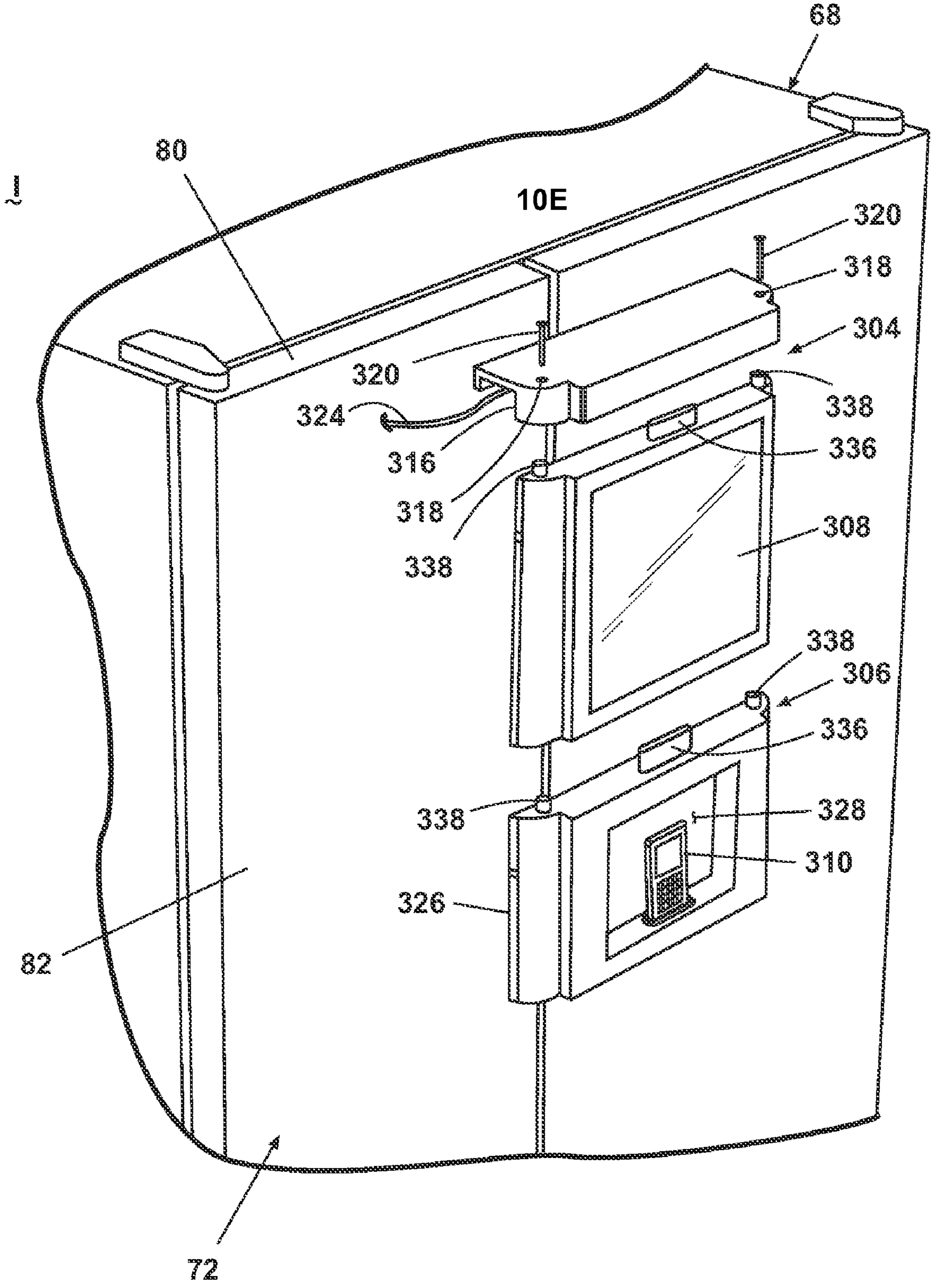
FIG. 32 is an exploded perspective view of a ninth specific embodiment of a modular system, showing a refrigerator, two adapters, a video display, and a personal digital assistant.
Figure 33:
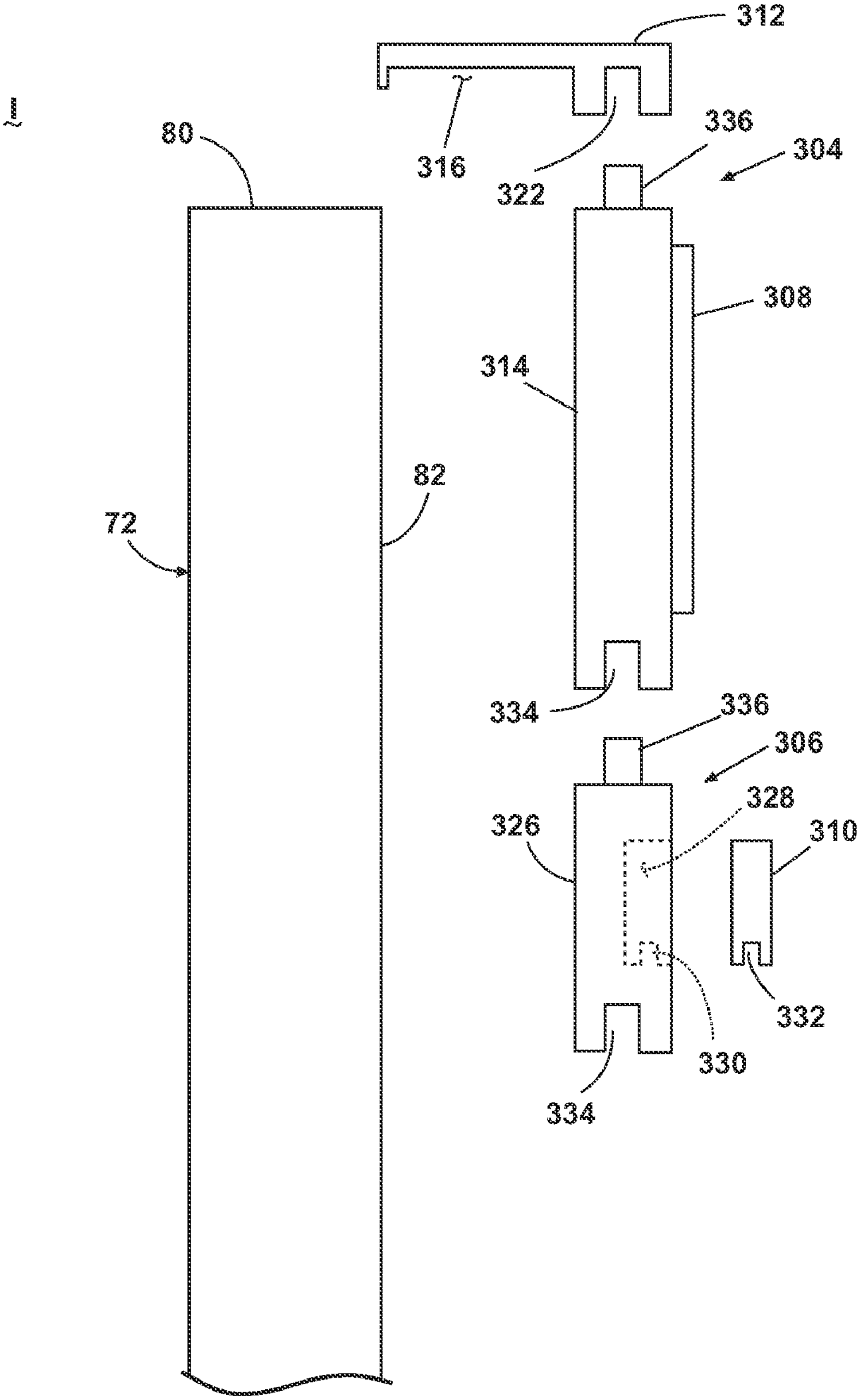
FIG. 33 is a schematic illustration of the connections between the modular system shown in FIG. 32.

Referring to FIGS. 32 and 33, a ninth embodiment is shown, where a modular system I comprises the refrigerator 68, a first adapter 304, a second adapter 306, a first consumer electronic device illustrated as a video display 308 and a second consumer electronic device illustrated as a PDA 310. In this embodiment, the refrigerator 68 does not comprise a host service interface. Therefore, modular system I can be added onto virtually any refrigerator.

The first adapter 304 comprises an extender 312 and a first device holder 314 supporting the video display 308. The extender 312 comprises a downwardly facing mounting recess 316, a pair of screw hole openings 318 and associated screws 320, a female connector 322, and a pair of anchor receivers (not shown). The extender 312 is mounted to the refrigerator door 72 by fitting the mounting recess 316 over the top surface 76 and securing it by driving the screws 320 through the screw hole openings 318 and into the refrigerator door 72. The extender 312 further comprises the necessary electrical components, indicated by a wire 324 that terminates in the female connector 322, to supply the video display 308 and the PDA 310 with electrical power and/or data.

The second adapter 306 comprises a second device holder 326 having an open cavity 328 with an adapter service interface 330 for removably docking the PDA 310. The PDA 310 is provided with a device service interface 332 that is compatible with the adapter service interface 330. The device service interface 332 is physically coupled with the adapter service interface 330 to establish a connection between the second device holder 326 and the PDA 310.

The first and second device holders 314, 326 each comprise a female adapter connector 334 and a male adapter connector 336. The connectors 334, 336 are standardized so that either device holder 314, 326 can be coupled with the extender 312 by plugging either male adapter connector 336 into the female connector 322. As illustrated, the male adapter connector 336 of the first device holder 314 is plugged into the female connector 322 to couple the first device holder 314 with the extender 312, and the male adapter connector 336 of the second device holder 326 is plugged into the female adapter connector 334 of the first device holder 314 to couple the second device holder 326 with the first device holder 314. Modular system I can be easily expanded to include other consumer electronic devices by adding additional device holders having the same standardized connectors as the first and second device holders 314, 326.

The first and second device holders 314, 326 each further comprise a pair of standardized mechanical anchors 338. The first and second device holders 314, 326 and the extender 312 further each comprise a pair of complementary standardized anchor receivers (not shown) for removably receiving the mechanical anchors 338. Since they are standardized, any of the anchor receivers can receive any one of the mechanical anchors 338.

Figure 34:
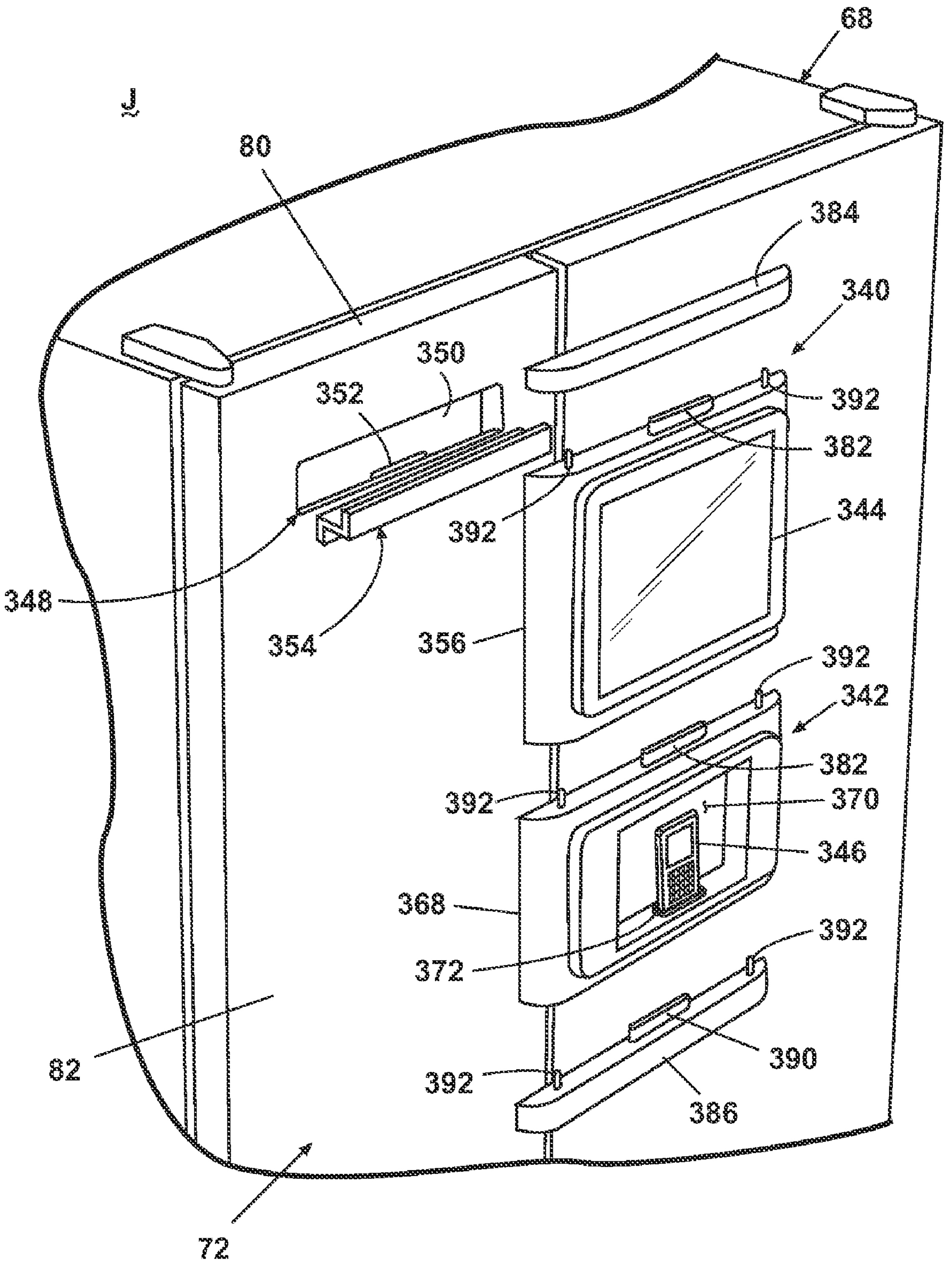
FIG. 34 is an exploded perspective view of a tenth specific embodiment of a modular system, showing a refrigerator, two adapters, a video display, and a personal digital assistant.
Figure 35:
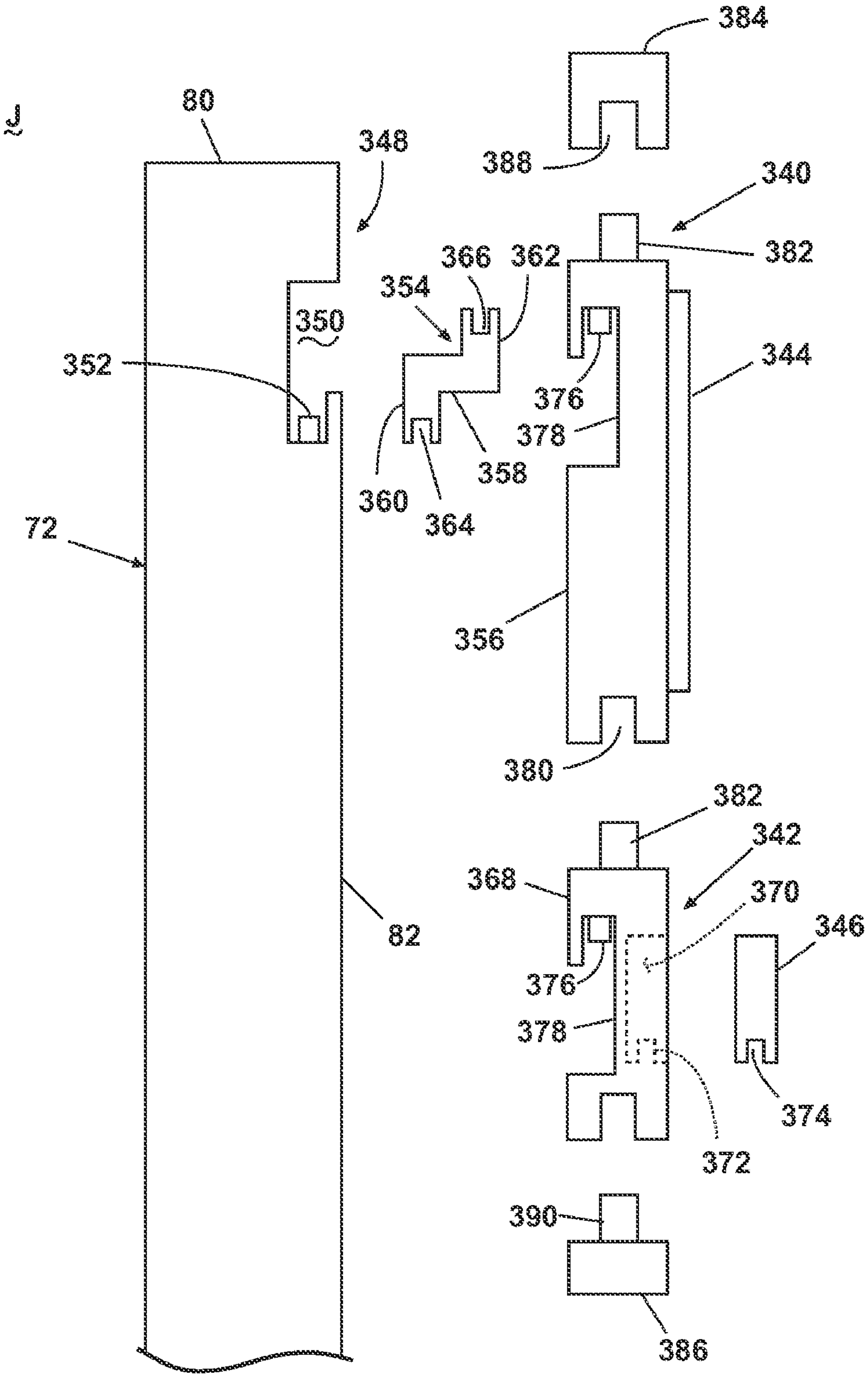
FIG. 35 is a schematic illustration of the connections between the modular system shown in FIG. 34.

Referring to FIGS. 34 and 35, an tenth embodiment is shown, where a modular system J comprises the refrigerator 68, a first adapter 340, a second adapter 342, a first consumer electronic device illustrated as a video display 344 and a second consumer electronic device illustrated as a PDA 346.

The refrigerator 68 comprises a host service interface 348 integrally formed on the front vertical surface 82 of one of the refrigerator doors 72. The host service interface 348 comprises a generally horizontal slot 350 having an male connector 352 formed within the slot 350. The male connector 352 provides power communication, and the slot 350 and male connector 352 together provides mechanical communication, to the video display 344 and PDA 346.

The first adapter 340 comprises an extender 354 and a first device holder 356 supporting the video display 344. The extender 354 comprises a bracket 358 having a first end 360 bent at a right angle to the bracket 358 and a second end 362 also bent at a right angle to the bracket 358, but in opposed relation to the first end 360. The first end 360 comprises a first female connector 364 for coupling with the male connector 352 and the second end comprises a second female connector 366 for coupling with a device holder.

The second adapter 342 comprises a second device holder 368 having an open cavity 370 with an adapter service interface 372 for removably docking the PDA 346. The PDA 346 is provided with a device service interface 374 that is compatible with the adapter service interface 372. The device service interface 374 is physically coupled with the adapter service interface 372 to establish a connection between the second device holder 368 and the PDA 346.

The first and second device holders 356, 368 each comprise a standardized adapter service interface 376 for coupling with the second female connector 366 on the extender 354. The adapter service interfaces 376 are standardized so that either device holder 356, 368 can be coupled with the extender 354. As illustrated, the adapter service interface 376 of the first device holder 356 is coupled with the second female connector 366, and the adapter service interface 376 of the second device holder 368 is not coupled with anything. Each adapter service interface 376 is provided within a recess 378 on the back surface of the first and second adapters 356, 368, so that the adapters 256, 268 will lie flush against the front vertical surface 82 when coupled with the extender 354.

The first and second device holders 356, 368 further each comprise a female adapter connector 380 and a male adapter connector 382. The connectors 380, 382 are used to couple the device holders 356, 368 to each other and to establish power communication between the two. The connectors 380, 382 are standardized so that the female adapter connector 380 of either device holder 356, 368 can be plugged into the male adapter connector 382 of the other device holder 356, 368. As illustrated, the male adapter connector 382 of the second device holder 368 is plugged into the female adapter connector 380 of the first device holder 356.

Modular system J further comprises a detachable top end cap 384 and a detachable bottom end cap 386 for the device holders 356, 368. The end caps 384, 386 provide the modular system J with a finished appearance by covering any used connectors, and further protect unused connectors from damage. The top end cap 384 is further provided with a dummy connector 388 for receiving one of the male adapter connectors 382 and the bottom end cap 386 is further provided with a dummy connector 390 for receiving one of the female adapter connectors 382. As illustrated, the dummy connector 388 of the top end cap 384 is plugged into the male adapter connector 382 of the first device holder 356 and the dummy connector 390 of the bottom end cap 386 is plugged into the female adapter connector 382 of the second device holder 368. Modular system J can be easily expanded to include other consumer electronic devices by removing the bottom end cap 386 and adding additional device holders having the same standardized connectors as the first and second device holders 356, 368.

The first and second device holders 356, 368 and the bottom end cap 386 are further provided with locator pegs 392 that are received in corresponding slots (not shown) on the first and second device holders 356, 368 and the top end cap 384. The pegs 392 properly align the device holders 356, 368 and the end caps 384, 386 as they are being coupled together so that smooth connections can be made between the connectors while preventing damage to the electrical elements of the connectors.

Figure 36:
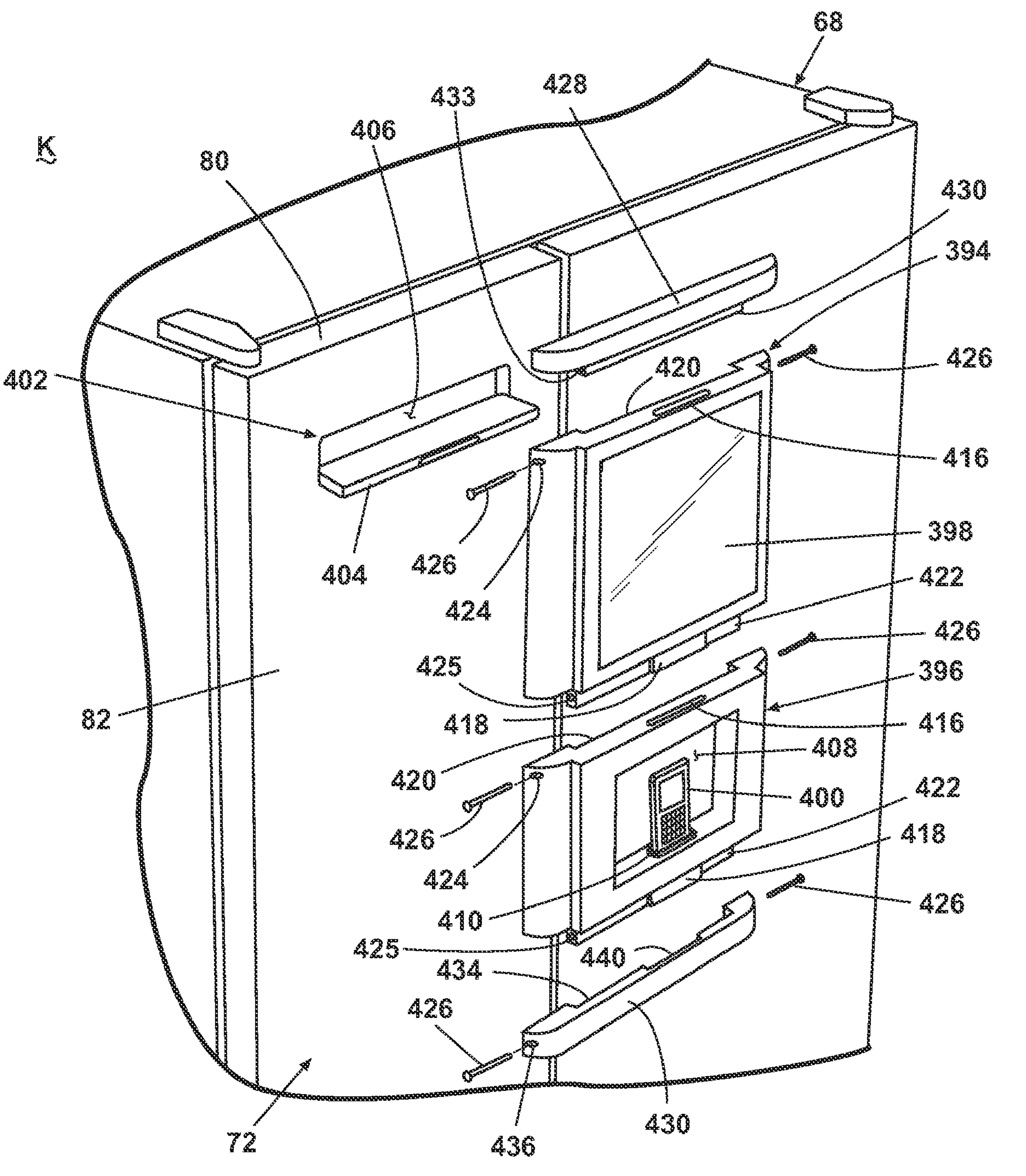
FIG. 36 is an exploded perspective view of an eleventh specific embodiment of a modular system, showing a refrigerator, two adapters, a video display, and a personal digital assistant.
Figure 37:
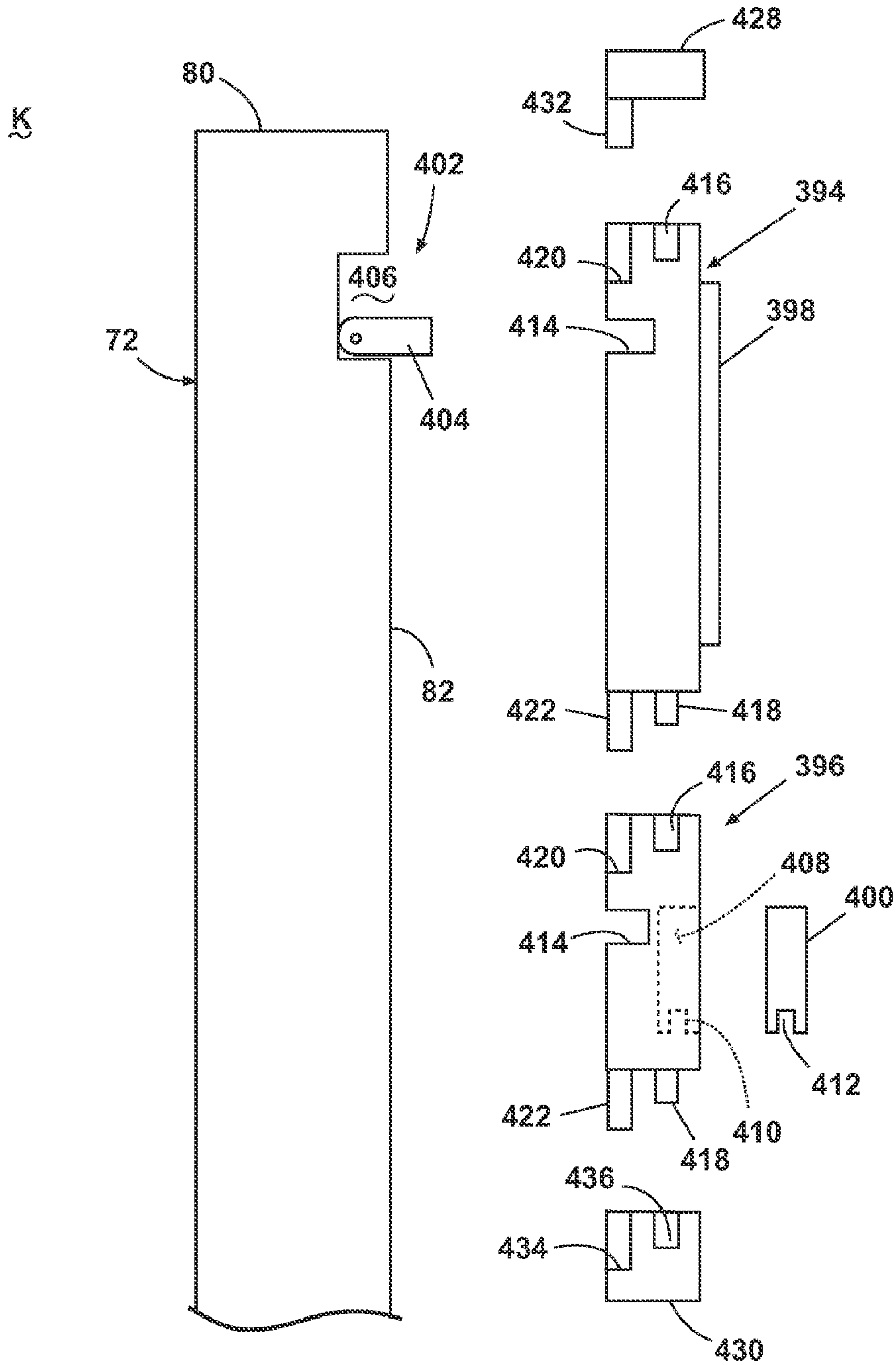
FIG. 37 is a schematic illustration of the connections between the modular system shown in FIG. 36.

Referring to FIGS. 36 and 37, an eleventh embodiment is shown, where a modular system K comprises the refrigerator 68, a first adapter 394, a second adapter 396, a first consumer electronic device illustrated as a video display 398 and a second consumer electronic device illustrated as a PDA 400. The refrigerator 68 comprises a host service interface 402 integrally formed on the front vertical surface 82 of one of the refrigerator doors 72. The host service interface 402 comprises a pivoting connector 404 that is received within a corresponding recess 406 such that the connector 404 is flush with the front vertical surface 82 when the host service interface 402 is not in use. The connector 404 can provide mechanical, power, and data communication when coupled with an adapter or consumer electronic device.

The second adapter 396 comprises an open cavity 408 with an adapter service interface 410 for removably docking the PDA 400. The PDA 400 is provided with a device service interface 412 that is compatible with the adapter service interface 410. The device service interface 412 is physically coupled with the adapter service interface 410 to establish a connection between the second adapter 396 and the PDA 400.

The first and second adapters 394, 396 each comprise a standardized adapter service interface 414 for coupling with the pivoting connector 404. The adapter service interfaces 414 are standardized so that either adapter 394, 396 can be coupled with the host service interface 402. As illustrated, the adapter service interface 414 of the first adapter 394 is coupled with the pivoting connector 404, and the adapter service interface 414 of the second adapter 396 is not coupled with anything.

The first and second adapters 394, 396 further each comprise a female adapter connector 416 and a male adapter connector 418. The connectors 416, 418 are used to couple the adapters 394, 396 to each other to establish power and data communication between the two. The connectors 380, 382 are standardized so that the female adapter connector 416 of either adapter 394, 396 can be plugged into the male adapter connector 418 of the other adapter 394, 396. As illustrated, the male adapter connector 418 of the second adapter 396 is plugged into the female adapter connector 416 of the first adapter 394.

The first and second adapters 394, 396 further each comprise a rear mounting recess 420 and a mounting flange 422. Screw hole openings 424 are provided through the lateral sides of the adapters 394, 396 and are open to the mounting recesses 420. The mounting flanges 422 comprise screw holes 425 that are aligned with the screw hole openings 424 when one of the mounting flanges 422 is received within one of the mounting recesses 420. Screws 426 are driven though the screw hole openings 424 and into the screw holes 425 to secure one adapter 394, 396 to the other. Since they are standardized, either mounting recess 420 can receive either mounting flange 422.

Modular system K further comprises a detachable top end cap 428 and a detachable bottom end cap 430 for the adapters 394, 396. The end caps 428, 430 provide the modular system K with a finished appearance by covering any unused connectors, and further protect unused connectors from damage. The top end cap 428 is provided with a mounting flange 432 with screw holes 433 identical to the mounting flanges 422, for receiving the mounting recesses 420 on one of the adapters 394, 396 and the bottom end cap 430 is provided with a mounting recess 434, screw hole openings 436 identical to the mounting recesses 420 for receiving the mounting flange 422 on the other adapter 394, 396. The bottom end cap 430 is further provided with a dummy connector 440 for receiving one of the female adapter connectors 416. As illustrated, the dummy connector 440 is plugged into the female adapter connector 416 of the second adapter 396. Modular system K can be easily expanded to include other consumer electronic devices by removing the bottom end cap 430 and adding additional device holders having the same standardized connectors as the first and second adapters 394, 396.

Figure 38:
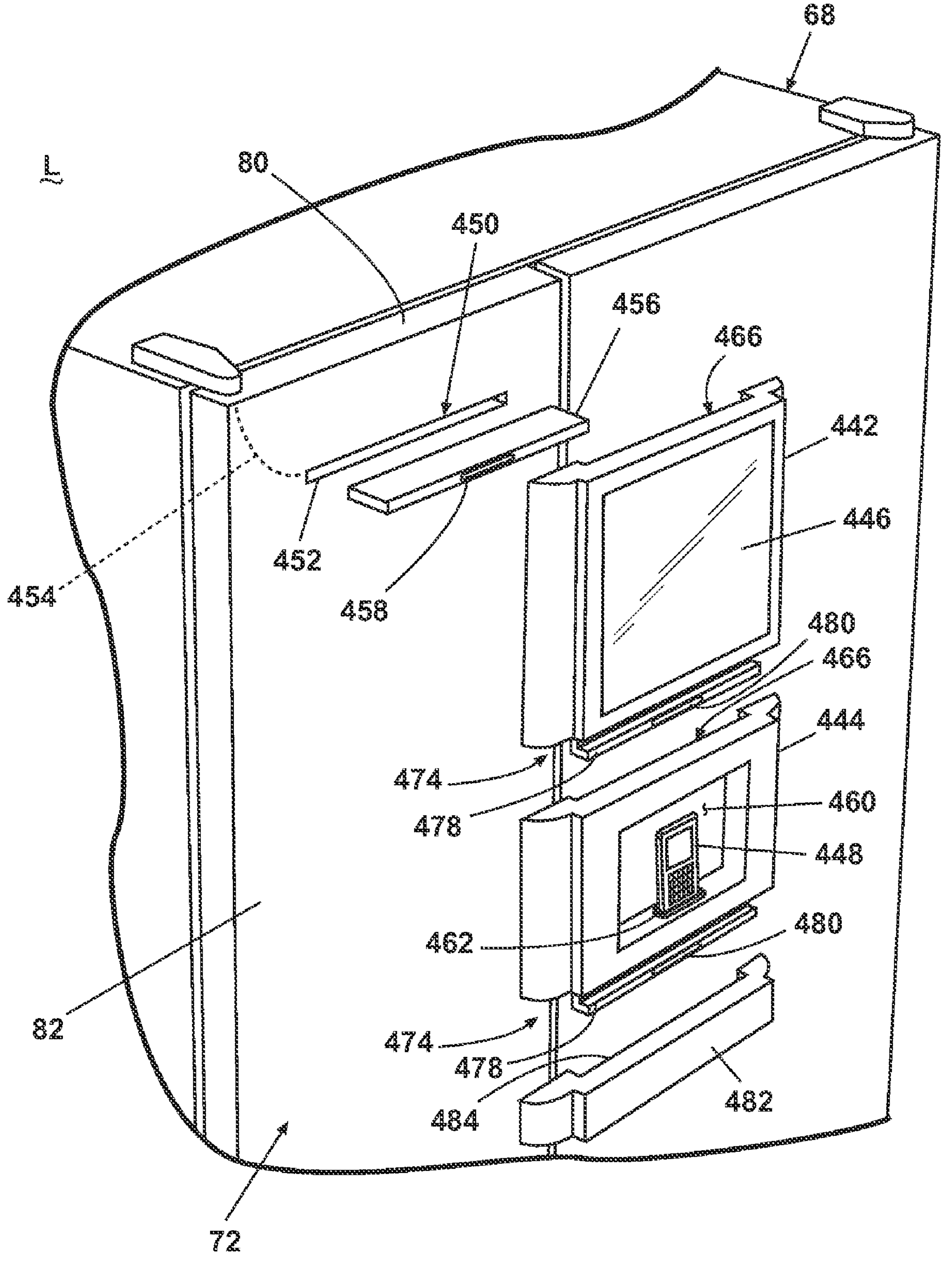
FIG. 38 is an exploded perspective view of a twelfth specific embodiment of a modular system, showing a refrigerator, two adapters, a video display, and a personal digital assistant.
Figure 39:
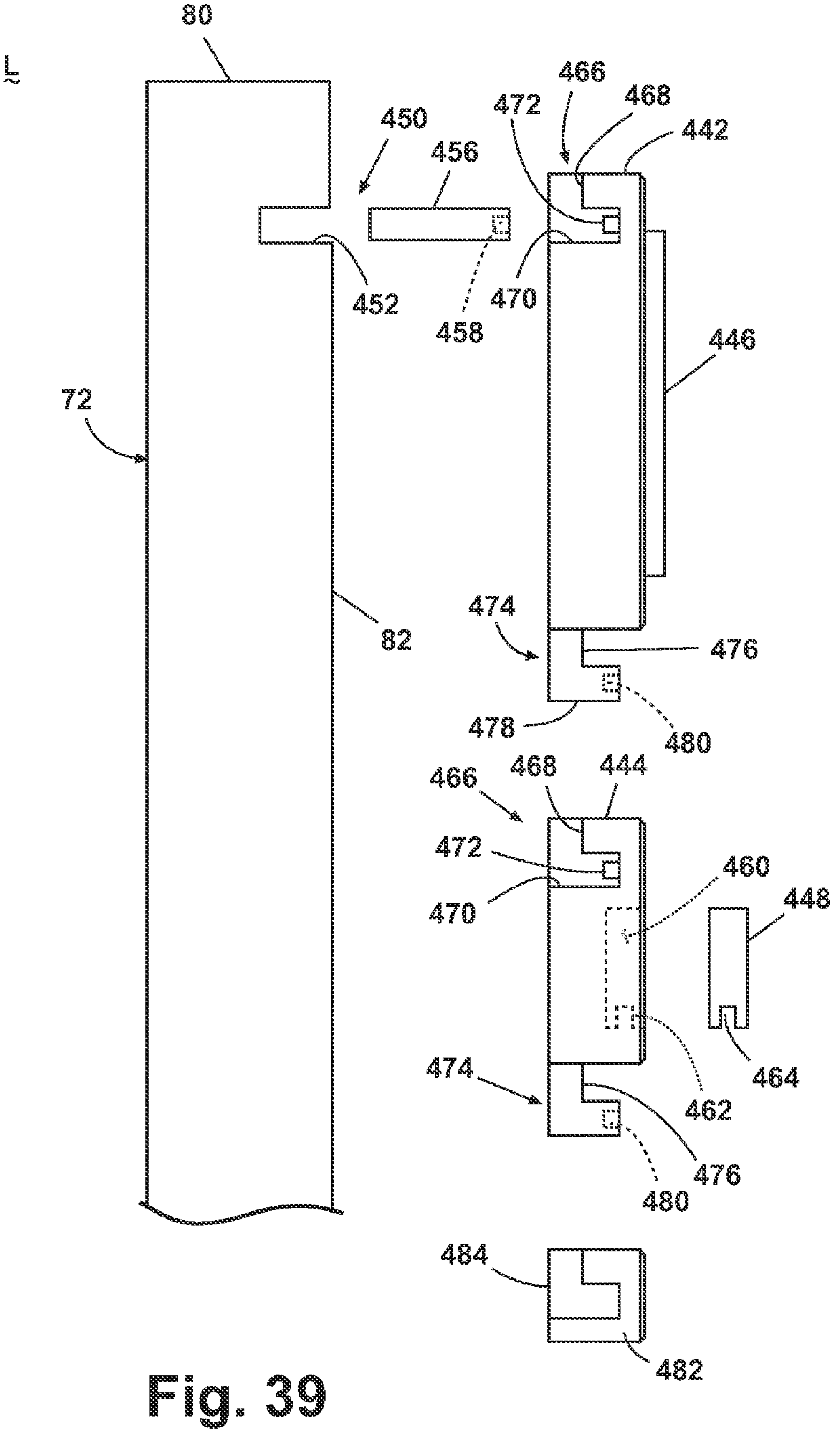
FIG. 39 is a schematic illustration of the connections between the modular system shown in FIG. 38.

Referring to FIGS. 38 and 39, a twelfth embodiment is shown, where a modular system L comprises the refrigerator 68, a first adapter 442, a second adapter 444, a first consumer electronic device illustrated as a video display 446, and a second consumer electronic device illustrated as a PDA 448. The refrigerator 68 comprises a host service interface 450 integrally formed on the front vertical surface 82 of one of the refrigerator doors 72. The host service interface 450 comprises an elongated horizontal slot 452 that is connected to a source of electrical power and, optionally, data. The connection is represented by the dashed line 454 shown in FIG. 38. The host service interface 450 further comprises a removable anchor 456 that is inserted into the slot 452 when one of the adapters 442, 444 is to be coupled with the refrigerator 68. A power/data connector 458 formed on a forward end of the anchor 456.

The first adapter 442 fixedly supports the video display 446. The second adapter 444 comprises an open cavity 460 with an adapter service interface 462 for removably docking the PDA 448. The PDA 448 is provided with a device service interface 464 that is compatible with the adapter service interface 462. The device service interface 464 is physically coupled with the adapter service interface 462 to establish a connection between the second adapter 444 and the PDA 448.

The first and second adapters 442, 444 each comprise a standardized adapter service interface 466 for coupling with the host service interface 450. Each adapter service interface 466 comprises an L-shaped female connector comprising a vertical recess 468 joined to a horizontal recess 470. The horizontal recess 470 comprises power/data connector 472 that is configured to couple with the power/data connector 458 of the anchor 456 when one of the adapters 442, 444 is coupled with the host service interface 450. The adapter service interfaces 466 are standardized so that either adapter 442, 444 can be coupled with the host service interface 450. As illustrated, the adapter service interface 466 of the first adapter 442 is coupled with the host service interface 450.

When inserted into the slot 452, a portion of the anchor 456 extends outwardly from the refrigerator door 72. The adapter service interfaces 466 are formed as recesses in the back surface of the adapters 442, 444 so that the adapters 442, 444 will lie flush against the front vertical surface 82 when coupled with the anchor 456 of the host service interface 450.

The first and second adapters 442, 444 further each comprise a standardized adapter connector 474 configured for coupling with the adapter service interface 462. The adapter connectors 474 provide mechanical communication between the adapters 442, 444 and are electrically wired to provide power and data communication between the refrigerator 68 and the adapters 442, 444. The adapter connectors 474 are standardized so that the adapter connector 474 of either adapter 442, 444 can receive the adapter service interface 462 of the other adapter 442, 444. Each adapter connector 474 comprises an L-shaped male connector comprising a vertical segment 476 joined to a horizontal segment 478. A power/data connector 480 formed on a forward end of the horizontal segment 478 and is configured to couple with the power/data connector 472 of the adapter service interface 462.

Modular system L further comprises a detachable bottom end cap 482 for the adapters 442, 444. The end cap 482 provides the modular system L with a finished appearance by covering the unused adapter connector 474, and further protect the unused adapter connector 474 from damage. The bottom end cap 482 is provided with a dummy connector 484 configured to receive one of the adapter connectors 474. As illustrated, the dummy connector 484 of the bottom end cap 482 is plugged into the adapter connector 474 of the second adapter 444. Modular system L can be easily expanded to include other consumer electronic devices by removing the bottom end cap 482 and adding additional device holders having the same standardized connectors as the first and second adapters 442, 444.

Figure 40:
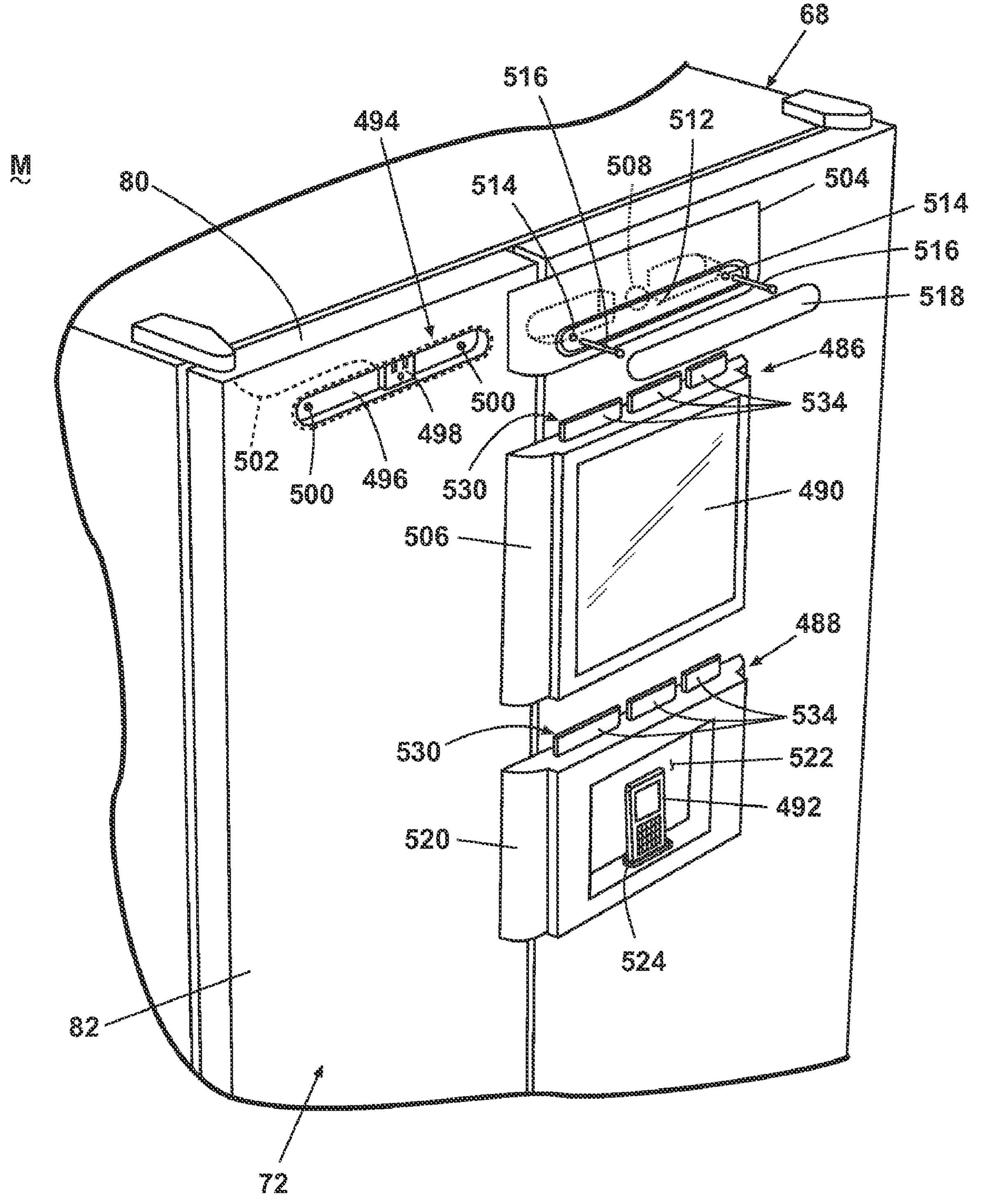
FIG. 40 is an exploded perspective view of a thirteenth specific embodiment of a modular system, showing a refrigerator, two adapters, a video display, and a personal digital assistant.
Figure 41:
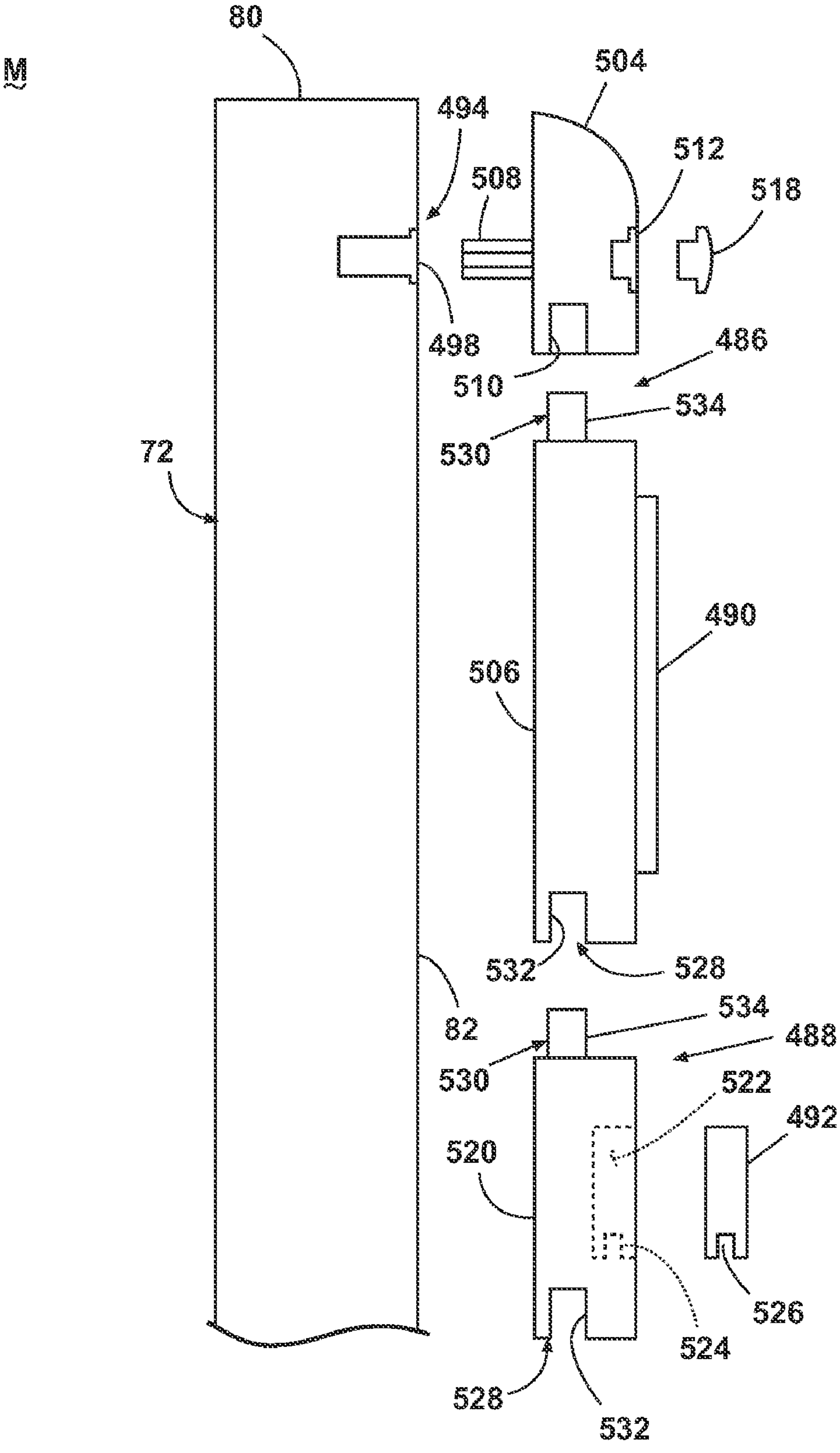
FIG. 41 is a schematic illustration of the connections between the modular system shown in FIG. 40.

Referring to FIGS. 40 and 41, a thirteenth embodiment is shown, where a modular system M comprises the refrigerator 68, a first adapter 486, a second adapter 488, a first consumer electronic device illustrated as a video display 490 and a second consumer electronic device illustrated as a PDA 492. The refrigerator 68 comprises a host service interface 494 integrally formed on the front vertical surface 82 of one of the refrigerator doors 72. The host service interface 494 comprises an elongated horizontal recess 496 having a power socket 498 disposed in the center of the slot and two screw holes 500 near the ends of the slot 496. The power socket 498 is connected to a source of electrical power and the connection is represented by the dashed line 502 shown in FIG. 40.

The first adapter 486 comprises an extender 504 and a first device holder 506 supporting the video display 490. The extender 504 comprise a rear power plug 508 configured to plug into the power socket 498 of the host service interface to couple the extender 504 to a source of electrical power, and a female connector 510. The extender 504 further comprises an elongated front recess 512 having a pair of screw hole openings 514 with associated screws 516. The extender 504 is mounted to the refrigerator 68 by driving the screws 516 through the screw hole openings 514 and into the screw holes 500.

A host cap 518 is provided for covering the host service interface 494 to conceal it and prevent it from damage when the extender 504 is removed from the refrigerator 68. The host cap 518 is press fit into the recess 496 to mount it to the refrigerator 68. To prevent the host cap 518 from being misplaced or lost when the extender 504 is mounted on the refrigerator 68, it can be attachable to the recess 512 of the extender 504.

The second adapter 488 comprises a second device holder 520 having an open cavity 522 with an adapter service interface 524 for removably docking the PDA 492. The PDA 492 is provided with a device service interface 526 that is compatible with the adapter service interface 524. The device service interface 526 is physically coupled with the adapter service interface 524 to establish a connection between the second device holder 520 and the PDA 492.

The first and second device holders 506, 520 further each comprise a female adapter connector 528 and a male adapter connector 530. The connectors 528, 530 are used to couple the device holders 506, 520 to each other to establish power and data communication between the two. The connectors 528, 530 are standardized so that the female adapter connector 528 of either device holders 506, 520 can be plugged into the male adapter connector 530 of the other device holders 506, 520 Each female adapter connector 528 comprises three sockets 532 (only one is visible in FIG. 41) formed on an lower surface of the device holders 506, 520. Each male adapter connector 530 comprises three male 534 plugs formed on an upper surface of the device holders 506, 520 and configured to plug into the three female sockets 532. As illustrated, the male adapter connector 530 of the second device holder 520 is plugged into the female adapter connector 528 of the first device holder 506 to establish both mechanical and power communication therebetween.

Figure 42:
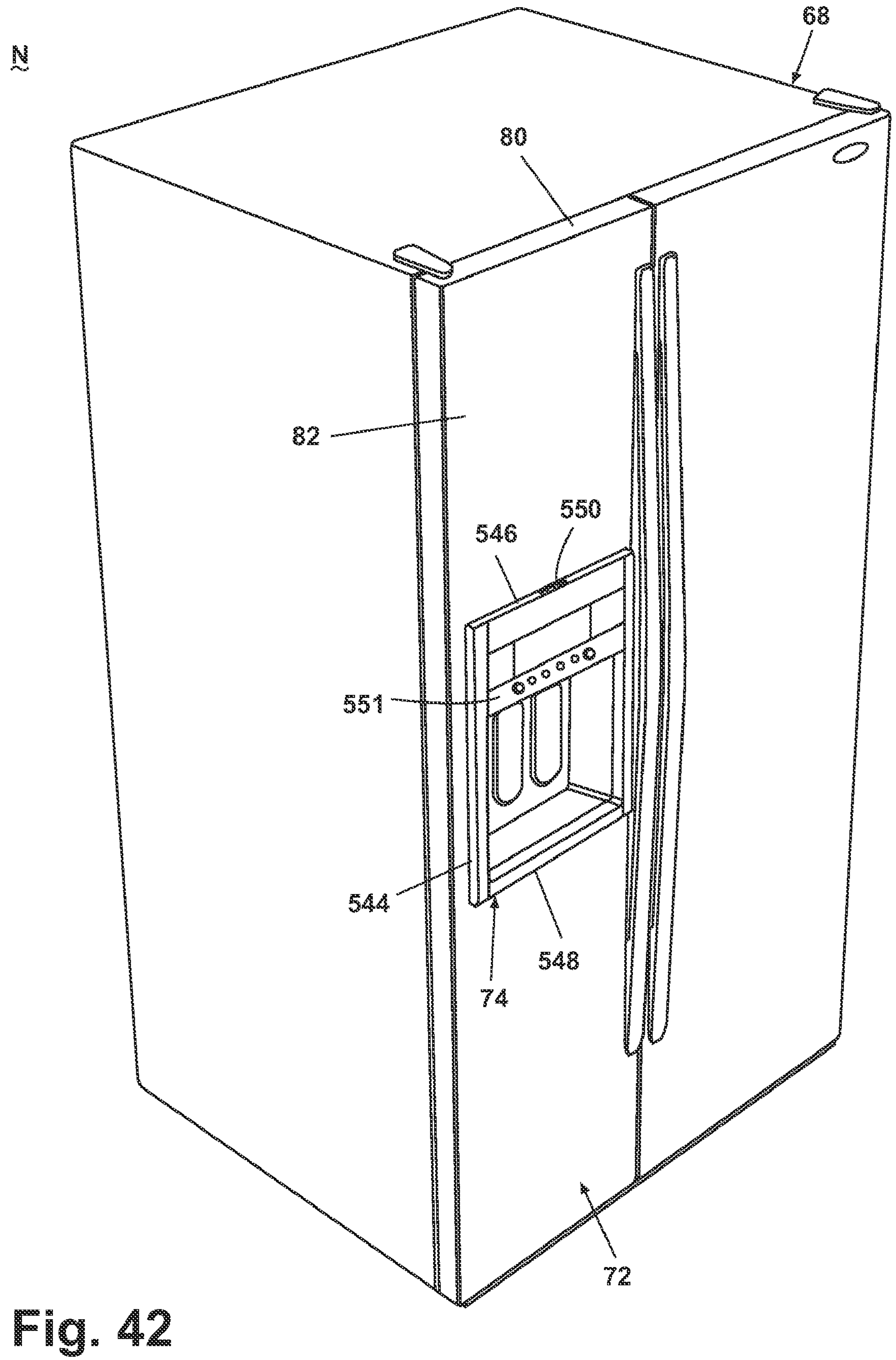
FIG. 42 is a perspective view of a fourteenth specific embodiment of a modular system, showing a refrigerator having a host service interface formed on a top surface of a dispenser.
Figure 43:
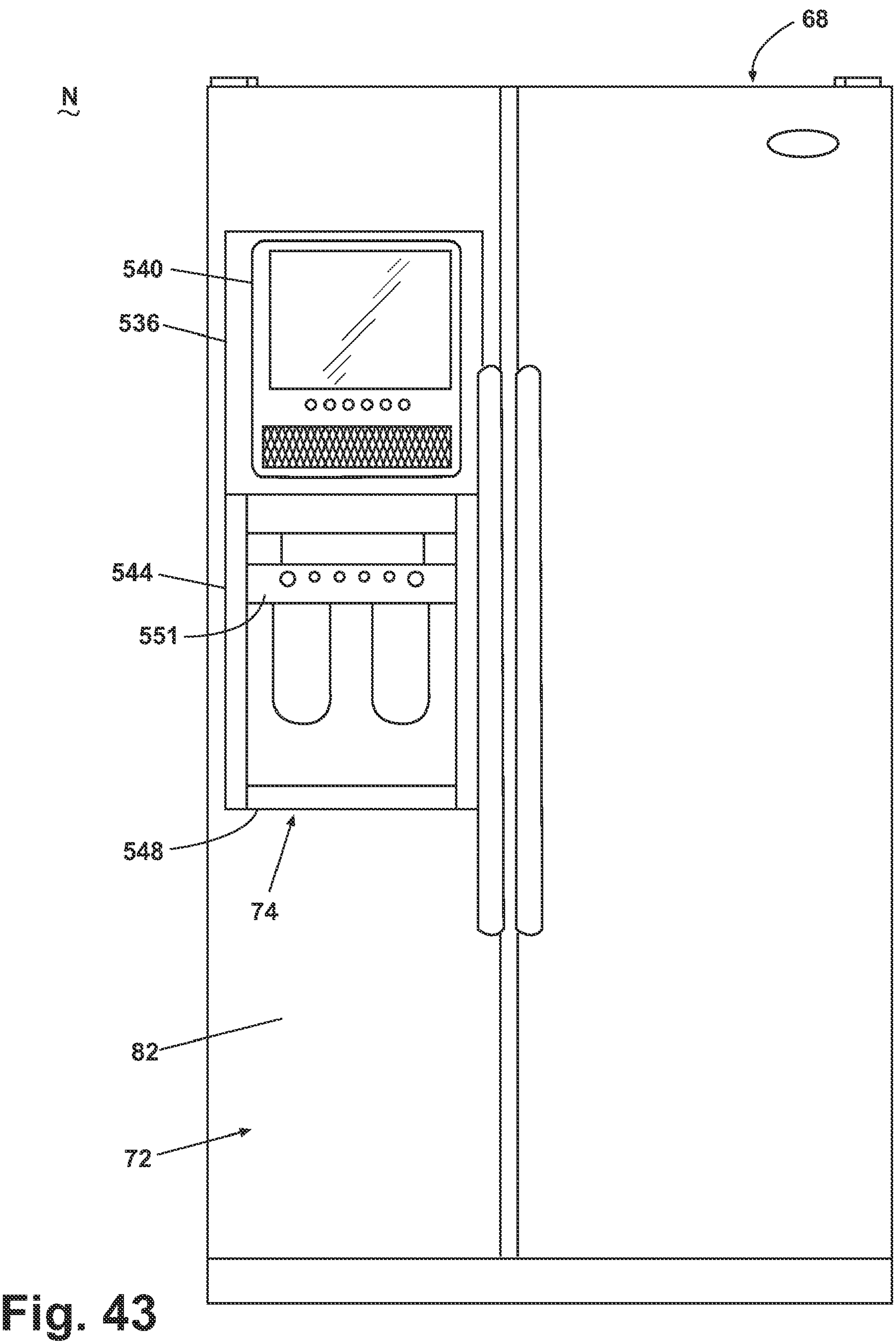
FIG. 43 is a front view of the modular system of FIG. 42, showing a first adapter and consumer electronic device coupled to the refrigerator.
Figure 44:
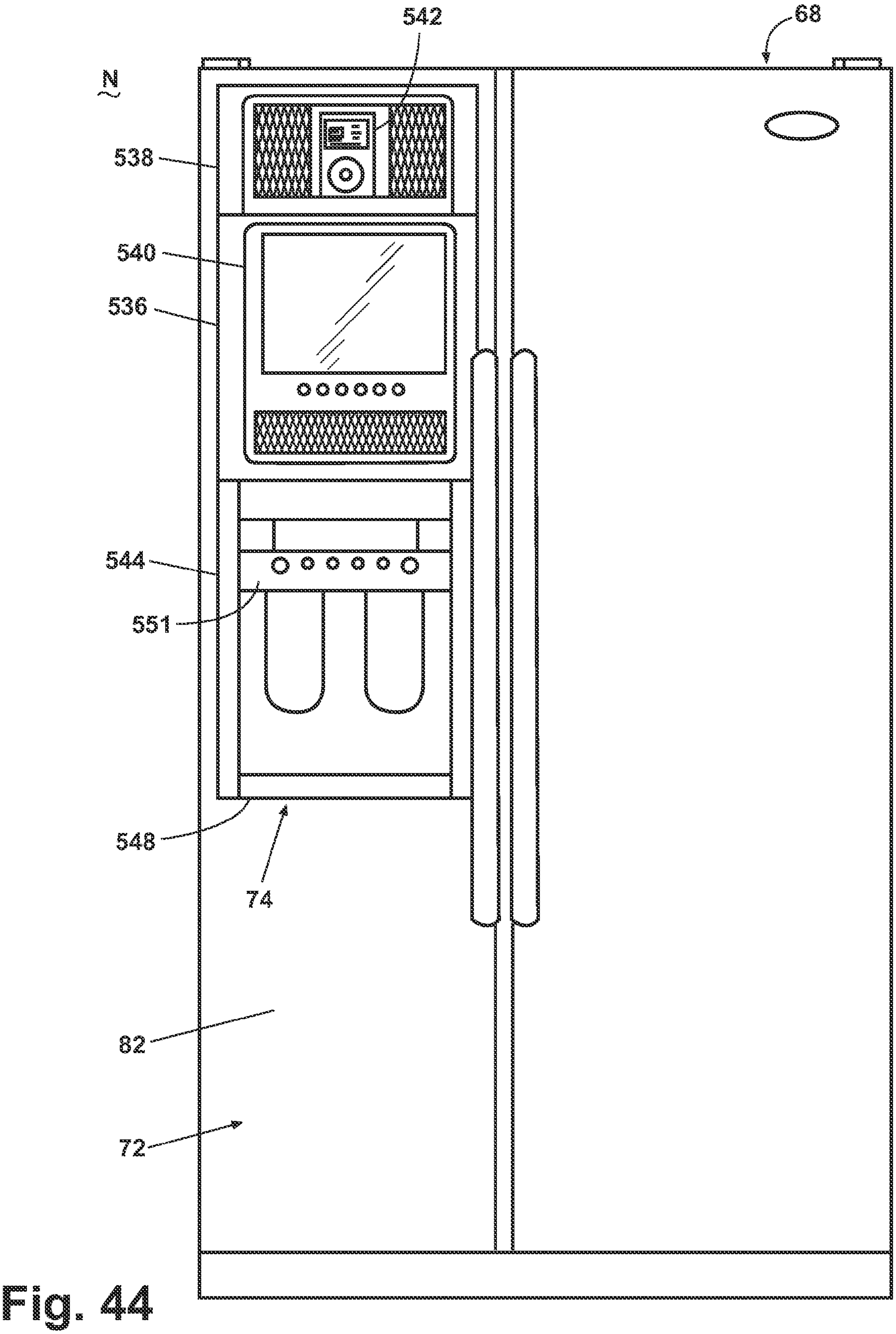
FIG. 44 is a front view of the modular system of FIG. 42, showing a second adapter and consumer electronic device coupled to the refrigerator.

Referring to FIGS. 42-44, a fourteenth embodiment is shown, where a modular system N comprises the refrigerator 68, a first adapter 536, a second adapter 538, a first consumer electronic device illustrated as a television 540 and a second consumer electronic device illustrated as a portable digital music player 542. The first adapter 536 removably supports the television 540 and the second adapter 538 removably supports the digital music player 542.

Referring to FIG. 42, the dispenser 74 comprises a housing 544 that projects from the front vertical surface 82 of the refrigerator door 72. The housing 544 is illustrated as the housing for the water/ice dispenser 74 on the refrigerator door 72. The housing 544 has a top surface 546 and a bottom surface 548 that are both generally horizontal. A host service interface 550 is provided on the top surface 546 and is preferably integrally formed therewith so that it is not removable from the refrigerator 68. The host service interface 550 can provide both power and data communication, which is supplied to the television 540 and the digital music player 542 when the adapters 536, 538 are coupled to the host service interface 550 and the television 540 and the digital music player 542 are coupled to the adapters 536, 538.

Referring to FIG. 43, the partially assembled modular system N is shown, where the first adapter 536 is coupled to the host service interface 550. The bottom surface of the first adapter 536 rests on the top surface 546 of the dispenser 74 and the back surface of the first adapter 536 rests against the front vertical surface 82 of the refrigerator door 72, and is thus provided with mechanical communication by the refrigerator 68. The coupling of the first adapter 536 with the host service interface 550 provides power and data communication to the television 540 when it is coupled with the first adapter 536.

Referring to FIG. 44, fully assembled modular system N is shown, where the second adapter 538 is coupled to the first adapter 536 in a stacked relationship. In the stacked relationship, the bottom surface of the second adapter 538 rests on the top surface of the first adapter 536 and the back of the second adapter 538 rests against the front vertical surface 82 of the refrigerator door 72. Thus, the second adapter 538 is provided with mechanical communication by both the first adapter 536 and the refrigerator 68. The coupling of the second adapter 538 with the first adapter 536 provides power and data communication to the digital music player 542 when it is coupled with the second adapter 538. While the configuration of modular system N shown in FIG. 45 is referred to as fully assembled, it is understood that modular system N shown in FIG. 44 and referred to as partially assembled is also useable as configured.

Incorporating the host service interface 550 into the housing 544 for the water/ice dispenser 74 is very convenient for the user and the manufacturer. The dispenser 74 typically already has power provided to it from the refrigerator 68. This power can also be supplied to the consumer electronic devices. The housing 544 also provides a convenient physical support for the adapters 536, 538, which can be stacked on top of the housing 544. The dispenser 74 also has a user interface 551 that can be reconfigured to work with any attached consumer electronic devices.

Figure 45:
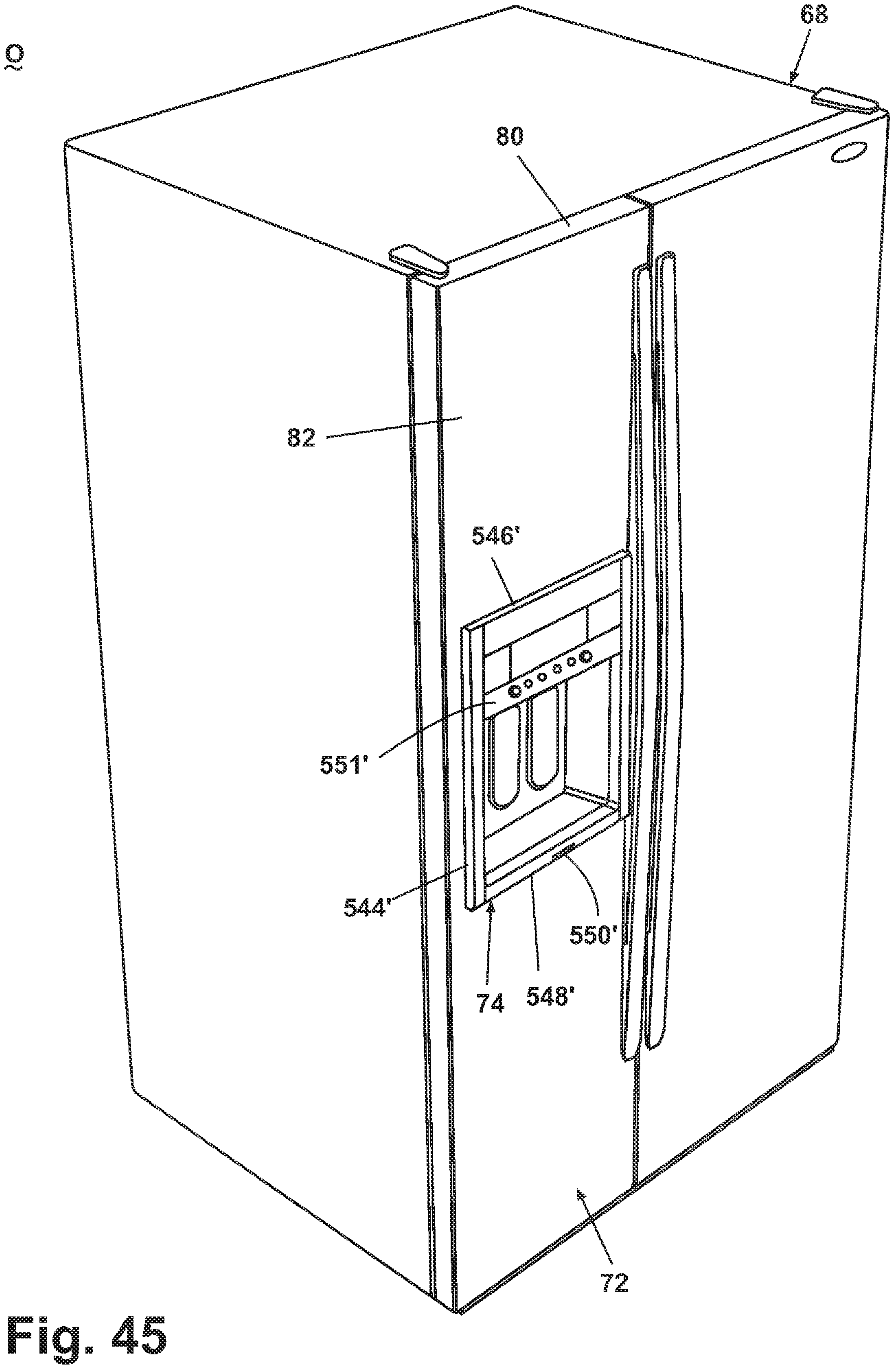
FIG. 45 is a perspective view of a fifteenth specific embodiment of a modular system, showing a refrigerator having a host service interface formed on a bottom surface of a dispenser.
Figure 46:
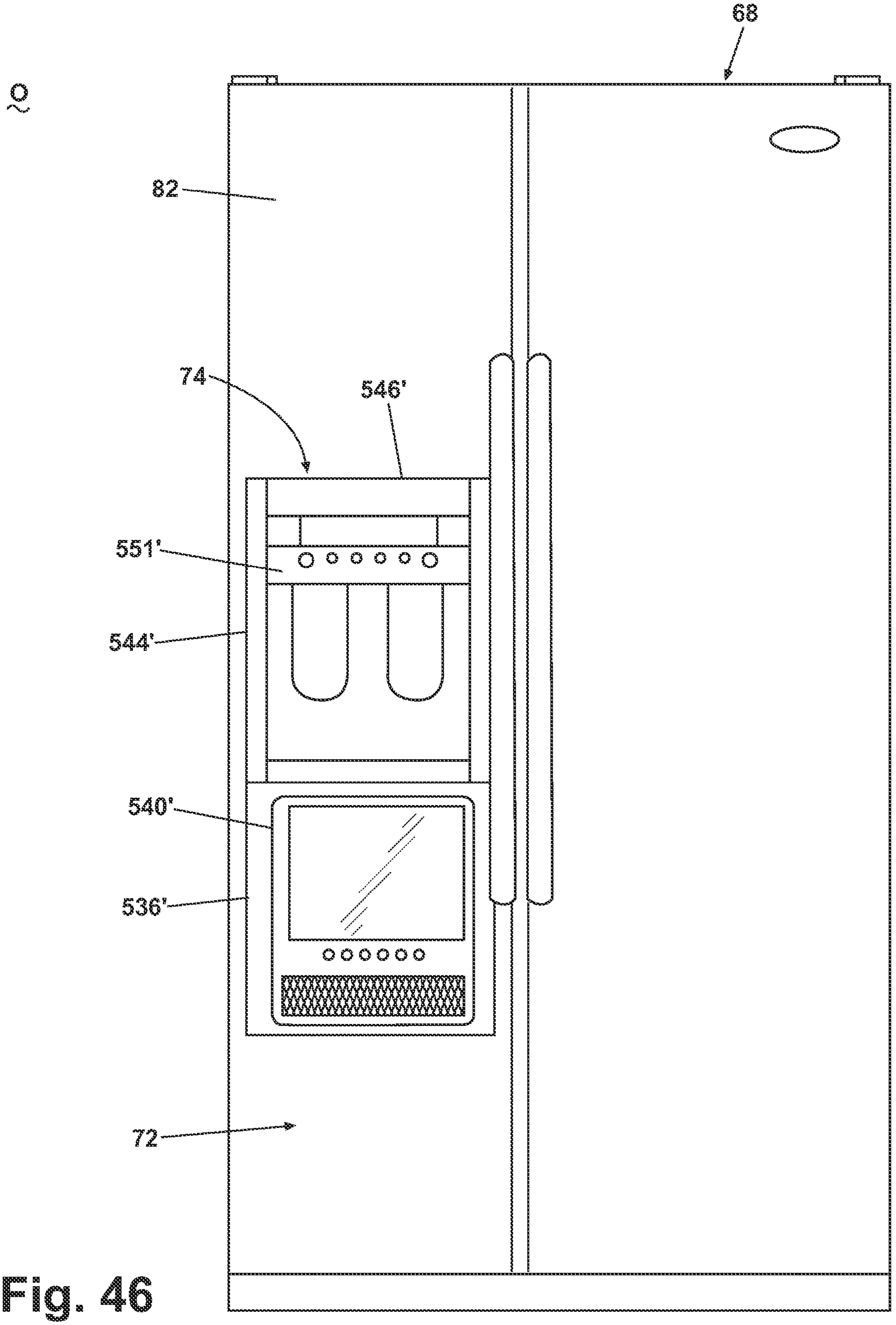
FIG. 46 is a front view of the modular system of FIG. 45, showing a first adapter and consumer electronic device coupled to the refrigerator.
Figure 47:
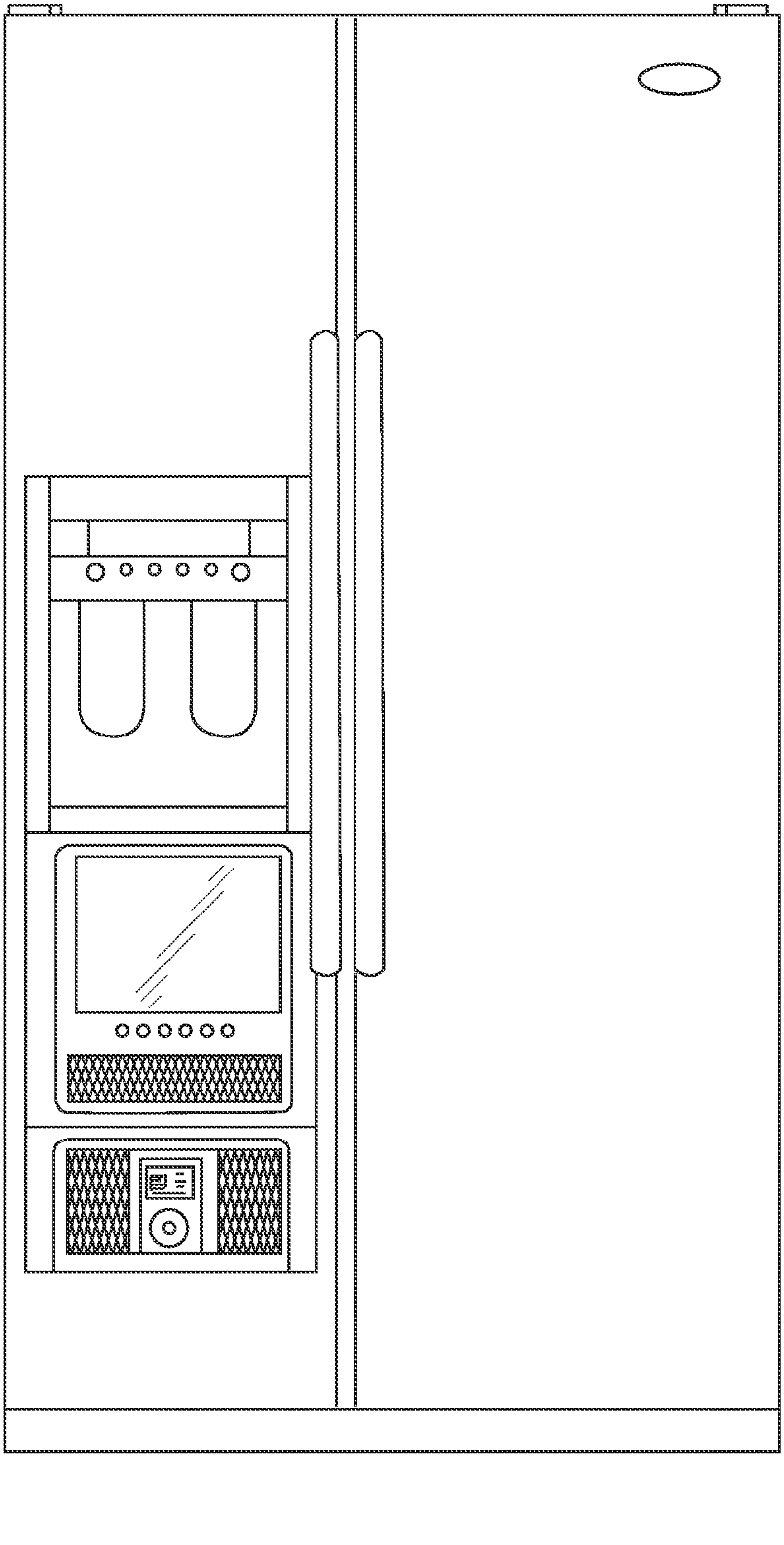
FIG. 47 is a front view of the modular system of FIG. 45, showing a second adapter and consumer electronic device coupled to the refrigerator.

Referring to FIGS. 45-47, a fifteenth embodiment is shown, where a modular system O is similar to modular system N, and elements similar to those of modular system N are identified by the same reference numerals bearing a prime (') symbol. Referring to FIG. 45, the host service interface 550' is provided on the bottom surface 548' of the dispenser housing 544'.

Referring to FIG. 46, the partially assembled modular system O is shown, where the first adapter 536' is coupled to the host service interface 550'. The first adapter 536' is suspended from bottom surface 548' of the dispenser 74 and the back surface of the first adapter 536' rests against the front vertical surface 82 of the refrigerator door 72, and is thus provided with mechanical communication by the refrigerator 68. The coupling of the first adapter 536' with the host service interface 550' provides power and data communication to the television 540' when it is coupled with the adapter 536'.

Referring to FIG. 47, the fully assembled modular system O is shown, where the second adapter 538' is coupled to the first adapter 536' in a hanging relationship. In the hanging relationship, the second adapter 538' is suspended from the first adapter 536' and the back of the second adapter 538' rests against the front vertical surface 82 of the refrigerator door 72. Thus, the second adapter 538' is provided with mechanical communication by both the first adapter 536' and the refrigerator 68. The coupling of the second adapter 538' with the first adapter 536' provides power and data communication to the digital music player 542' when it is coupled with the second adapter 538'. While the configuration of modular system O shown in FIG. 47 is referred to as fully assembled, it is understood that modular system O shown in FIG. 47 and referred to as partially assembled is also useable as configured.

Figure 48:
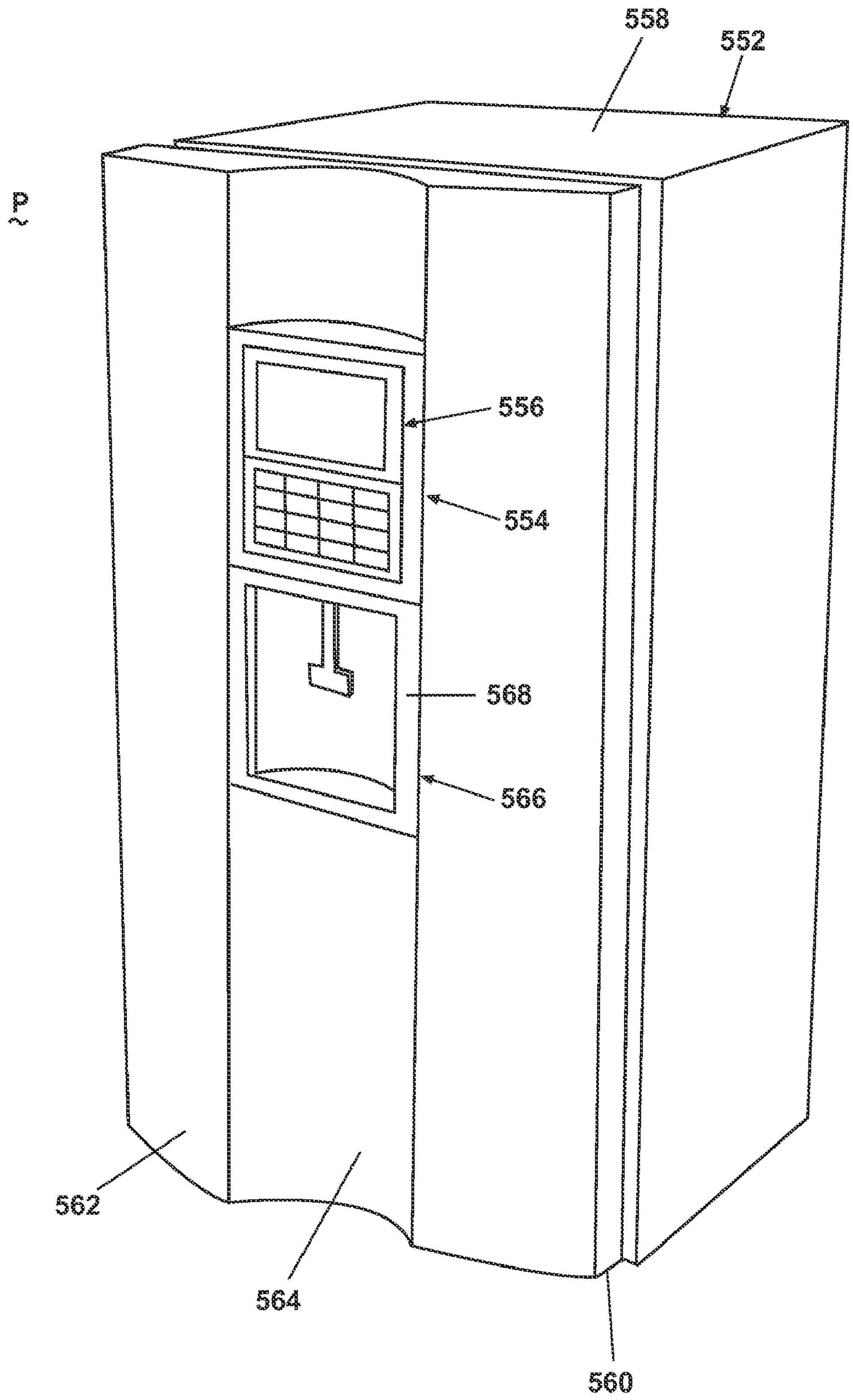
FIG. 48 is a perspective view of a sixteenth specific embodiment of a modular system, showing a refrigerator, an adapter with user interface functionality, and a video display.
Figure 49:
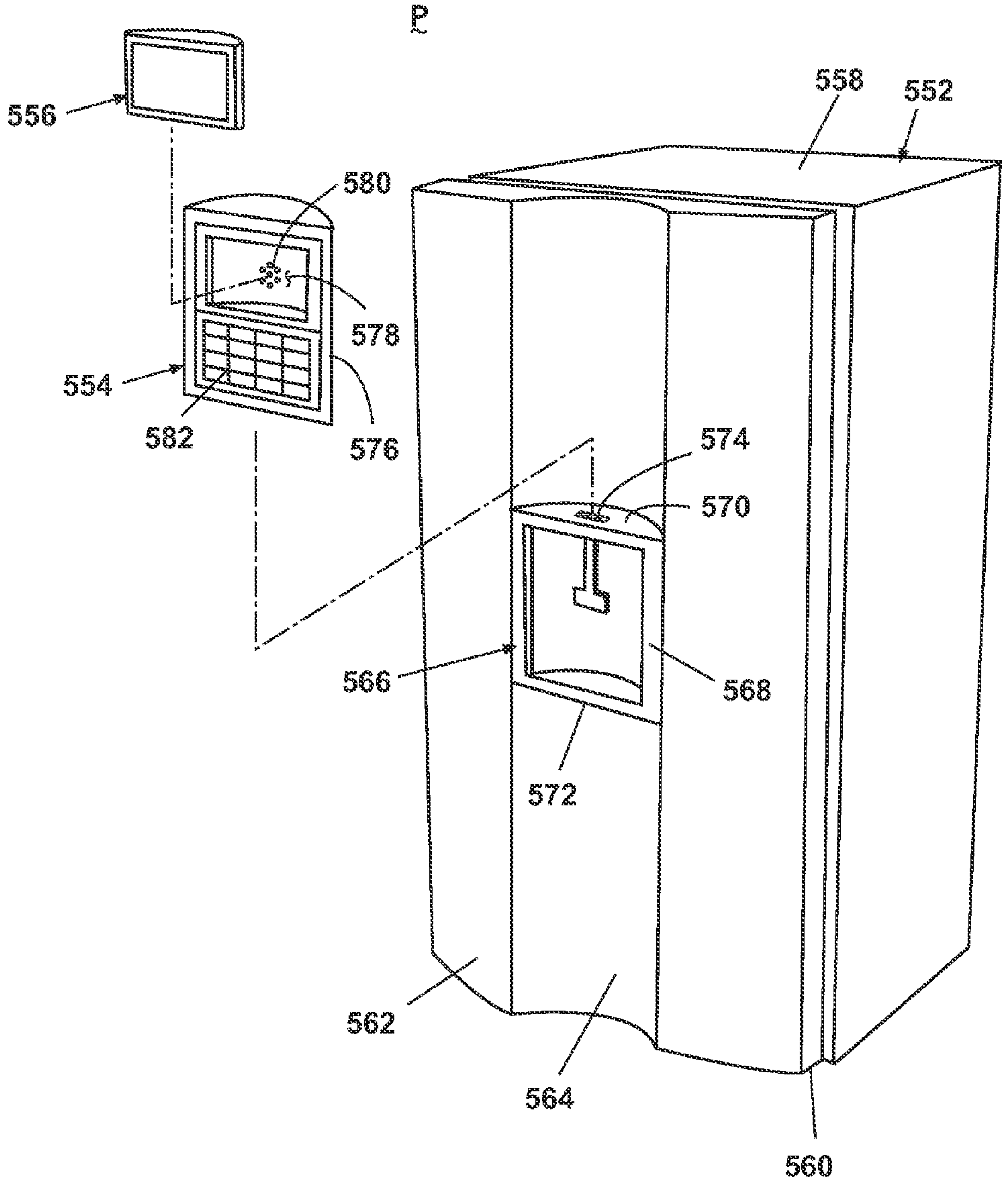
FIG. 49 is an exploded perspective view of the modular system from FIG. 48.

Referring to FIGS. 48 and 49, a sixteenth embodiment is shown, where a modular system P comprises a refrigerator 552, an adapter 554, and a consumer electronic device illustrated as a removable video display 556. The refrigerator 552 is different from the refrigerator 68 in that the refrigerator 552 comprises a cabinet 558 having an open front face (not shown) and a single door 560 openably mounted to the cabinet 558 to selectively close the open front face. The door 560 comprises a front face 562 and a vertical groove 564 running the length of the front face 562.

The refrigerator 552 further comprises a dispenser 566 for selectively dispensing water and/or ice. The dispenser 566 comprises a dispenser housing 568 that is mounted within the vertical groove 564 so that the front of the housing 568 is generally flush with the front face 562 of the door 560. The housing 568 has a top surface 570 and a bottom surface 572 that are both generally horizontal. A host service interface 574 is provided on the top surface 570 and is preferably integrally formed therewith so that it is not removable from the refrigerator 552. The adapter 556 can be removably coupled to the host service interface 574. The host service interface 574 can provide both power and data communication, which is supplied to the video display 556 when the adapter 554 is coupled to the host service interface 574 and the video display 556 is coupled to the adapter 554.

The adapter 554 comprises an adapter housing 576 having a cavity 578 for removably receiving the video display 556. An adapter service interface 580 is provided within the cavity 578 and is configured for coupling with the video display 556.

The adapter service interface 580 is coupled with the video display 556 to establish an electrical and data connection between the adapter 554 and the video display 556. The adapter 554 further has the added functionality of a user interface 582 that can be used to control the refrigerator 552 when the adapter 554 is coupled to the host service interface 574 and to control the video display 556 when the video display 556 is coupled to the adapter service interface 580.

To couple the adapter 554 to the host service interface 574, the adapter housing 576 is received within the groove 564, with the adapter 556 resting on the top surface 546 of the dispenser 74, and is thus provided with mechanical, power and data communication by the refrigerator 552.

Modular system P can be expanded to include additional adapters and consumer electronic devices. By providing a service interface on top of the adapter housing 578, additional adapter can be stacked upwardly within the groove 564. Moreover, an additional host service interface, similar to the host service interface 574 can be provided on the bottom surface 572 of the dispenser housing 568 for supporting one or more adapters within the groove 564 in hanging relation to the dispenser 566.

Figure 50:
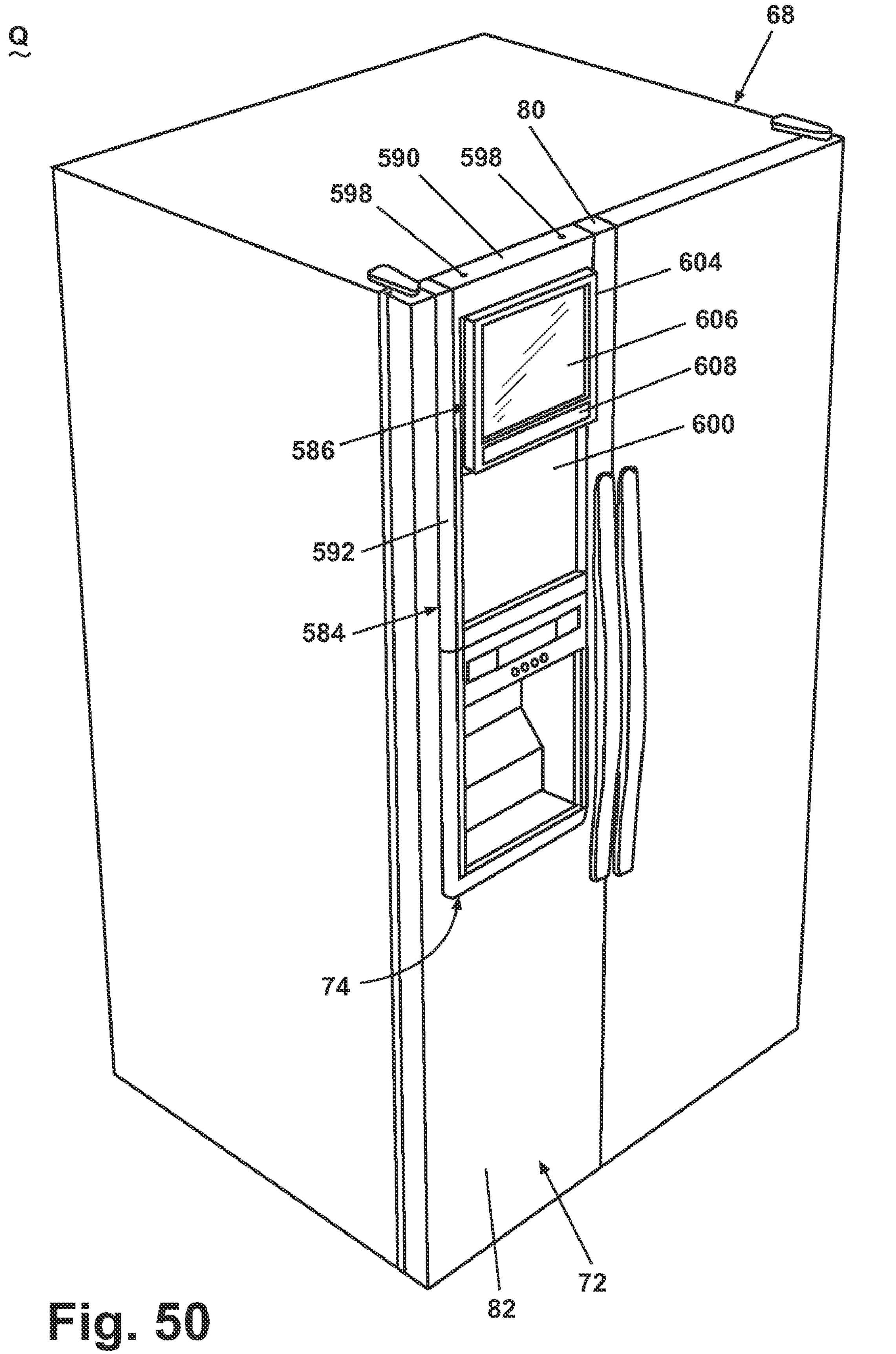
FIG. 50 is a perspective view of a seventeenth specific embodiment of a modular system, showing a refrigerator, an adapter with whiteboard functionality and a video display.
Figure 51:
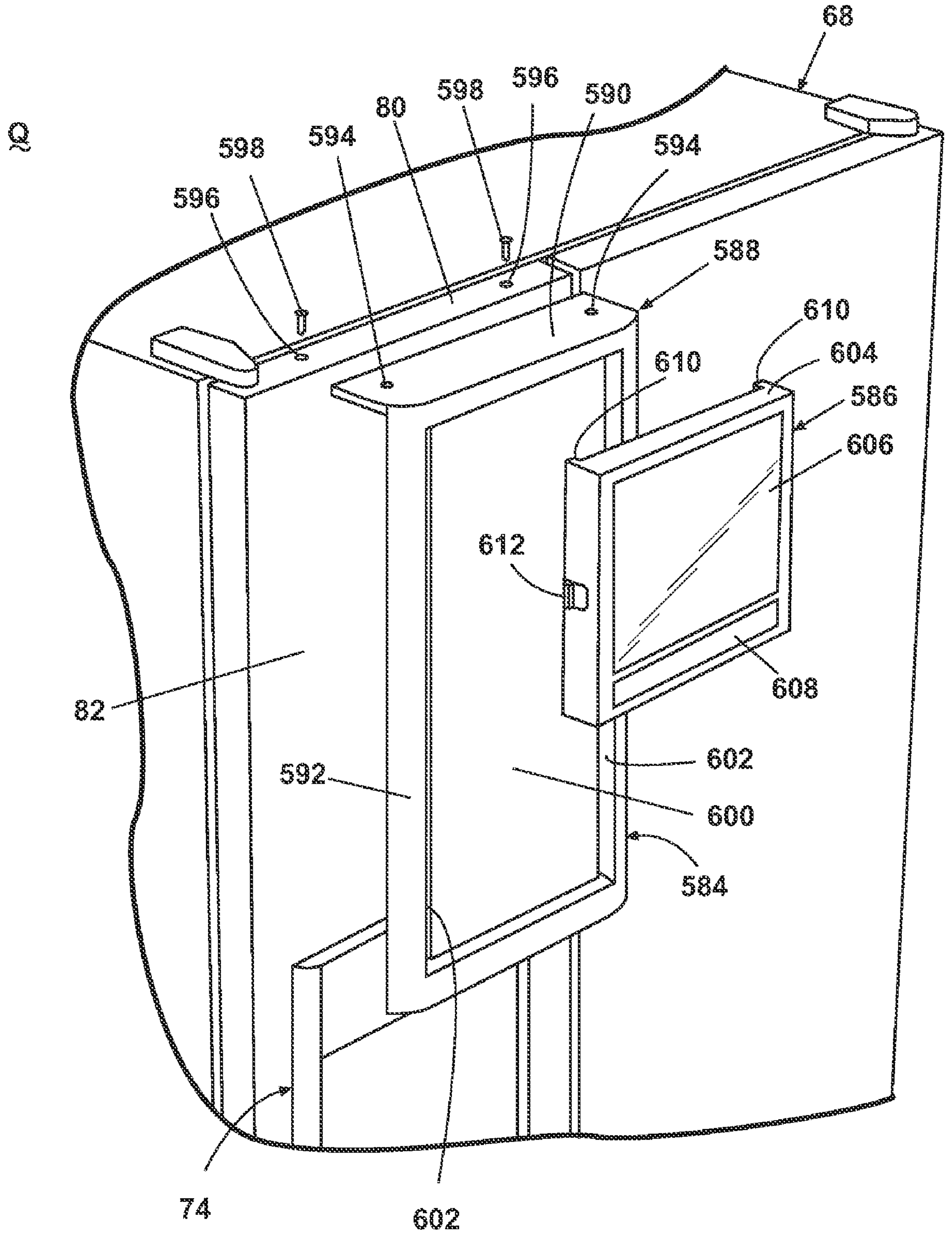
FIG. 51 is a close-up exploded view of the modular system from FIG. 50.
Figure 52:
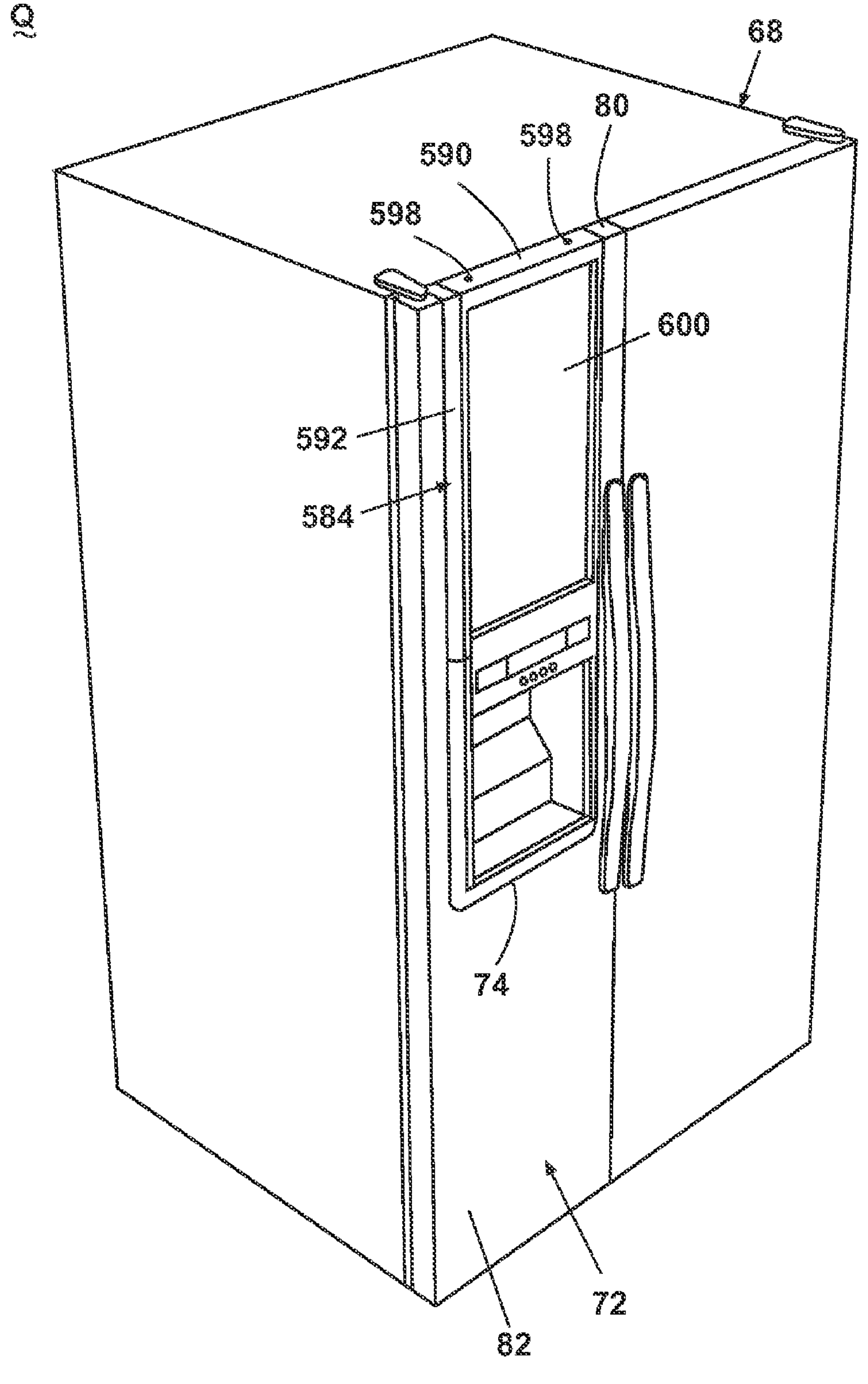
FIG. 52 is a perspective view of the modular system from FIG. 50, showing the video display removed from the refrigerator.

Referring to FIG. 50-52, a seventeenth embodiment is shown, where a modular system Q comprises the refrigerator 68, an adapter 584 having white board functionality, and a consumer electronic device illustrated as a video display 586. The adapter 584 comprises an L-shaped adapter housing 588 having a generally horizontal mounting bracket 590 and a generally vertical body 592 joined to the mounting bracket 590 at a right angle. The mounting bracket 590 is received over the top surface 80 of one of the refrigerator doors 72 so that the body 592 rests against the front vertical surface 82. The mounting bracket 590 comprises a pair of screw hole openings 594 that are aligned with corresponding screw holes 596 formed in the top surface 80 and each receives a mounting screw 598 to physically mount the adapter 584 to the refrigerator 68. The adapter housing 588 is dimensioned so that when it is mounted to the refrigerator 68, the lower surface of the body 592 abuts the upper surface of the dispenser 74. The body 592 retains a whiteboard 600 and comprises two vertical grooves 602 on either side of the whiteboard 600 that are used to mount the video display 586 to the adapter 584.

The video display 586 comprises a display housing 604, a display screen 606 and a user interface 608 provided on the front of the housing 604, and a pair of vertical projections 610 extending from the back of the housing 604 that are received within the grooves 602 when the video display 586 is mounted to the adapter 584. The video display 586 further comprises a pair of resilient tabs 612 that are formed on the lateral sides of the housing and bias against the adapter housing 588 to mechanically couple the video display 586 to the adapter 584. The projections 610 can slide within the grooves 602 to adjust the vertical height of the video display 586 and the resilient tabs 612 can maintain the video display 586 at any desired vertical height along the adapter 584. The video display 586 further comprises an internal source of power (not shown), such as a battery. Thus, the video display 586 is only supplied with the service of mechanical communication by the adapter 584.

Referring to FIG. 52, the video display 586 can be removed from the refrigerator 68 to expose the entire writing surface of the whiteboard 600. In addition to providing a writing surface, the whiteboard also provides an aesthetic function to the adapter 584, by providing a more visually pleasing appearance than an adapter without a whiteboard. Alternately, when the video display 586 is mounted to the whiteboard 600, only a portion of the writing surface is exposed, as shown in FIG. 50. While not illustrated herein, one or more additional consumer electronic devices can be mounted to the adapter 584 to completely cover the writing surface of the whiteboard 600.

Figure 53:
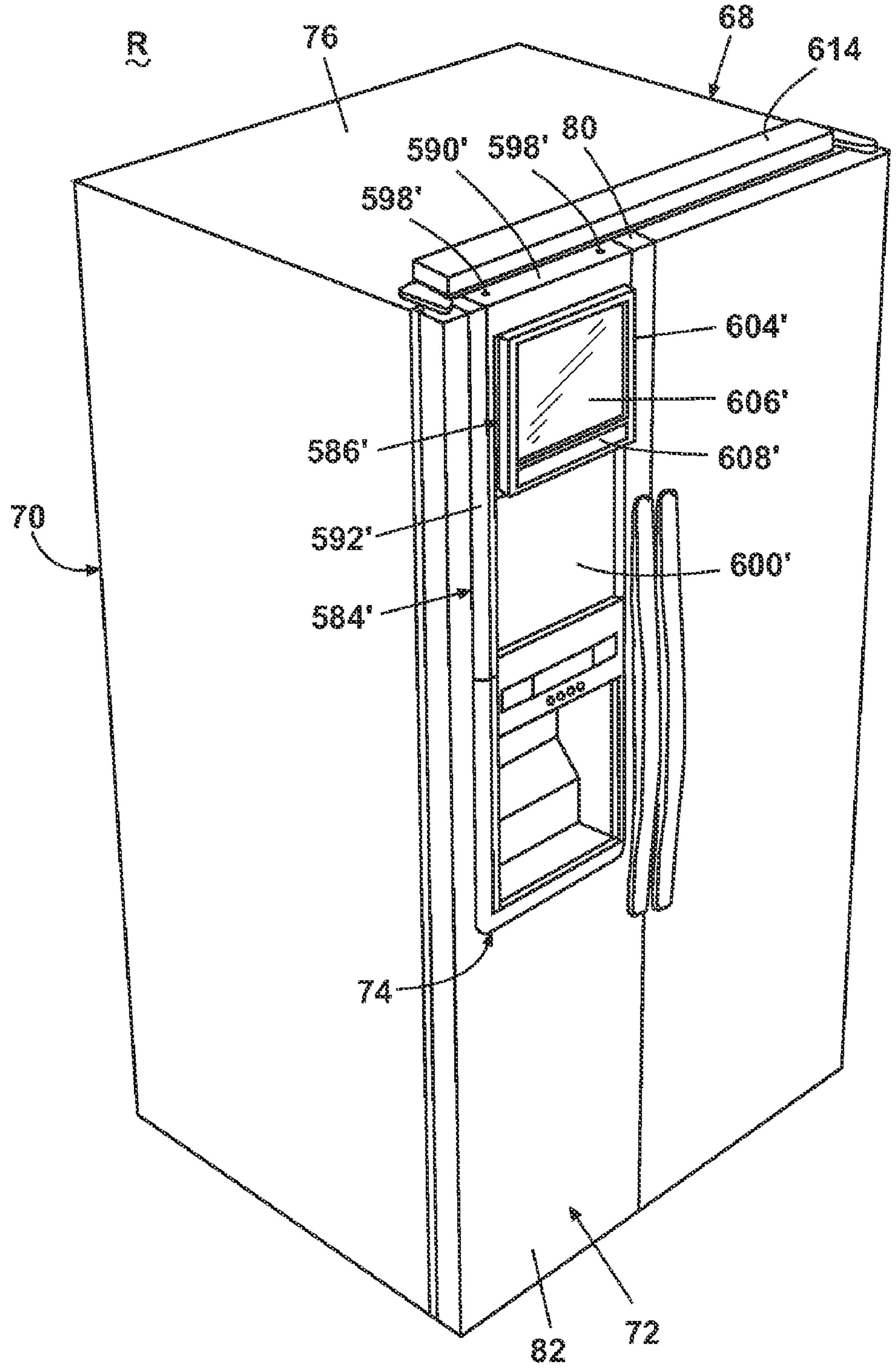
FIG. 53 is a perspective view of an eighteenth specific embodiment of a modular system, showing a refrigerator having a speaker, an adapter with whiteboard functionality and a video display.

Referring to FIG. 53, an eighteenth embodiment is shown, where a modular system R is similar to modular system Q, and elements similar to those of modular system Q are identified by the same reference numerals bearing a prime (') symbol. Modular system R additionally comprises a speaker 614 mounted to the top surface 76 of the refrigerator cabinet 70. The speaker 614 can be operably coupled with the adapter 584, so that sound from the video display 586, or any other consumer electronic device mounted to the adapter 584, can be audibly projected. The speaker 614 can be controlled through the user interface 608 of the video display 586. The speaker 614 can be integrally formed with the refrigerator 68, or it can be an add-on element. The speaker 614 can be added to any of the other embodiments of the modular system shown herein.

Figure 54:
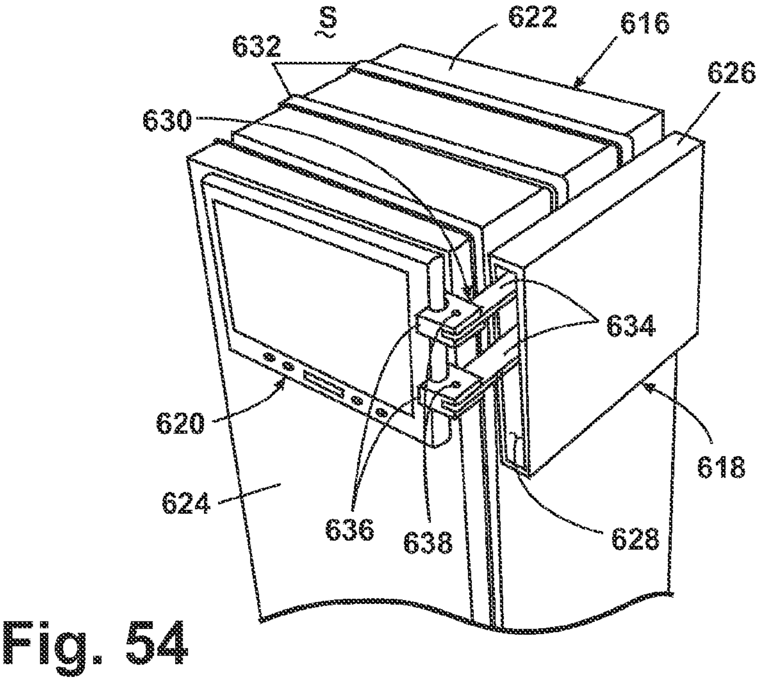
FIG. 54 is a partial perspective view of a nineteenth specific embodiment of a modular system, showing a refrigerator with a video display moveably coupled to the refrigerator by an adapter, where the video display is in a use position.
Figure 55:
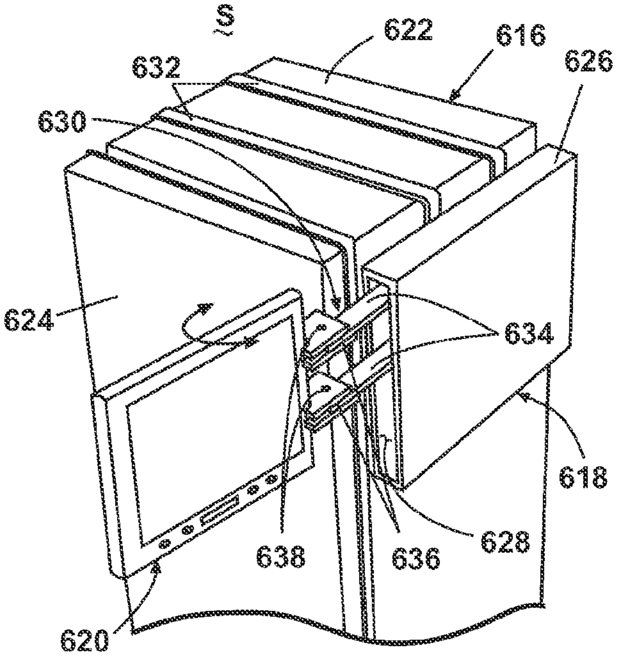
FIG. 55 is a partial perspective view of the modular system from FIG. 54, showing the movement of the video display between the use position and a non-use position.
Figure 56:
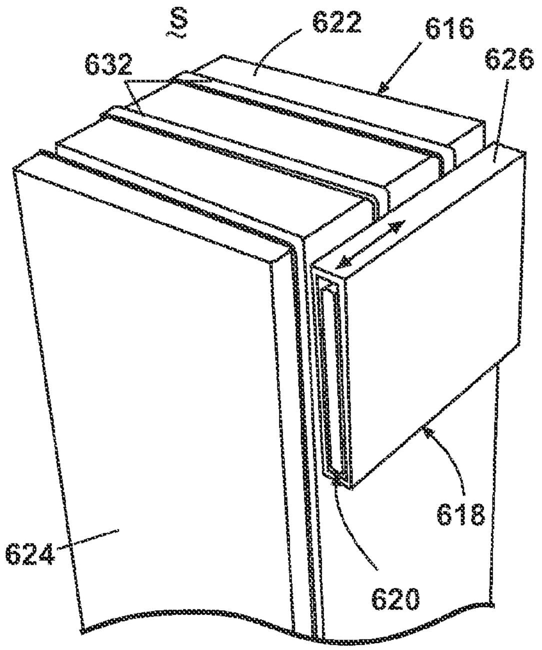
FIG. 56 is a partial perspective view of the modular system from FIG. 54, where the video display is in the non-use position.

Referring to FIGS. 54-56, a nineteenth embodiment is shown, where the modular system S comprises a refrigerator 616, an adapter 618, and a consumer electronic device illustrated as a television 620. The nineteenth embodiment is ideally suited for a retrofit application where the host service interface is not incorporated into the host during manufacture. The refrigerator 616 is different from the refrigerator 68 in that the refrigerator 616 comprises a cabinet 622 having an open front face (not shown) and a single door 624 openably mounted to the cabinet 622 to selectively close the open front face.

The adapter 618 comprises a generally rectangular adapter housing 626 having a cavity 628 shaped to receive the television 620, a movable television mount 630, and a bracket 632 that mounts the housing 626 to the refrigerator 616. The television mount 630 supports the television 620 and is retractable, along with the television 620, into the cavity 628. The television mount 630 comprises two telescoping arms 634 that can move laterally into and out of the cavity 628, and two hinge brackets 636 attached to the television 620. The hinge brackets 636 are coupled with the arms 634 by hinge pins 638. The bracket 632 extends over the top surface of the cabinet 622 to hang the housing 626 along the side of the cabinet 626.

The television 620 can be internally powered or can comprise a power cord (not shown) for plugging into a household electrical outlet. Since no part of the adapter 618 is integrally formed with the refrigerator 616, the adapter 618 and television 620 can be added on to virtually any refrigerator.

The television 620 is movable between a use position, shown in FIG. 54, where the television 620 is visible to the user, and a non-use position, shown in FIG. 56, where the television 620 is received within the cavity 628 and is not visible to the user and is further protected from damage by the adapter housing 626. While in FIG. 54 the television 620 is illustrated as generally parallel to the refrigerator door 624 in the use position, the television 620 can also be positioned at other angles with respect to the refrigerator so that a user can view the television 620 from many different locations. To move the television 620 from the use position to the non-use position, the television 620 is pivoted about the hinge pins 638 to an intermediate position where the television 620 is generally aligned with the cavity 628, as shown in FIG. 55. The television 620 is then slid back into cavity 628 to the non-use position shown in FIG. 56.

Figure 57:
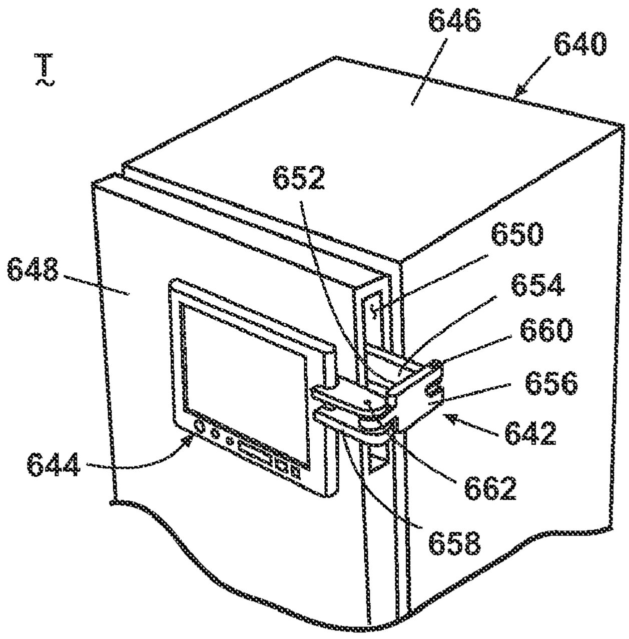
FIG. 57 is a partial perspective view of a twentieth specific embodiment of a modular system, showing a refrigerator with a video display moveably coupled to the refrigerator by an adapter, where the video display is in a use position.
Figure 58A:
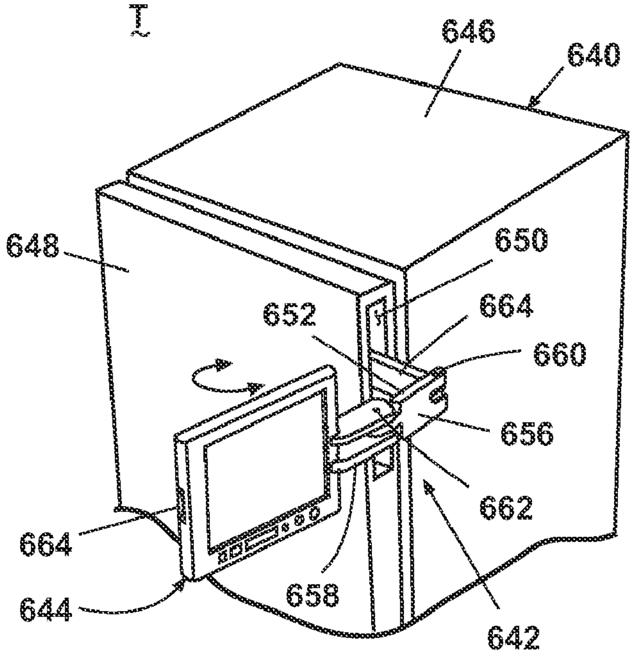
FIG. 58A is a partial perspective view of the modular system from FIG. 56, showing the video display in a first intermediate position between the use and non-use positions.
Figure 58B:
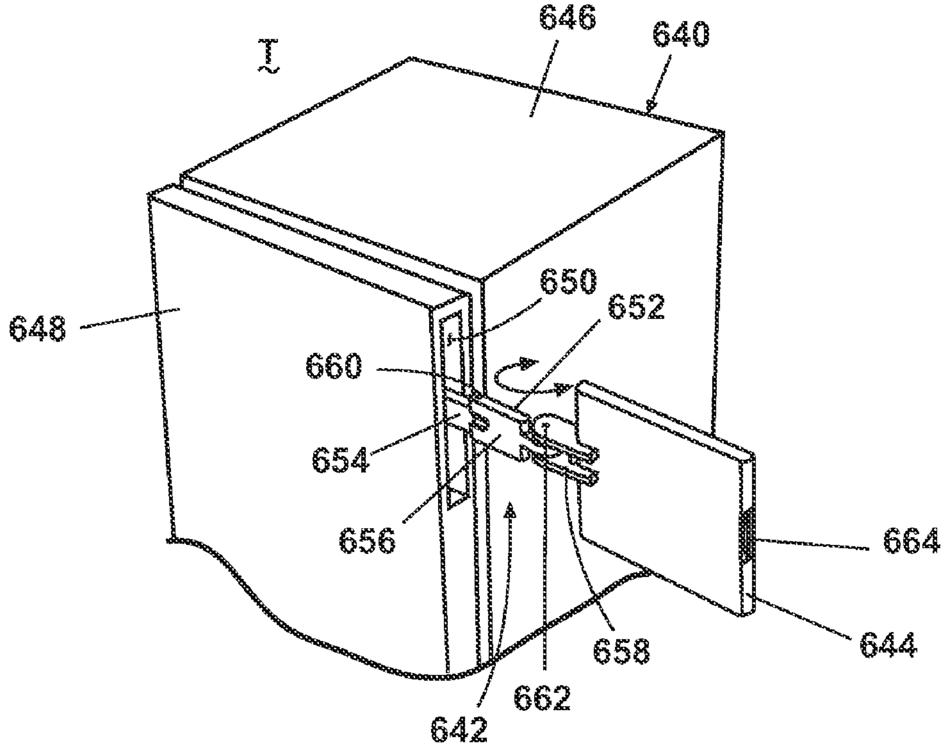
FIG. 58B is a partial perspective view of the modular system from FIG. 56, showing the video display in a second intermediate position between the use and non-use positions.
Figure 59:
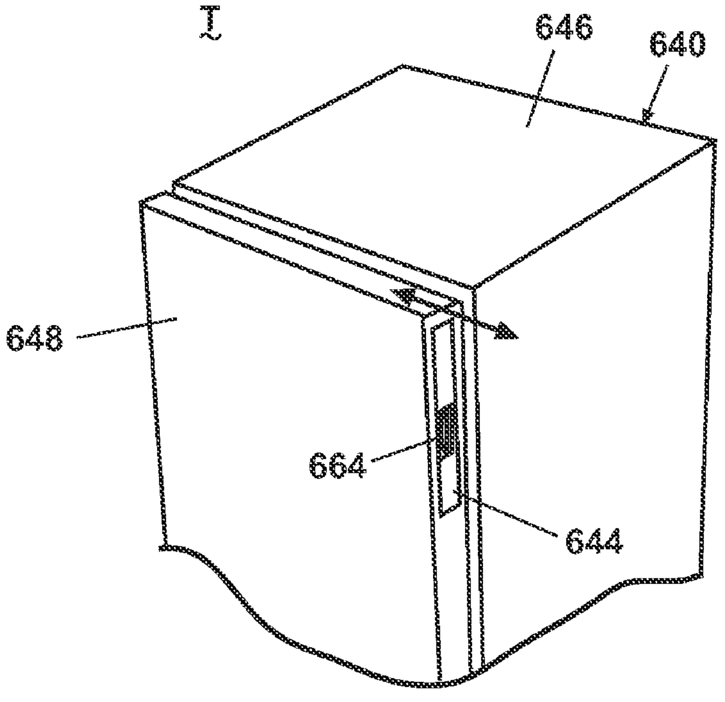
FIG. 59 is a partial perspective view of the modular system from FIG. 56, where the video display is in the non-use position.

Referring to FIG. 57-59, a twentieth embodiment is shown, where a modular system T comprises a refrigerator 640, an adapter 642, and a consumer electronic device illustrated as a television 644. The refrigerator 640 is different from the refrigerator 68 in that the refrigerator 640 comprises a cabinet 646 having an open front face (not shown) and a single door 648 openably mounted to the cabinet 646 to selectively close the open front face. The refrigerator 640 is further provided with a cavity 650 formed within a side of the door 648.

The adapter 642 comprises an arm 652 that mechanically couples the television 644 with the refrigerator 640. The arm 652 supports the television 644 and is retractable, along with the television 644, into the cavity 650. The arm 652 comprises a telescoping section 654 that can move laterally into and out of the cavity 650, an intermediate section 656 and a bracket section 658 attached to the television 644. The intermediate section 656 is coupled between the telescoping section 654 and the bracket section 658 by first and second hinge pins 660, 662, respectively. The television 640 receives power and data through wiring (not shown) extending through the arm 652.

The television 644 is movable between a use position, shown in FIG. 57, where the television 644 is visible to the user, and a non-use position, shown in FIG. 59, where the television 644 is received within the cavity 650 and is not visible to the user, and is further protected from damage by the refrigerator door 648. While the television 644 is illustrated as generally parallel to the refrigerator door 648 in the use position shown in FIG. 57, the television 644 can also be positioned at other angles with respect to the refrigerator 640 so that the user can view the television 644 from many different locations. To move the television 644 from the use position to the non-use position, the television 644 is first pivoted about the second hinge pin 662 to an first intermediate position where the television 644 is generally perpendicular to the front surface of the refrigerator door 648, as shown in FIG. 58A. The television 644 is then pivoted about the first hinge pin 660 to an second intermediate position where the television 644 is generally aligned with the cavity 650, as shown in FIG. 58B. The television 644 is then pushed back into cavity 650 to the non-use position shown in FIG. 59. To move the television 644 out of the cavity 650, a grip 644 is provided on the television 644 and is accessible when the television is in the non-use position.

Figure 60:
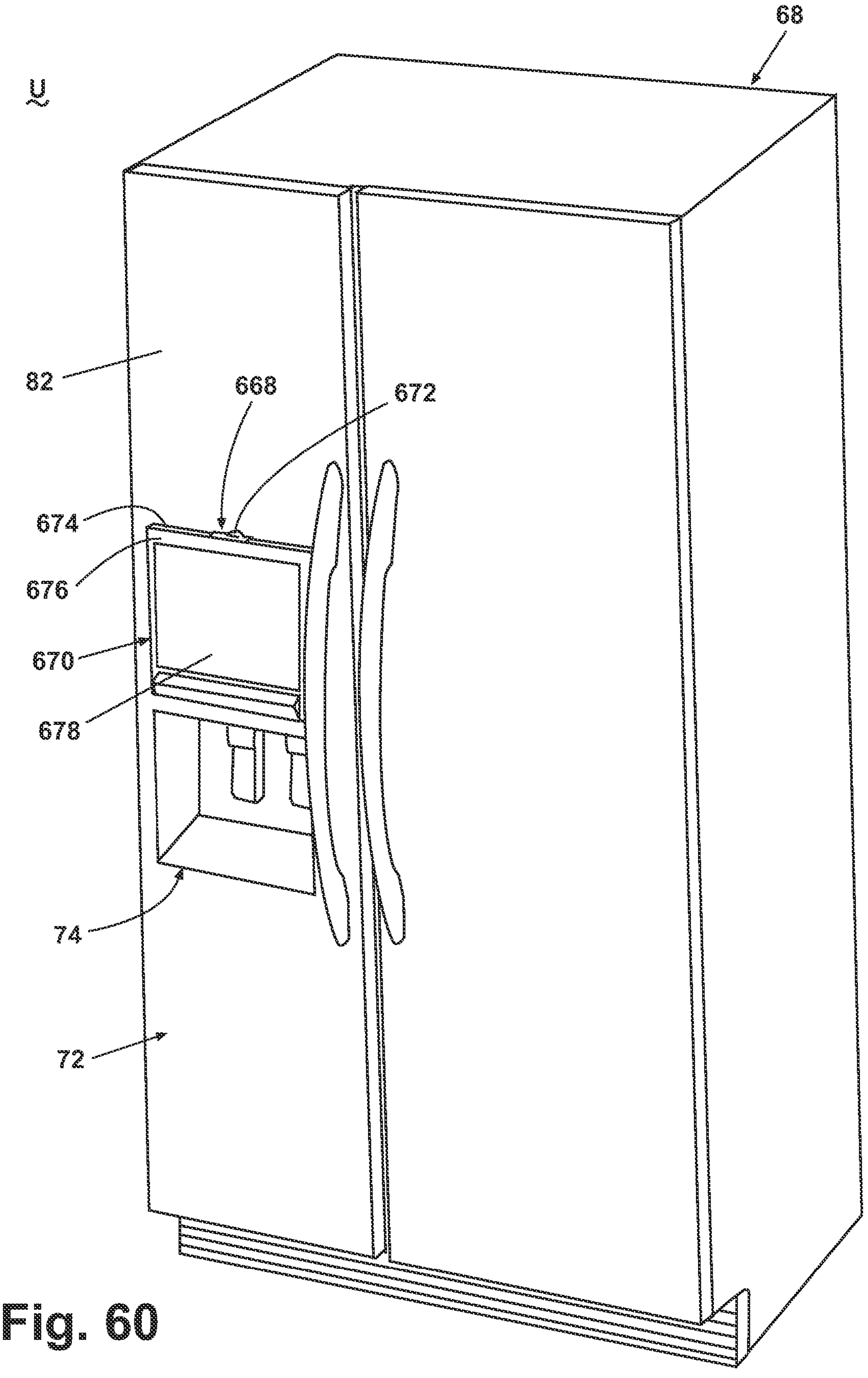
FIG. 60 is a perspective view of a twenty-first specific embodiment of a modular system, showing a refrigerator having a video display moveably coupled to the refrigerator by a swiveling adapter, where the video display is in a use position.
Figure 61:
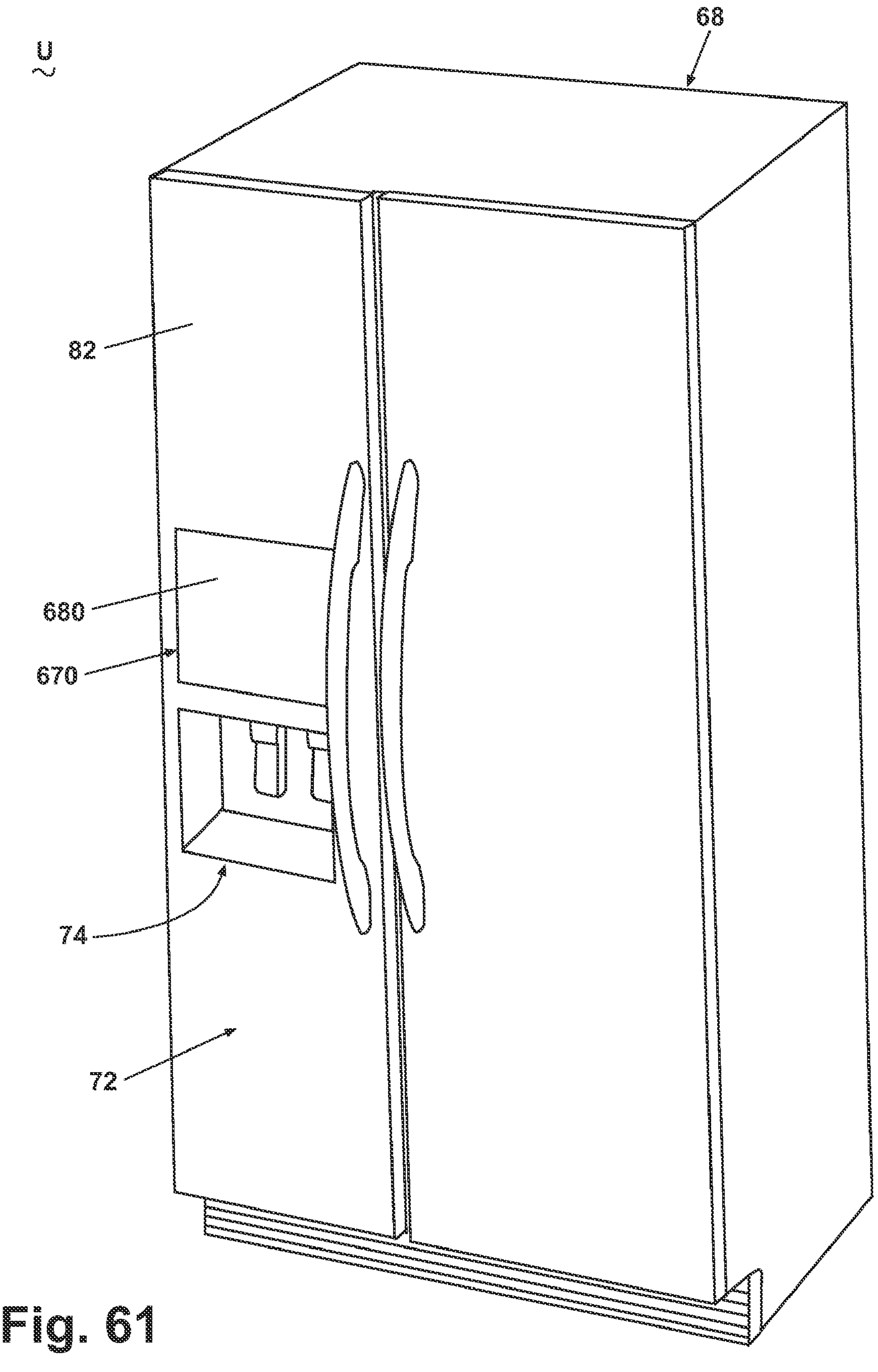
FIG. 61 is a perspective view of the modular system from FIG. 60, where the video display is in a non-use position.
Figure 62:
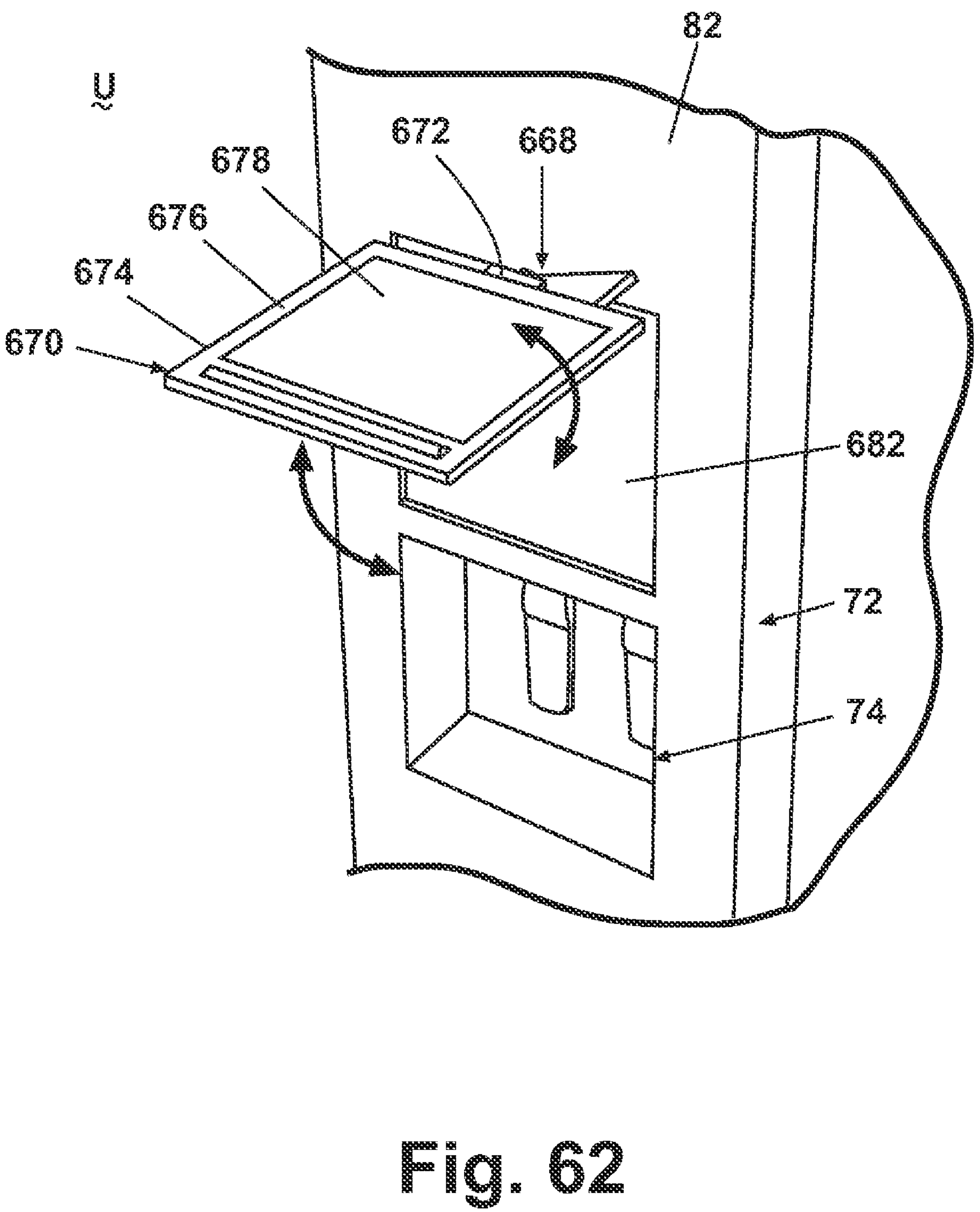
FIG. 62 is a close-up perspective view of the modular system from FIG. 60, showing the movement of the video display between the use and non-use positions.

Referring to FIGS. 60-62, a twenty-first embodiment is shown, where a modular system U comprises the refrigerator 68, an adapter 668, and a consumer electronic device illustrated as a television 670. The adapter 668 comprises a swiveling bracket 672 coupled between the refrigerator 68 and the television 670. The swiveling bracket 672 allows the television 670 to be both pivoted and rotated. The bracket 672 houses electrical wiring for supplying power and/or data provided by the refrigerator 68 to the television 670.

The television 670 comprises a housing 674 having a front face 676 with a video screen 678 and a rear face 680. The television 670 is movable between a use position, shown in FIG. 60, where the video screen 678 faces away from the refrigerator 68, and a non-use position, shown in FIG. 61, where the video screen 678 faces toward the refrigerator 68. Thus, in the use position, the video screen 678 can be viewed by a consumer, and in the non-used position, the rear face 680 can be viewed by a consumer. The rear face 680 comprises a surface adapted to "blend in" with the front vertical surface 82 of the door 72 when the television 670 is in the non-use position. The door 72 further is provided with a receptacle 682 extending inwardly of the front vertical surface 82 of the door 72 and is configured to receive the television 670 and adapter 668 in the non-use position.

FIG. 62 shows the television 670 moving from the use position (FIG. 60) to the non-use position (FIG. 61). Starting in the use position, where the television 670 is in a vertical orientation with the video screen 678 facing away from the refrigerator 68, the television 670 is pivoted to a horizontal orientation with the video screen 678 facing upwards, rotated 180° so that the video screen 678 faces downwards, and pivoted back to a vertical orientation with the video screen 678 facing towards the refrigerator 68, with the adapter 668 and television 670 received within the receptacle 682.

Figure 63:
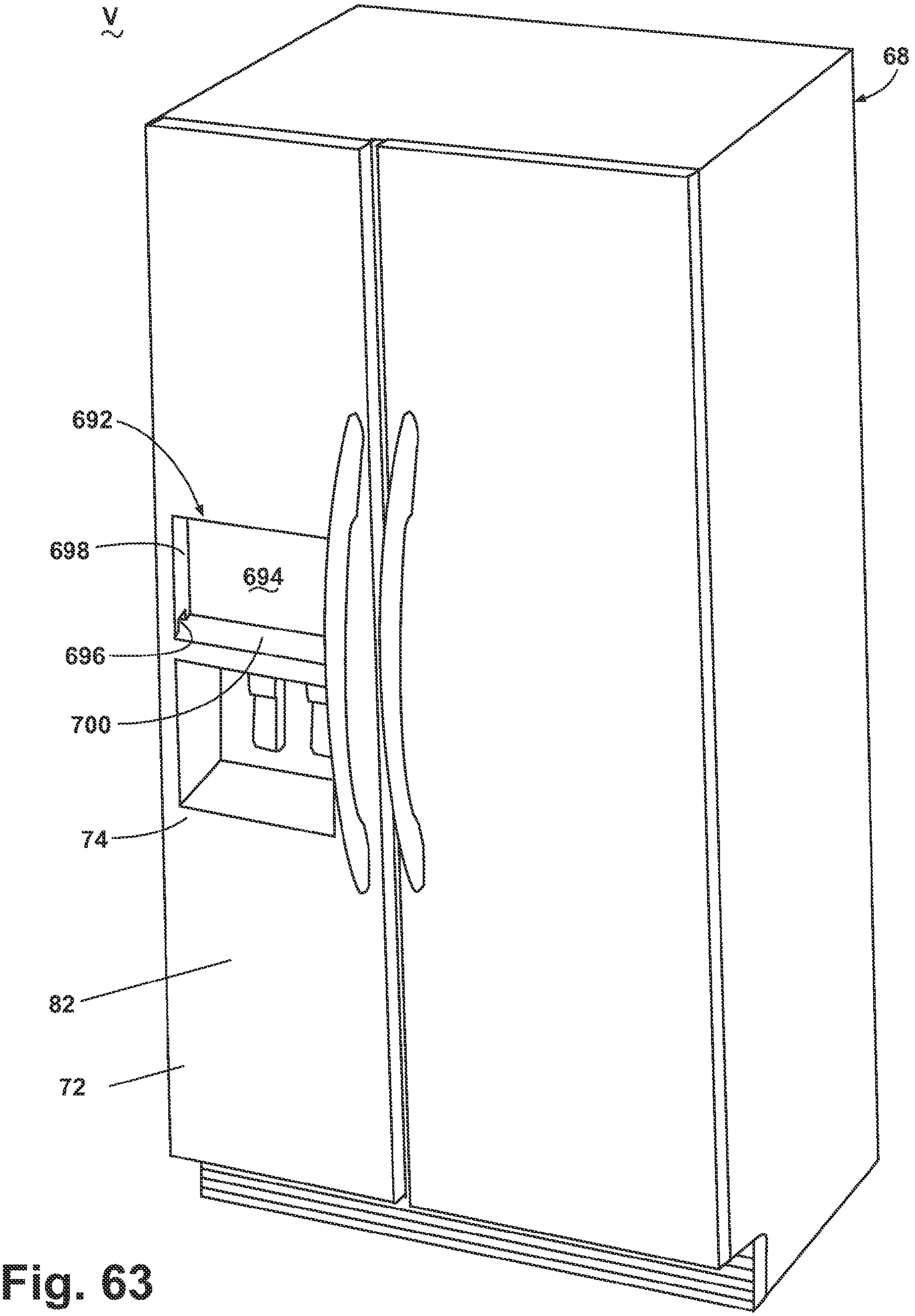
FIG. 63 is a perspective view of a twenty-second specific embodiment of a modular system, showing a refrigerator having a host service interface formed within a cavity in the refrigerator door.
Figure 64:
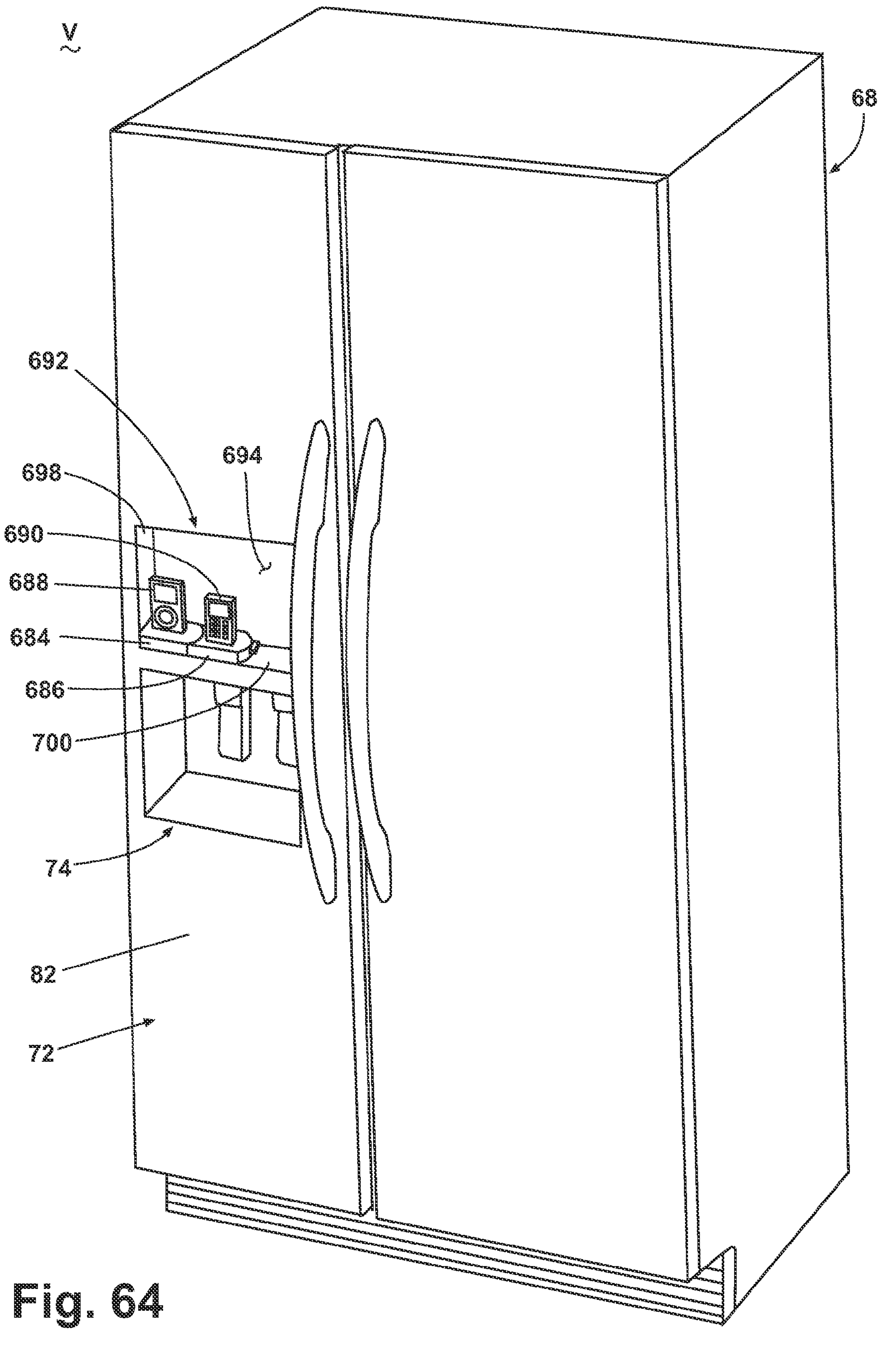
FIG. 64 is a perspective view of the modular system from FIG. 63, showing a pair of adapters and consumer electronic devices coupled to the host service interface.

Referring to FIGS. 63-64, a twenty-second embodiment is shown, where a modular system V comprises the refrigerator 68, a first adapter 684, a second adapter 686, a first consumer electronic device illustrated as a portable digital music player 688, and a second consumer electronic device illustrated as a cell phone 690.

The refrigerator 68 comprises a host service interface 692 integrally formed on the front vertical surface 82 of one of the refrigerator doors 72. The host service interface 692 comprises an open cavity 694 having a power/data connector 696 formed on a side wall 968 of the cavity 694. The cavity 694 is configured to receive the adapters 684, 686 and consumer electronic devices 688, 690, with the adapters resting on a bottom wall 700 of the cavity 694, and the power/data connector 696 is configured to couple one of the adapters 684, 686. The host service interface 692 provides mechanical, power communication, and data communication between the refrigerator 68, the digital music player 688, and the cell phone 690. The first and second adapters 684, 686 are further configured for coupling together in a ganged relationship.

While the adapters 684, 686 are shown in a ganged configuration and supply the service provided from the host service interface 692, a host service interface 692 could be provided for each of the adapters, negating the need for the adapters to be in a ganged relationship.

When they are docked, the adapters 684, 686 can recharge the respective consumer electronic devices 688, 690. As illustrated, the first adapter 684 is directly coupled to the power data connector 696 and the second adapter 686 is directly coupled to the first adapter 684. The first adapter 684 removably docks the digital music player 688 and the second adapter 686 removably docks the cell phone 690.

Figure 65:
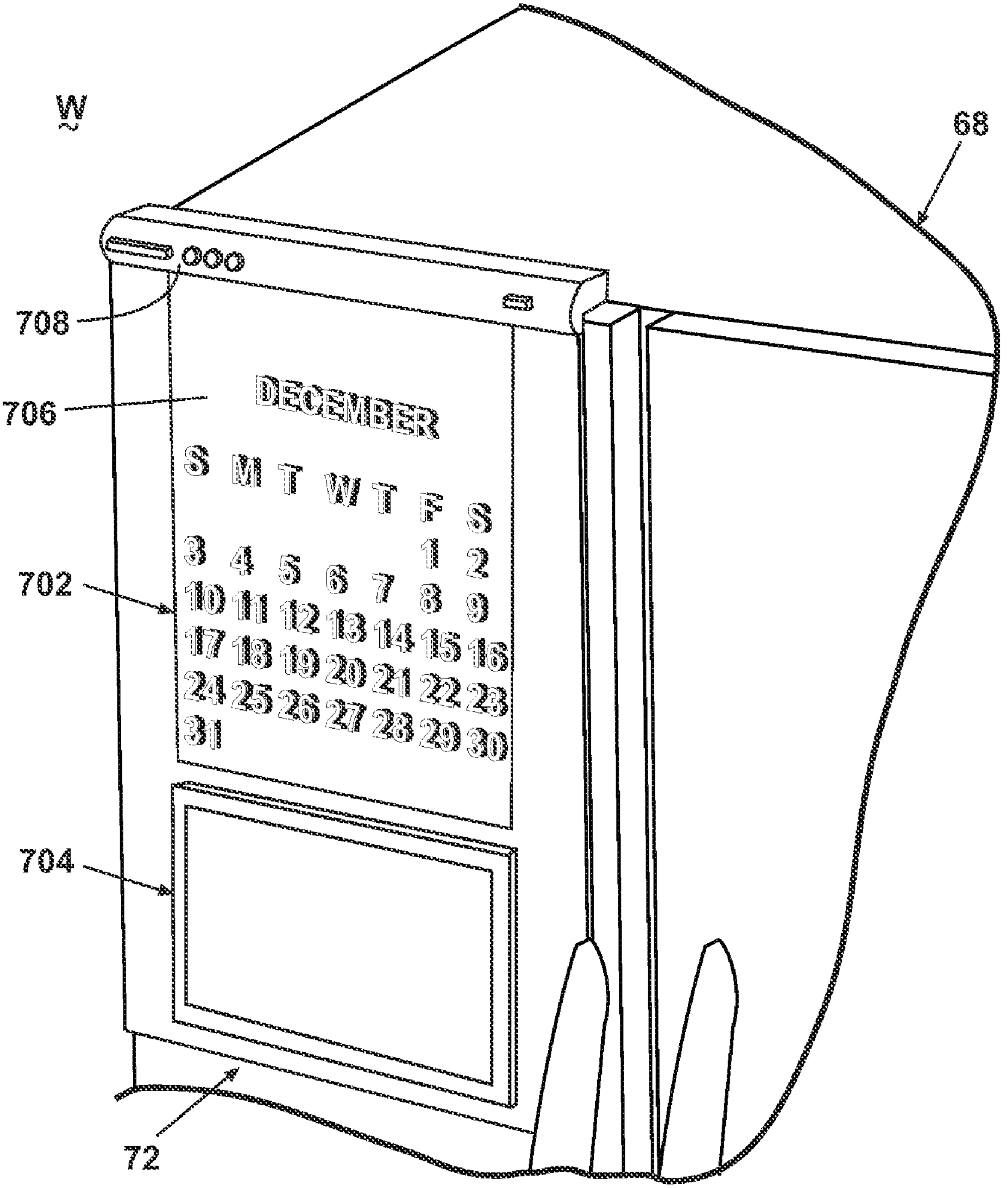
FIG. 65 is a perspective view of a twenty-third specific embodiment of a modular system, showing a refrigerator having an adapter with calendar functionality and a television.

Referring to FIG. 65, a twenty-third embodiment is shown, where the modular system W comprises the refrigerator 68, an adapter 702, and a consumer electronic device illustrated as a television 704. The adapter 702 is mounted to the refrigerator door 72 and further has calendar and user interface functionality. The adapter 702 comprises a video screen 706 that can display a calendar or personal schedule and a user interface 708 that can be used to control the video screen 706, the television 704, and/or the refrigerator 68. Alternately, the adapter 702 can comprise a projector that can project a calendar image onto a surface of the refrigerator 68, such as on the refrigerator door 72.

Figure 66:
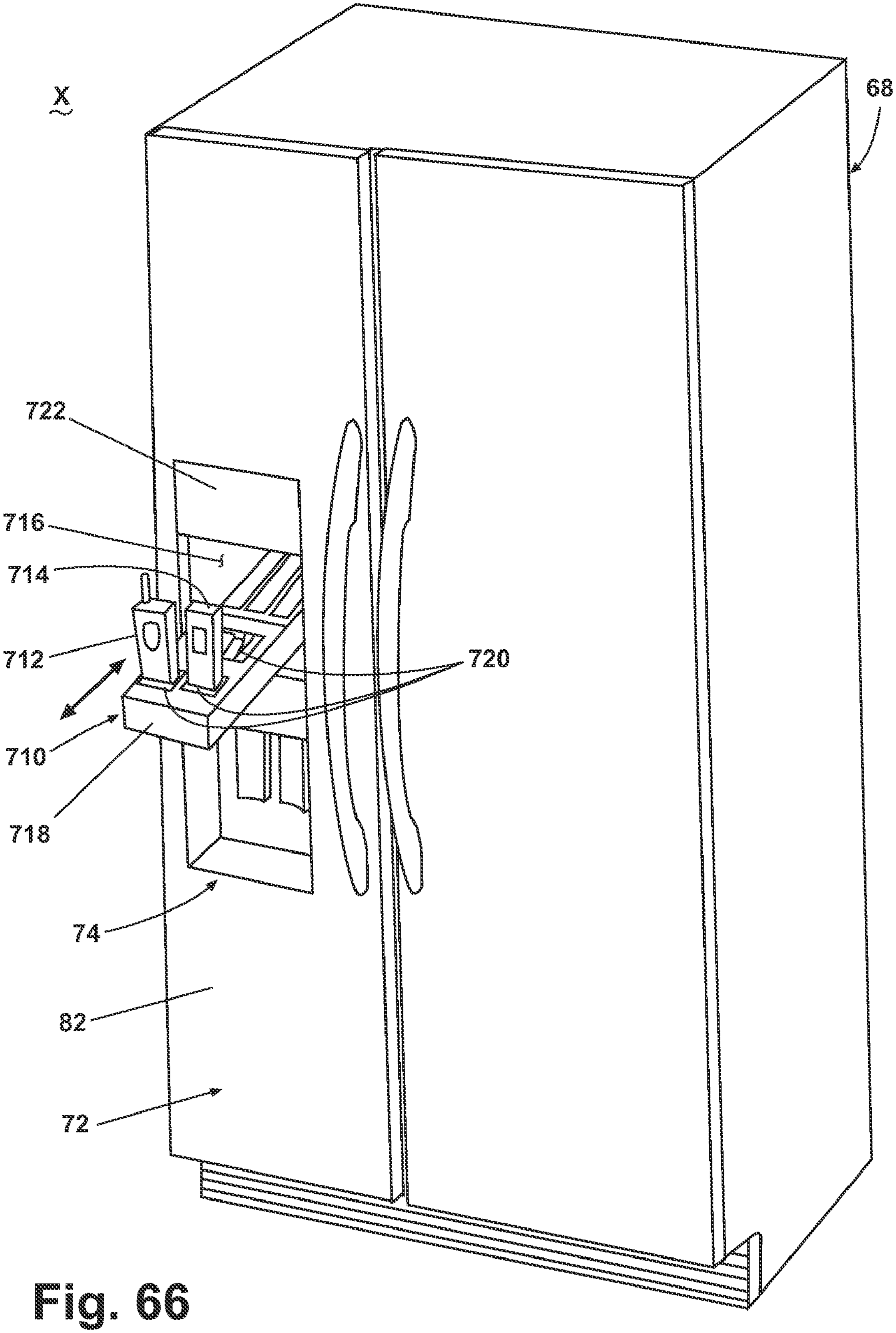
FIG. 66 is a perspective view of a twenty-fourth specific embodiment of a modular system, showing a refrigerator having a chamber, an adapter slidable into and out of the chamber, and two cell phones.
Figure 67:
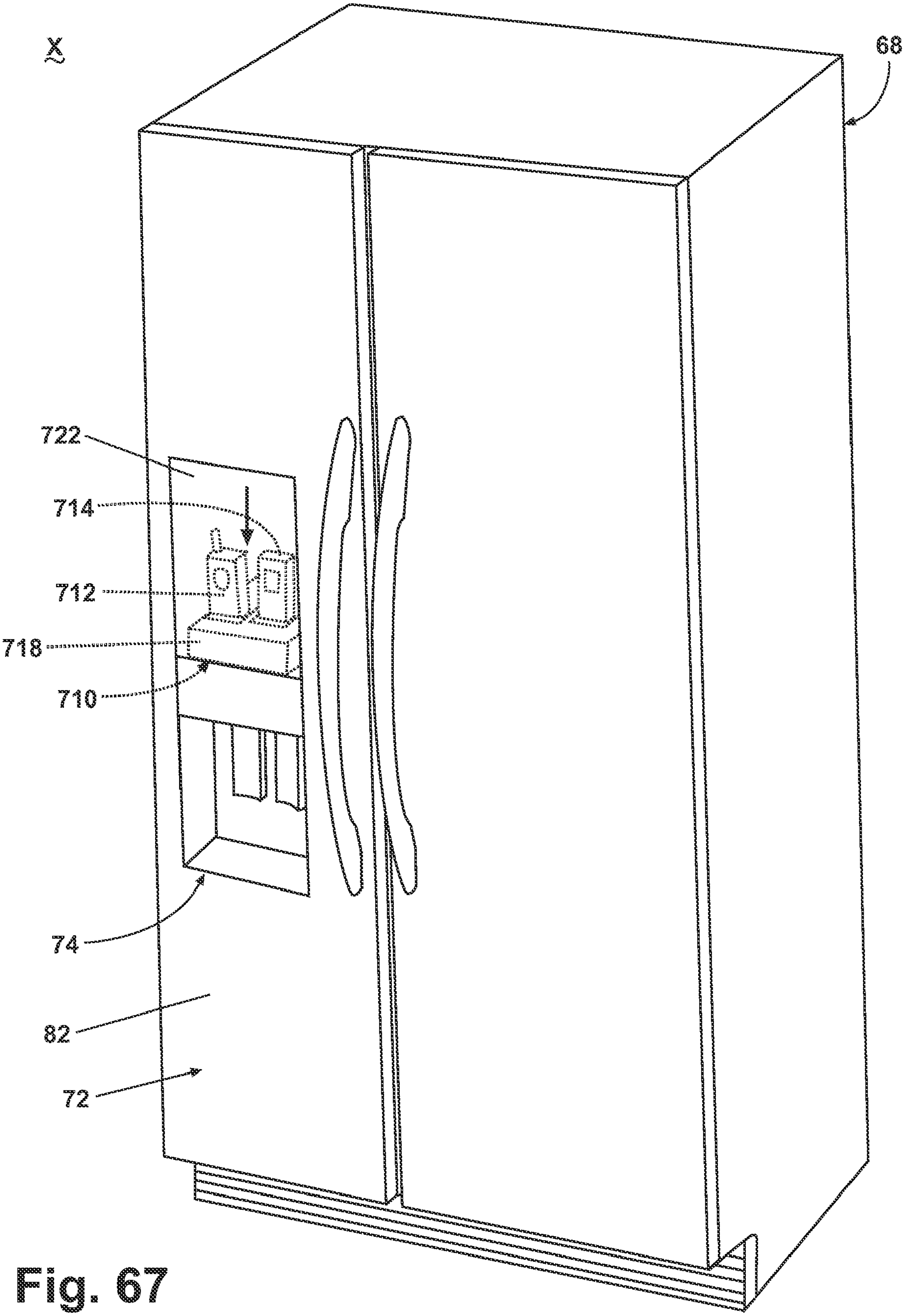
FIG. 67 is a perspective view of the modular system from FIG. 66 showing the adapter retracted into the chamber.

Referring to FIGS. 66-67, a twenty-fourth embodiment is shown, where the modular system X comprises the refrigerator 68, an adapter 710, and two consumer electronic devices illustrated as a first cell phone 712 and a second cell phone 714. The refrigerator door 72 is provided with a chamber 716 extending inwardly from the front vertical surface 82. The adapter 710 comprises a sliding shelf 718 that is configured for slidable extension and retraction out of and into the chamber 716. The shelf 718 is provided with a plurality of service interfaces 720 for communication with complementary interfaces on the cell phones 712, 714, and other consumer electronic devices not shown. Modular system W can be configured so that power and data communication are maintained when the adapter 710 is in both an extended orientation, as illustrated in FIG. 66, and a retracted orientation, as illustrated in FIG. 67. When the adapter 710 is in the retracted orientation, the chamber 716 can be closed by a door 722 which can slidably cover the opening to the chamber 716, thereby concealing the adapter 710 and cell phones 712, 714. The door 722 can have an exposed surface that is complementary to the front vertical surface 82 of the door 72 to provide a generally unbroken continuity of the front vertical surface 82 when the door 722 is closed, or the door 722 can have a contrasting exposed surface to emphasize the location of the chamber 716.

Figure 68:
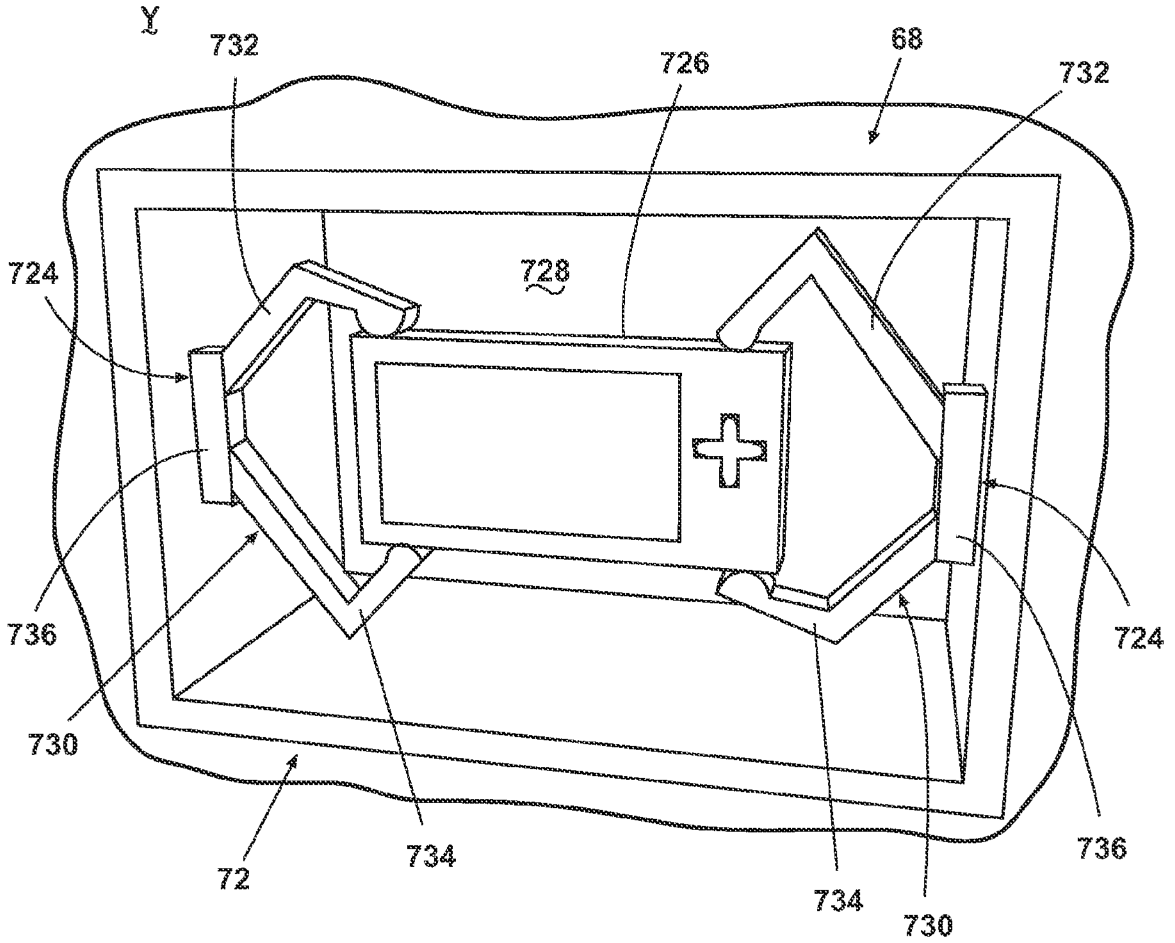
FIG. 68 is a perspective view of a twenty-fifth embodiment of a modular system, showing a refrigerator having an adjustable adapter, and a television.

Referring to FIG. 68, a twenty-fifth embodiment is shown, where a modular system Y comprises the refrigerator 68, an adapter 724, and a consumer electronic device illustrated as a PDA 726. The adapter 724 is fixed within an open cavity 728 on the refrigerator door 72, and comprises a pair of adjustable claws 730. Each claw 730 comprises an upper and lower finger 732, 734 that are moveably connected to a base 736. Each upper and lower finger 732, 734 can be moved towards each other to "close" the grip of the claw 730, or away from each other to "open" the grip of the claw 730. The base 736 can further be rotatably coupled within the cavity to adjust the angle at which the PDA 726 is maintained. The fingers 732, 734 can engage the PDA 726 by closing the upper and lower fingers 732, 734 to engage the upper and lower surfaces of the PDA 726, thereby establishing mechanical communication between the PDA 726 and the refrigerator 68. The claws 730 can be "opened" to remove the PDA 726.

The adapter 724 can be adjusted to accommodate other consumer electronic devices having different dimensions than the PDA 726. The claws 730 allow other consumer electronic devices that are larger or smaller than the PDA 726 to be coupled with the refrigerator 68 by opening or closing the fingers 732, 734 accordingly. The fingers can be hingedly and/rotationally connected at their knuckles and to the base 736 to provide the greatest amount of adjustability.

The fingers 732, 734 can further be provided with electrical connectors (not shown) for providing power and data services to a consumer electronic device. The PDA 726 can be configured with corresponding connector (not shown) so that power and/or data communication is established through contact between the connectors of the fingers 732, 734 and the PDA 726. One anticipated embodiment comprises a cord threaded through the fingers 732, 734 and having a plug on the cord protruding through an opening in the fingers 732, 734 configured to mate with a corresponding socket on the PDA 726.

Figure 69:
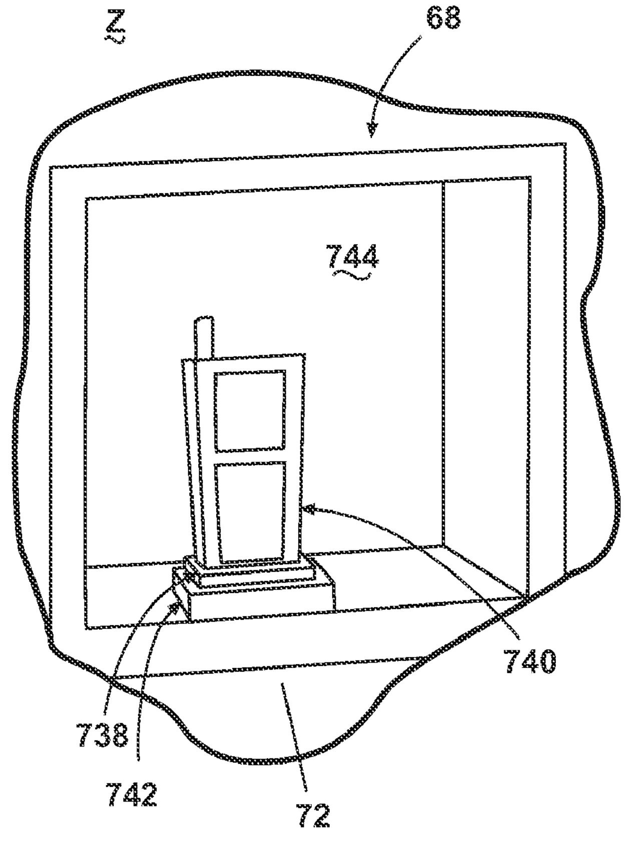
FIG. 69 is a perspective view of a twenty-sixth embodiment of a modular system, showing a refrigerator having a removable adapter and a cell phone.
Figure 70:
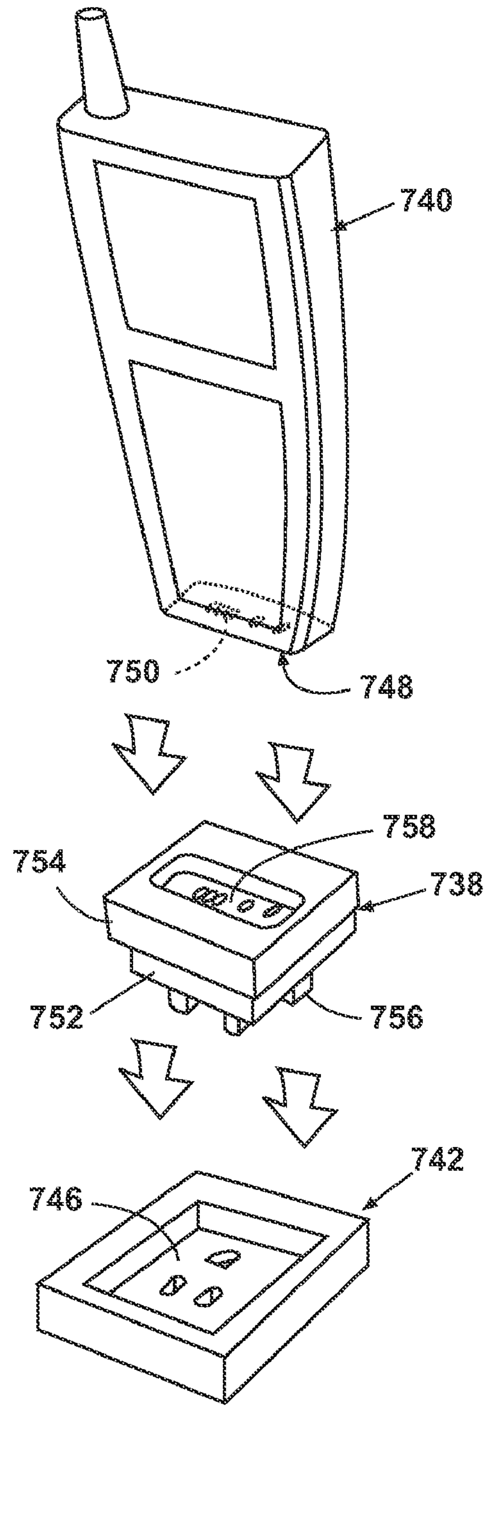
FIG. 70 is an exploded view of the modular system from FIG. 69.

Referring to FIGS. 69 and 70, a twenty-sixth embodiment is shown, where a modular system Z comprises the refrigerator 68, an adapter 738, and a consumer electronic device illustrated as a cell phone 740. The adapter 738 removably couples the cell phone 740 to the refrigerator 68. The adapter 738 is removable from both the refrigerator 68 and the cell phone 740.

The refrigerator 68 comprises a host service interface 742 formed in an open cavity 744 on one of the refrigerator doors 72. The host service interface 742 comprises a socket 746 providing mechanical, power, and data communication, which is supplied to the cell phone 740 by the adapter 738.

The cell phone 740 comprises a device service interface 748 on its lower service, which can comprise the typical connector 750 for a cell phone charger. The device service interface 748 is incompatible with the host service interface 742, and the consequently, the cell phone 740 can be directly coupled to the refrigerator 68.

The adapter 738 is used to indirectly couple the refrigerator 68 and cell phone 740. The adapter 738 comprises two adapter service interfaces 752, 754, where the first adapter service interface 752 comprises a plug 756 that directly mates with the socket 746 of the host service interface 742 and the second adapter service interface 754 comprises an complementary connector 758 that directly mates with the connector 750 of the device service interface 748.

Modular system Z can be easily expanded to include other consumer electronic devices by adding additional adapters having the same standardized first adapter service interface 750, and a second adapter service interface corresponding to the consumer electronic device. In addition to modular system Z, any of the other embodiments shown herein can be modified to comprise such a standardized adapter.

Figure 71:
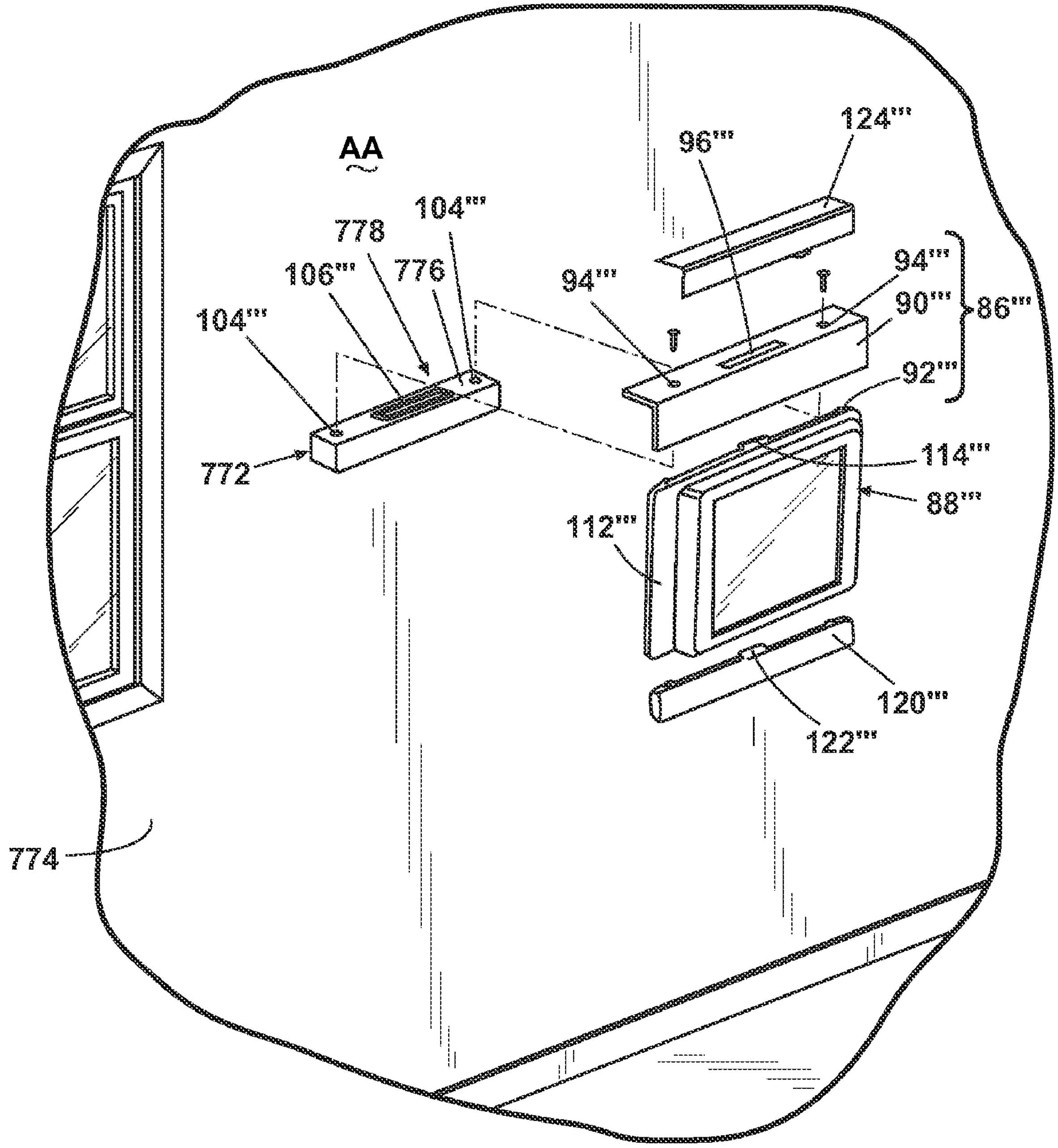
FIG. 71 is a perspective view of a twenty-seventh embodiment of a modular system, showing a wall-mounted service interface, an adapter, and a video display.

Referring to FIG. 71, a twenty-seventh embodiment is shown, where a modular system AA is similar to modular system A, shown in FIGS. 9-12, and elements similar to those of modular system A are identified by the same reference numerals bearing a triple prime ("") symbol. Modular system AA is different from modular system A in that the host comprises a service supply module 772, instead of the refrigerator 68. The service supply module 772 is mounted to a vertical surface, such as a wall 774 and comprises an upper surface 776. A host service interface 778 is provided on the upper surface 776 and can comprise internal wiring, similar to the wiring shown in FIG. 11 to provide the services of power and data communication. The host service interface 778 can be provided with one or more services from the use environment, which includes the wall 774. While only one service interface is shown, the service supply module 772 can comprise multiple service interfaces, each providing and/or supplying a service between the wall 774 and an adapter or consumer electronic device.

In all other respects, the modular system AA comprises the same elements shown in FIGS. 9-11. Mechanical communication is accomplished by fixing the video display 88"" to the adapter 86"" and mounting the adapter 86"" to the service supply module 772. Power and data communication is accomplished by coupling the adapter 86"" to the host service interface 778, and coupling the video display 88"" to the adapter 86'". Thus, the service supply module 772 can provide the services of mechanical, power and data communication. The adapter 86"" supplies the services of mechanical, power, and data communication the video display 88'".

The service supply module 772 can be coupled to other, non-vertical surfaces, such as an appliance or a cabinet. Furthermore, any of the other embodiments shown herein can be modified to comprise the service supply module 772 as a host. While illustrated projecting from wall, the service supply module 772 could be integrated with the wall to provide a flush mounting with the wall. In such a configuration, the power/data socket 106"" would lie in the same plane as the wall 774. Mechanical connectors, such as holes 104'", could be located on either side of the socket to couple the adapter thereto. Other flush mountings of the host are possible, such as those shown in FIGS. 34-41, wherein the door 72 is replaced by the wall.

While the invention has been specifically described in connection with certain specific embodiments thereof, it is to be understood that this is by way of illustration and not of limitation, and the scope of the appended claims should be construed as broadly as the prior art will permit.

What is claimed is:

1. A vertical device for mounting to a host having a horizontal surface juxtaposed to a vertical surface, with an upwardly oriented host service interface on the horizontal surface providing a mechanical service and an electrical service, the vertical device comprising:

an L-shaped main body comprising a horizontal portion and a vertical portion extending generally downwardly from the horizontal portion;

a downwardly extending device service interface on the horizontal portion for removably coupling with the host service interface to provide the mechanical service and the electrical service from the host to the vertical device; and at least one functionality disposed on the vertical portion of the main body;

wherein when the device service interface mechanically couples with the host service interface, the horizontal portion overlies the horizontal surface and the vertical portion overlies the vertical surface, and the electrical service is provided from the host to the vertical device.

2. The vertical device of claim 1 wherein the vertical portion further comprises an electronic device.

3. The vertical device of claim 2 wherein the electronic device receives the electric service from the host service interface.

4. The vertical device of claim 1 wherein the vertical portion further comprises a holder capable of removably holding a portable device.

5. The vertical device of claim 4 wherein the holder is oriented for receiving the portable device in a direction away from the device service interface.

6. The vertical device of claim 4 wherein the portable device comprises a consumer electronic device and further wherein the consumer electronic device receives the electric service from the host service interface.

7. The vertical device of claim 1 wherein the vertical portion further comprises at least one of a user interface for controlling the operation of the vertical device, a user interface for controlling the operation of a consumer electronic device, user interface for controlling the operation of the host, a microphone, a video camera, a still camera, video display, a touch screen, a keypad, control knobs and control buttons.

8. The vertical device of claim 1 wherein the device service interface comprises a downwardly facing plug for electrical coupling with the host and aligned fasteners on either side of the plug for mechanical coupling with the host.

9. The vertical device of claim 1 wherein the horizontal portion is removably coupled to the vertical portion.

10. The vertical device of claim 1 wherein the host service interface comprises a recess in the horizontal surface and further wherein the device service interface comprises a connector extending into the recess when coupled with the host service interface.

11. The vertical device of claim 1 wherein the at least one functionality is selected from a speaker, a user interface, a display projection, a media manager, a whiteboard, physical storage, application software hosting, communications routing, power storage, microphone, data storage, a consumer electronic device, a mechanical service, an electrical service and a data service.

12. The vertical device of claim 1 wherein the device service interface comprises at least one anchor for mechanical coupling with the host.

13. The vertical device of claim 1 wherein the host service interface provides the electrical service wirelessly, and the device service interface comprises a wireless interface for communicating with the host service interface to receive the electrical service wirelessly.

14. The device of claim 13, wherein the electrical service is selected from one of power communication and data communication.

15. A portable electrical device for mounting to a host having a horizontal surface juxtaposed to a vertical surface, a recess provided in the horizontal surface, and an upwardly oriented host service interface disposed in the recess and providing a mechanical service, multiple electrical services including at least an electrical power service and an electrical data service, the portable electrical device comprising:

a device main body comprising a horizontal portion and a vertical portion extending generally downwardly from the horizontal portion;

a device service interface extending downwardly from the horizontal portion and comprising a connector for insertion into the recess to removably couple with the host service interface and receive the mechanical service and at least one of the multiple electrical services from the host service interface; and at least one functionality disposed on the vertical portion of the main body;

wherein when the device service interface mechanically couples with the host service interface, the horizontal portion overlies the horizontal surface and the vertical portion overlies the vertical surface, and the at least one of the multiple electrical services is provided from the host to the portable electrical device.

16. The portable electrical device of claim 15 further comprising a user interface disposed on the vertical portion of the main body.

17. The portable electrical device of claim 15 wherein the device service interface comprises a downwardly facing plug for electrically coupling with the host and aligned fasteners on either side of the plug for mechanically coupling with the host.

18. The portable electrical device of claim 15 wherein the at least one functionality is selected from a speaker, a user interface, a display projection, a media manager, a whiteboard, physical storage, application software hosting, communications routing, power storage, microphone, data storage, and a consumer electronic device.

19. The portable electrical device of claim 15 wherein the host service interface provides at least one of the multiple electrical services wirelessly, and the device service interface comprises a wireless interface for communicating with the host service interface to receive the at least one of the multiple electrical services wirelessly.

20. The portable electrical device of claim 15 wherein when the device service interface mechanically couples with the host service interface, both of the electrical power and electrical data services are provided from the host to the portable electrical device.

21. An adapter for mounting a portable device having a standardized device service interface to a host having a horizontal surface juxtaposed to a vertical surface, with an upwardly oriented host service interface on the horizontal surface providing at least one electrical service and at least one mechanical support service, the adapter comprising:

an L-shaped main body comprising a horizontal portion and a vertical portion extending generally downwardly from the horizontal portion;

a first adapter service interface on the horizontal portion for coupling with the host service interface and receiving the at least one electrical service and the at least one mechanical support service; and at least one component that enables a service to be supplied between the host and the portable device;

wherein when the first adapter service interface mechanically couples with the host service interface, the horizontal portion overlies the horizontal surface and the vertical portion overlies the vertical surface, and the at least one electrical service is provided from the host to the adapter.

22. The adapter of claim 21 wherein the host service interface provides the electrical service wirelessly, and the device service interface comprises a wireless interface for communicating with the host service interface to receive the electrical service wirelessly.

23. The adapter of claim 22, wherein the electrical service is selected from one of power communication and data communication.

24. The adapter of claim 21 wherein the standardized device service interface comprises an upwardly oriented connector and further wherein the first adapter service interface further comprises a downwardly oriented connector engageable with the upwardly oriented connector for coupling the adapter to the portable device.

25. The adapter of claim 21 wherein the horizontal portion is removably coupled to the vertical portion.

26. The adapter of claim 21 wherein the first adapter service interface comprises a downwardly facing plug for electrically coupling with the host service interface and aligned fasteners on either side of the plug for mechanically coupling with the host service interface.

27. The adapter of claim 21 wherein the portable device comprises a consumer electronic device and further wherein the consumer electronic device receives the at least one electrical service from the host service interface.

28. The adapter of claim 21 wherein the at least one electrical service comprises at least one of a power service and a data service.

29. The adapter of claim 21 wherein the at least one electrical service is provided wirelessly.

30. The adapter of claim 21 wherein the host service interface comprises a recess in the horizontal surface and wherein the first adapter service interface comprises a downwardly extending plug for at least partially extending into the recess for coupling the adapter to the host.

31. The adapter of claim 30 wherein the standardized device service interface comprises a first connector at least partially disposed in a recess on the portable device, and further wherein the first adapter service interface further comprises a second connector engageable with the first connector for coupling the adapter to the portable device.

32. The adapter of claim 21 wherein the vertical portion of the main body comprises at least one of a user interface for controlling the operation of the adapter, a user interface for controlling the operation of the portable device, a user interface for controlling the operation of the host, an electronic device receiving the at least one electrical service from the host service interface, a microphone, a video camera, a still camera, a video display, a touch screen, a keypad, control knobs, control buttons, a speaker, a display projection, a media manager, a whiteboard, physical storage, application software hosting, communications routing, power storage, a microphone, data storage, a consumer electronic device, a mechanical service, an electrical service and a data service.

33. The adapter of claim 21 wherein the at least one component enables the supply of at least two services to the portable device.

34. The adapter of claim 21, further comprising a second adapter service interface configured to communicate at least one service with one of the host service interface, a device service interface, and the first adapter service interface.

* * * * *